(12) United States Patent
Diehl et al.

(10) Patent No.: US 11,726,179 B2
(45) Date of Patent: Aug. 15, 2023

(54) SYSTEM AND METHOD FOR REGULATING AIRFLOW INTO AN ENCLOSURE

(71) Applicant: Pony AI Inc., Grand Cayman (KY)

(72) Inventors: Peter G. Diehl, Shanghai (CN); Cheng Jin, Fremont, CA (US)

(73) Assignee: Pony AI Inc., Grand Cayman (KY)

( * ) Notice: Subject to any disclaimer, the term of this patent is extended or adjusted under 35 U.S.C. 154(b) by 974 days.

(21) Appl. No.: 16/459,476

(22) Filed: Jul. 1, 2019

(65) Prior Publication Data

US 2021/0003670 A1   Jan. 7, 2021

(51) Int. Cl.
| | | |
|---|---|---|
| *G01S 7/481* | (2006.01) | |
| *B60R 16/02* | (2006.01) | |
| *G01S 7/497* | (2006.01) | |
| *G01S 17/86* | (2020.01) | |
| *G01S 17/931* | (2020.01) | |
| *H05K 7/20* | (2006.01) | |

(52) U.S. Cl.
CPC ............ *G01S 7/4813* (2013.01); *B60R 16/02* (2013.01); *G01S 7/497* (2013.01); *G01S 17/86* (2020.01); *G01S 17/931* (2020.01); *H05K 7/20863* (2013.01)

(58) Field of Classification Search
CPC ....... B60R 16/02; G01S 17/86; G01S 17/931; G01S 7/4813; G01S 7/497; H05K 7/20863
See application file for complete search history.

(56) References Cited

U.S. PATENT DOCUMENTS

| | | | |
|---|---|---|---|
| 4,169,501 A | 10/1979 | Takeuchi et al. | |
| 6,993,930 B2 | 2/2006 | Blackstone | |
| 2009/0120517 A1 | 5/2009 | Whitney | |
| 2015/0345797 A1* | 12/2015 | Lehet ...................... | F23B 10/02 126/77 |
| 2016/0297279 A1* | 10/2016 | Kim ................... | B60H 1/00678 |
| 2017/0074542 A1* | 3/2017 | Leiterman ............ | A01K 1/0052 |
| 2017/0261273 A1* | 9/2017 | Maranville ............... | F25B 1/00 |
| 2018/0109061 A1* | 4/2018 | Pardhan ................ | G01S 7/4813 |
| 2019/0210423 A1* | 7/2019 | Ghannam .......... | B60H 1/00271 |
| 2019/0309982 A1 | 10/2019 | Shimajiri | |
| 2019/0353793 A1* | 11/2019 | Baldovino ......... | H05K 7/20863 |
| 2020/0084920 A1* | 3/2020 | Frederick ........... | H05K 7/20172 |

* cited by examiner

*Primary Examiner* — Mohammed S Rahaman

(57) ABSTRACT

Provided herein is a system and method for heat exchange of a vehicle. The system comprises an enclosure disposed on the vehicle. The enclosure comprises a fan disposed at a base of the enclosure, one or more sensors within the enclosure, and a cover on an exterior of the enclosure. The cover comprises a hole pattern to selectively permit an airflow to enter the enclosure. A deflector is disposed on the vehicle outside the enclosure and configured to direct an airflow through the hole pattern.

8 Claims, 38 Drawing Sheets

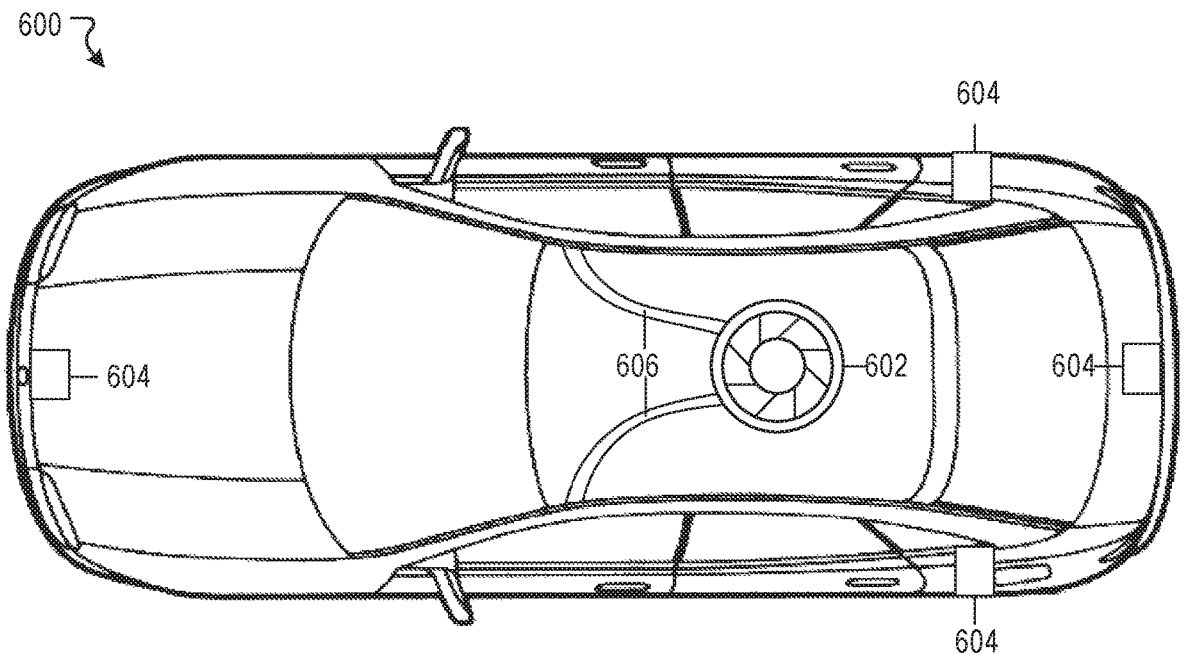
FIG. 6A
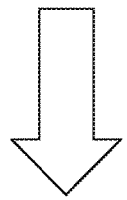
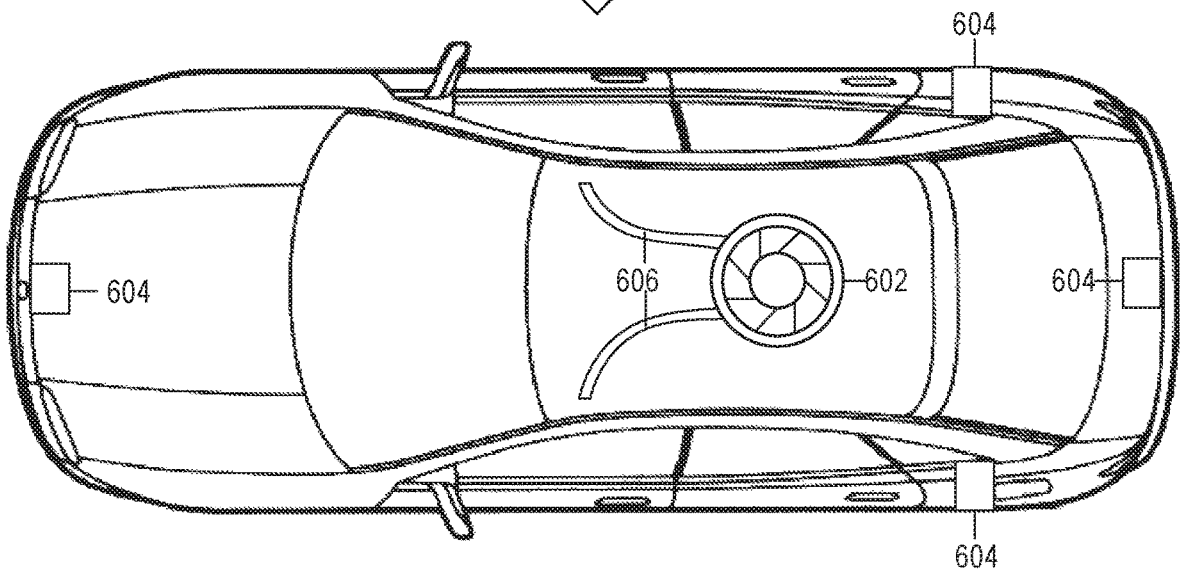
FIG. 6B

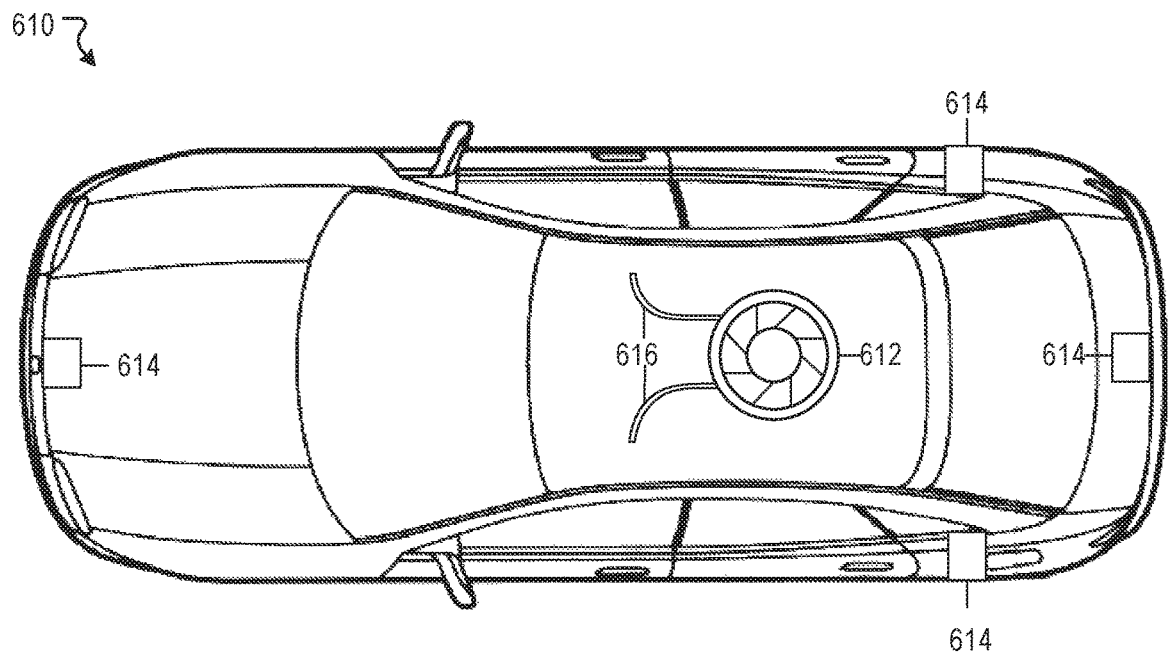
FIG. 6C
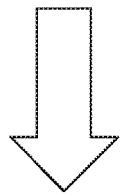
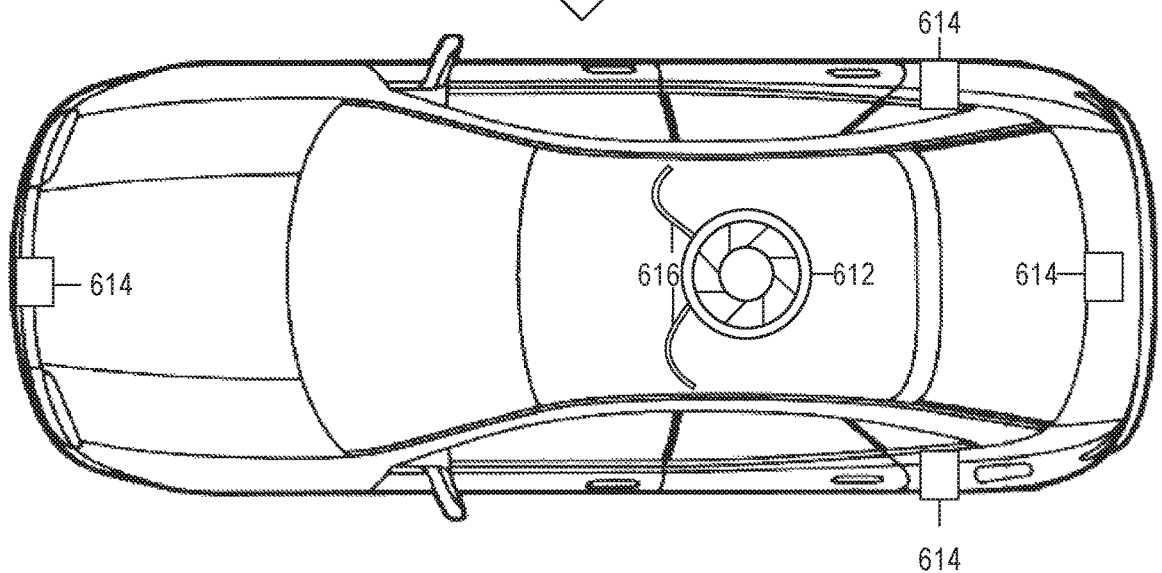
FIG. 6D

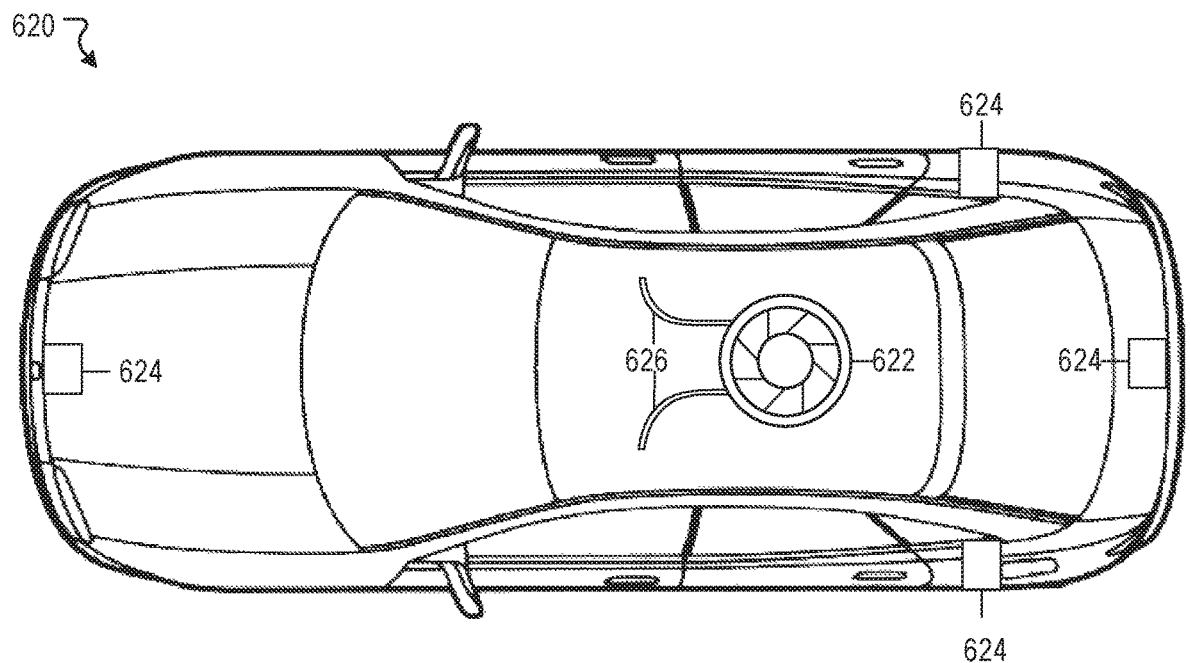
FIG. 6E
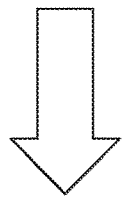
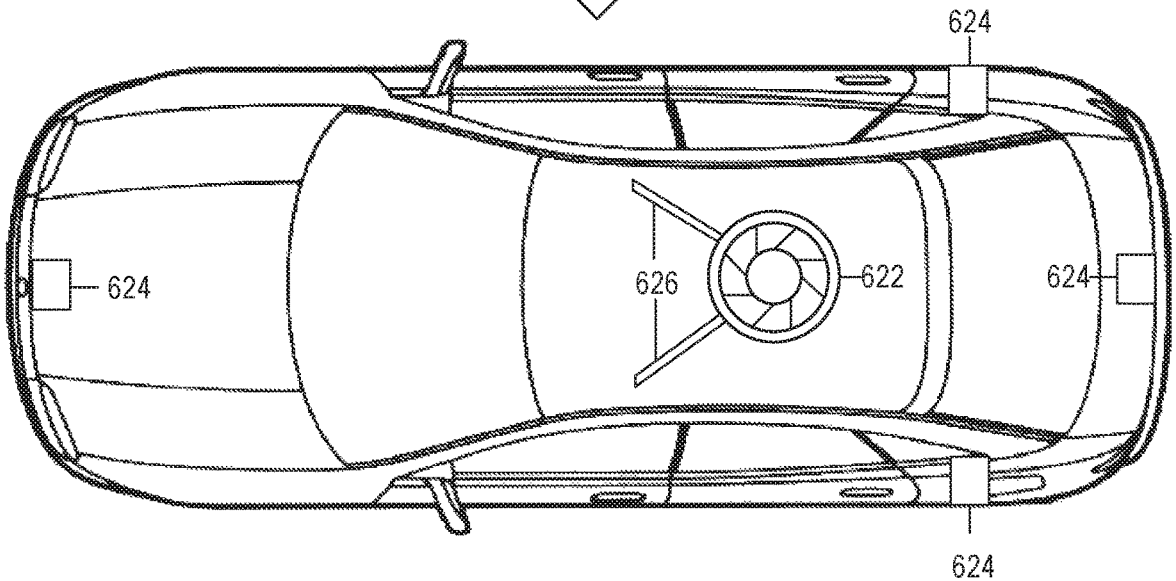
FIG. 6F

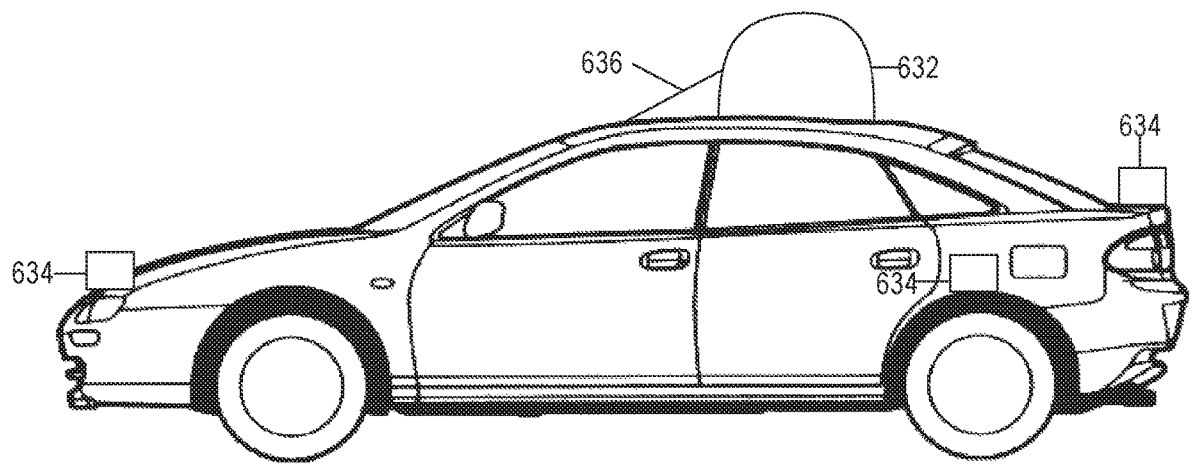
FIG. 6G
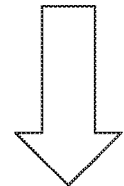
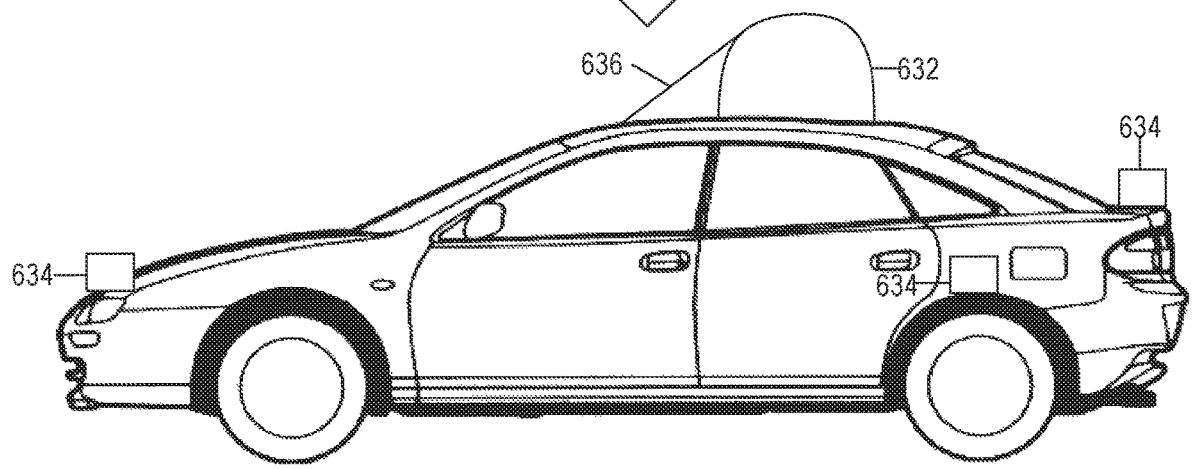
FIG. 6H

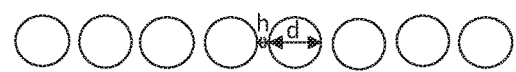
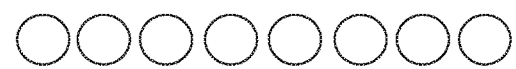
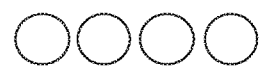
FIG. 7I

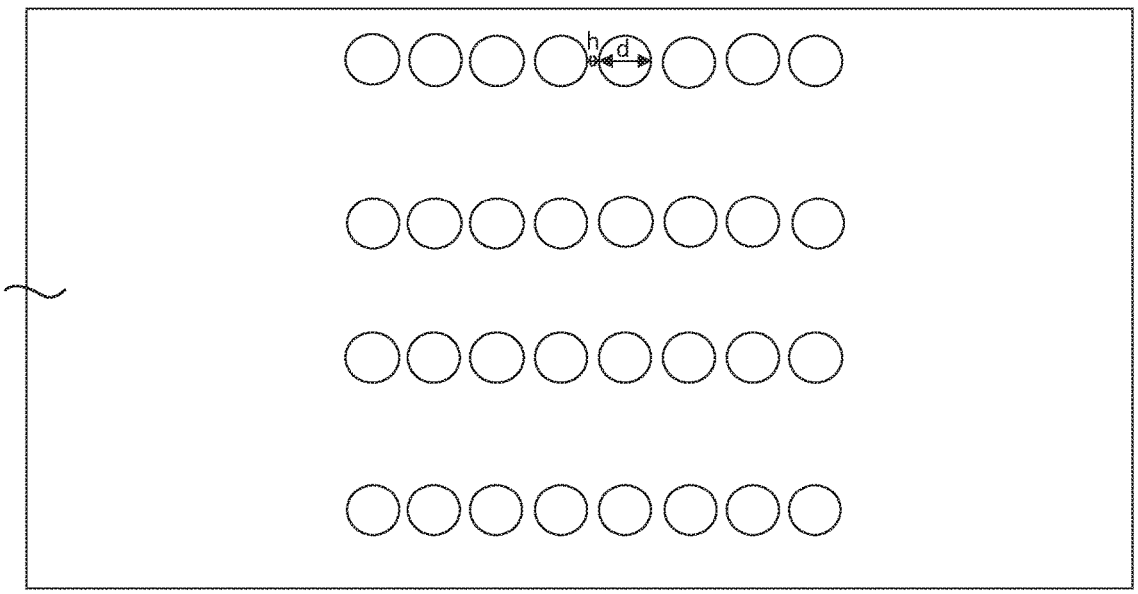
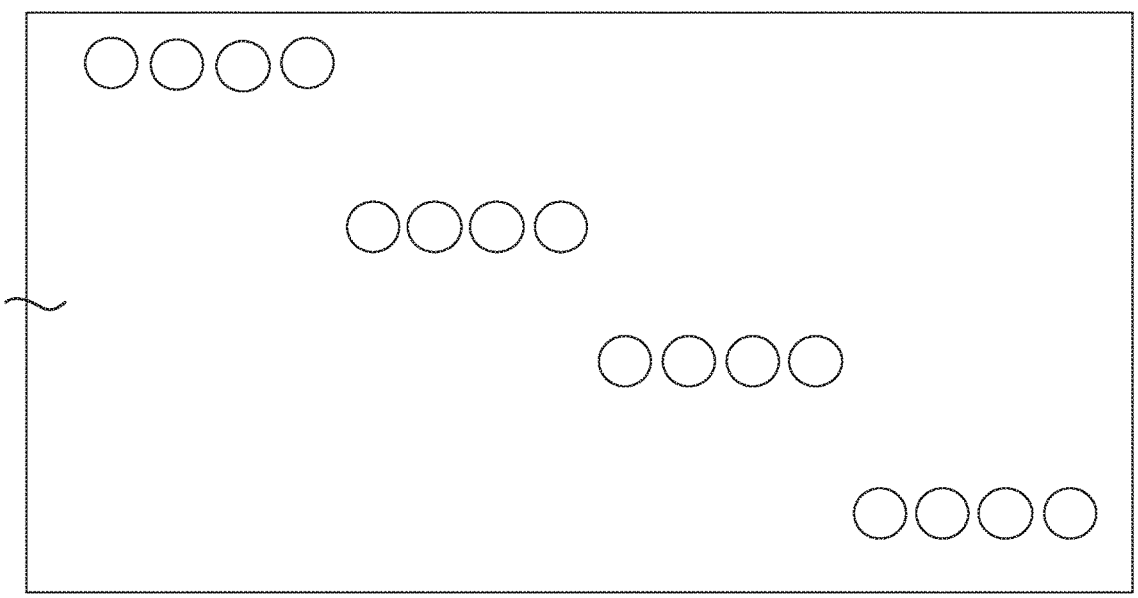
FIG. 7J

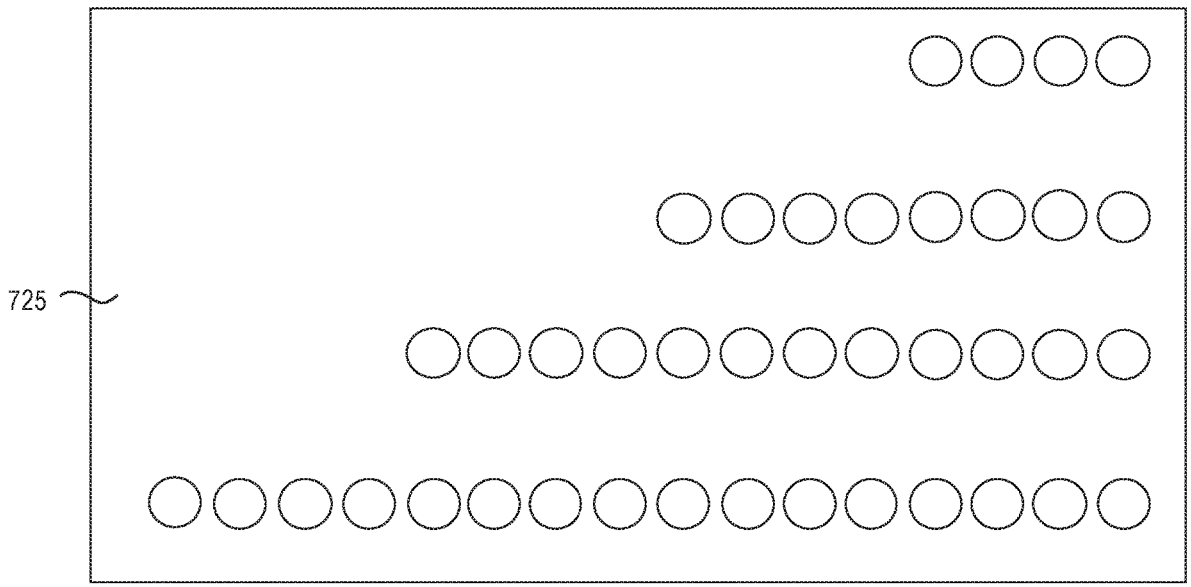
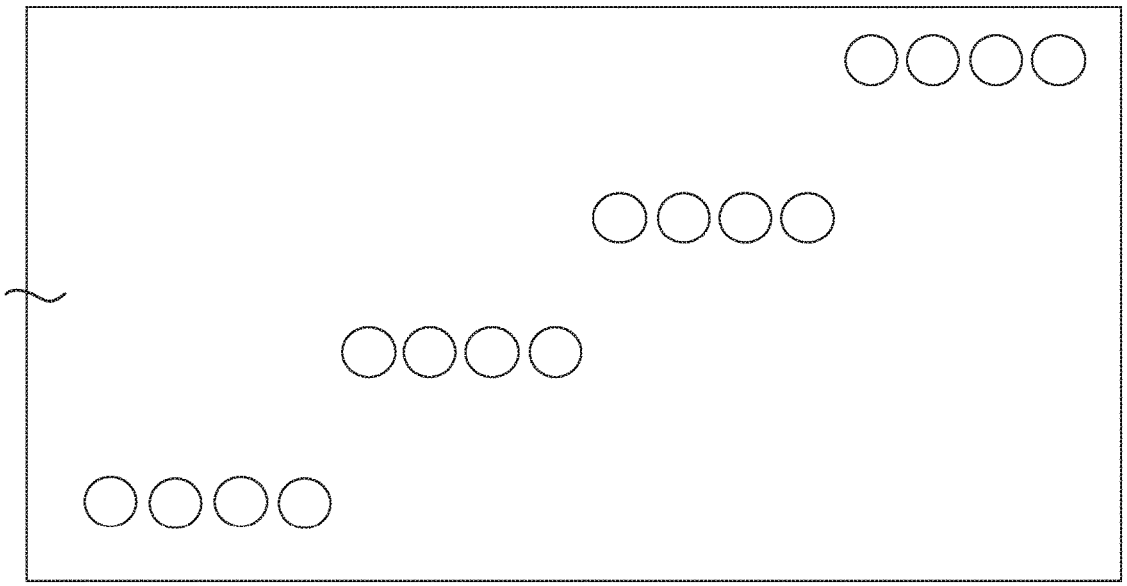
FIG. 7K

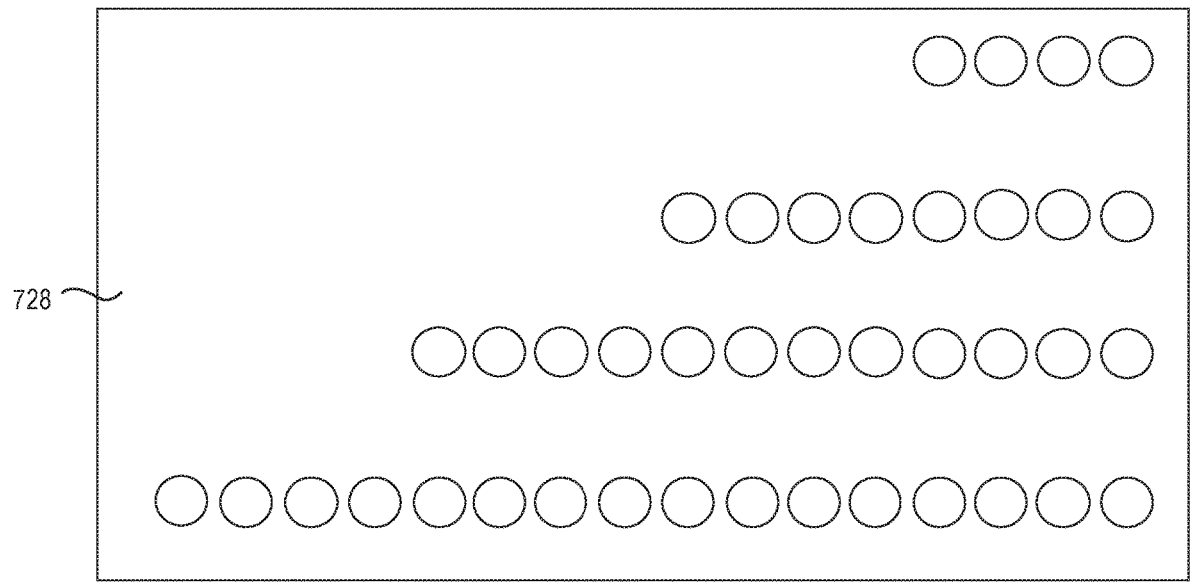
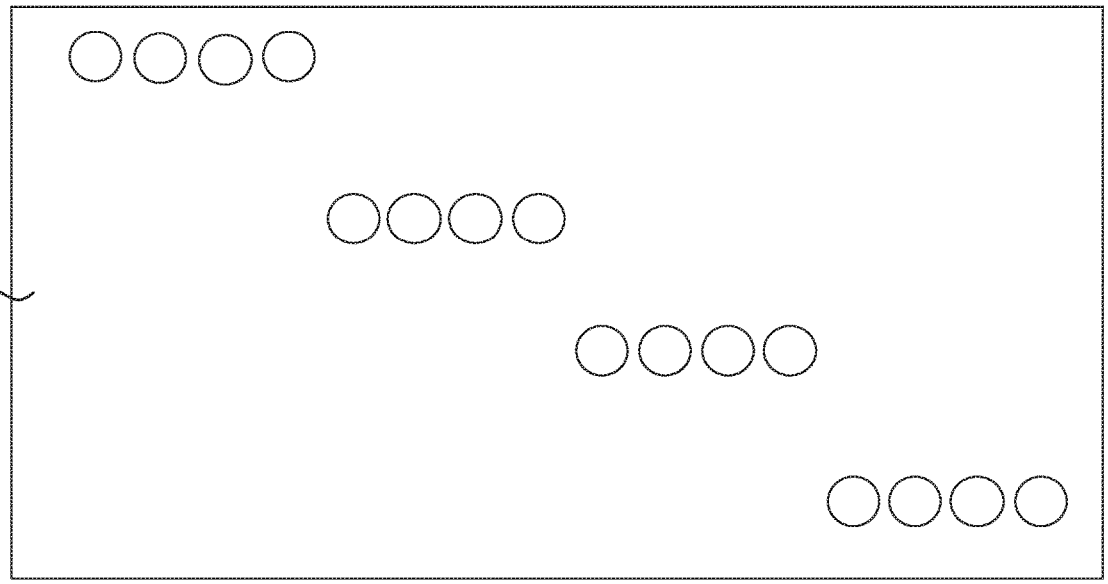
FIG. 7L

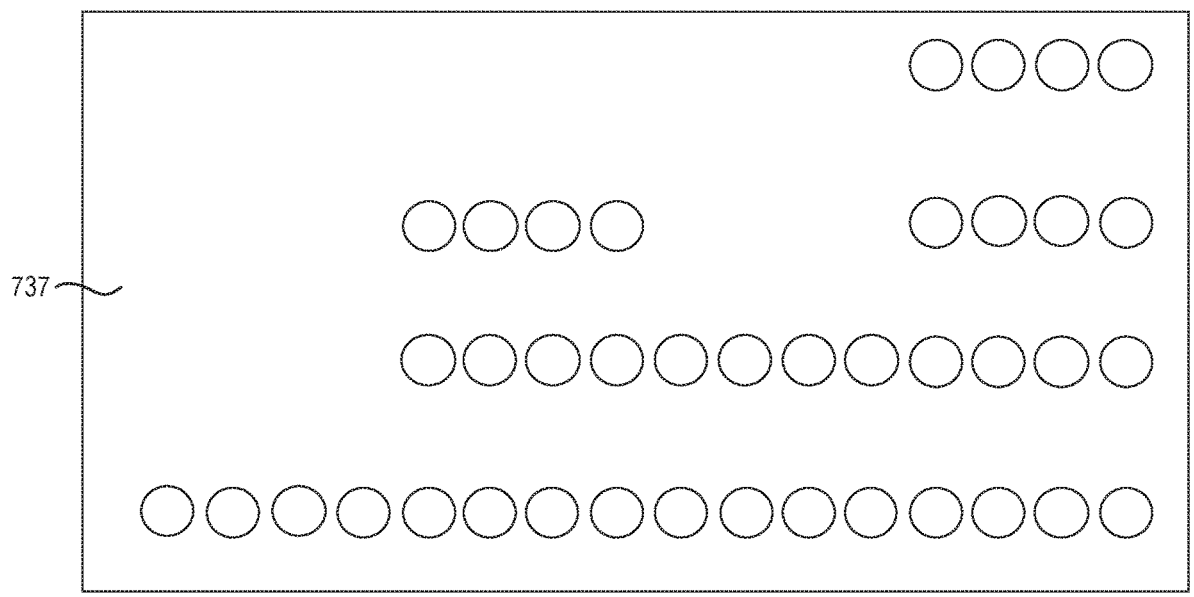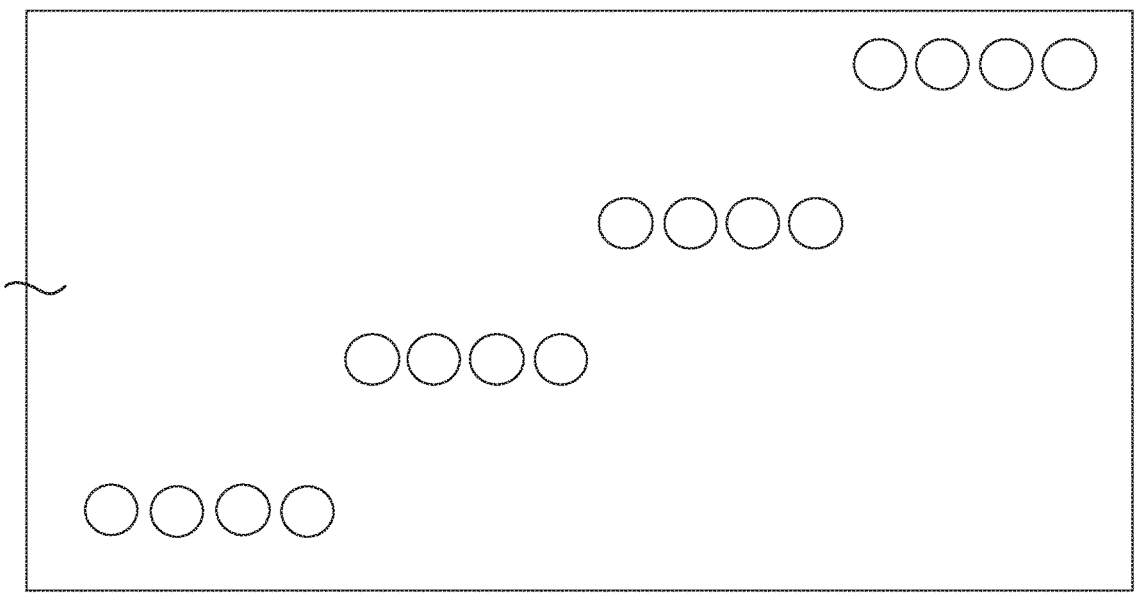
FIG. 70

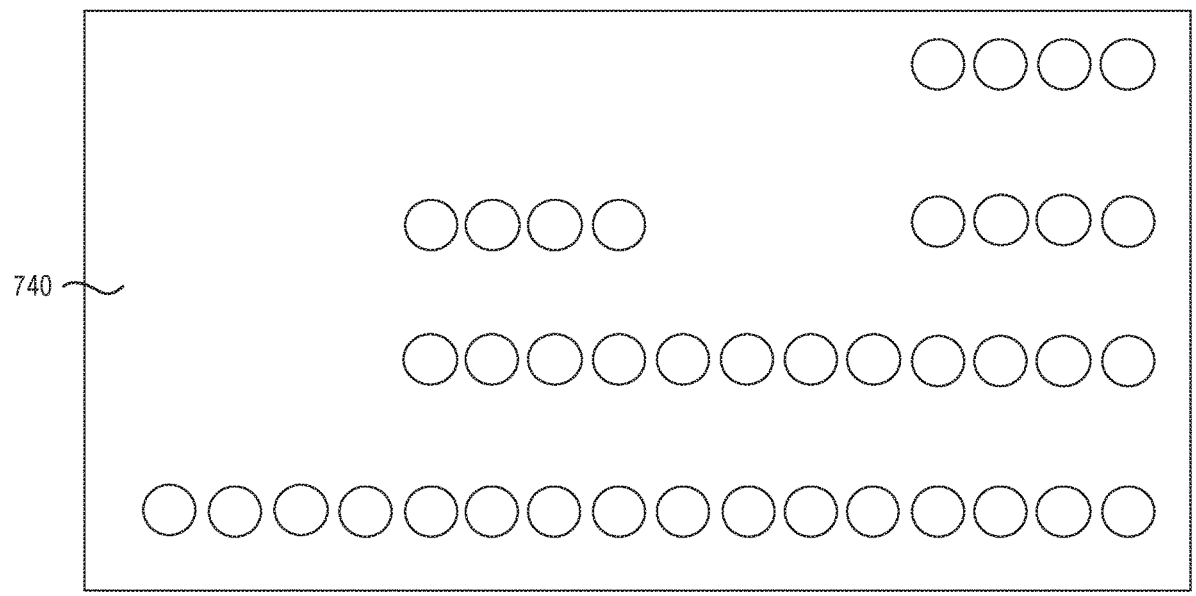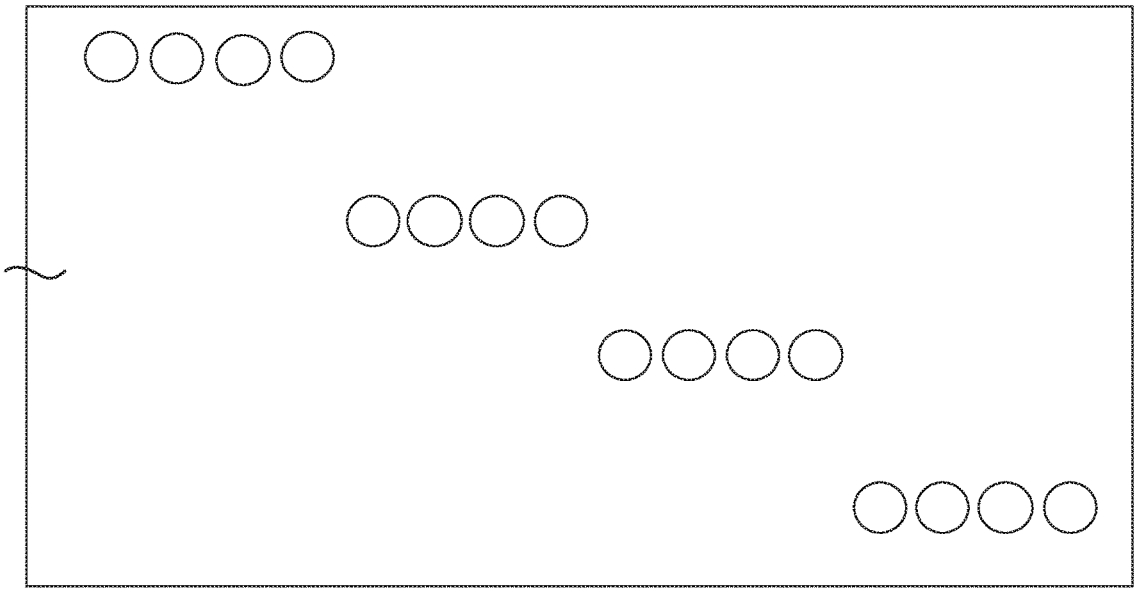
FIG. 7P

800

Directing an airflow, through a deflector disposed on a vehicle outside an enclosure, to a cover on an exterior of the enclosure, wherein the cover comprises a hole pattern
802

Selectively permitting the directed airflow through the hole pattern into the enclosure
804

FIG. 8

SYSTEM AND METHOD FOR REGULATING AIRFLOW INTO AN ENCLOSURE

The present disclosure relates generally to vehicles equipped with sensors in an enclosure, and in particular, some embodiments relate to regulating an airflow into the enclosure, for example, by regulating a layout and size of holes on an exterior of the enclosure.

BACKGROUND

On-board sensors in vehicles, such as autonomous vehicles (AVs), supplement and bolster the vehicle's field of vision by providing accurate sensor data. Sensor data is used, for example, in applications of blind spot detection, lane change assisting, read end radar for collision warning or collision avoidance, park assisting, cross-traffic monitoring, brake assisting, emergency braking, and/or automatic distance controlling. Examples of on-board sensors include, for example, passive sensors and active sensors. On-board sensors include camera, Lidar, radar, GPS, sonar, ultrasonic, IMU (inertial measurement unit), accelerometers, gyroscopes, magnetometers, and FIR (far infrared) sensors. Sensor data may include image data, reflected laser data, and/or the like. Often, images captured by the on-board sensors utilize a three-dimensional coordinate system to determine the distance and angle of the contents and objects captured in the image. Such real-time space information may be acquired near the vehicle using various on-board sensors located throughout the vehicle, which may then be processed to calculate and to determine the safe driving operations of the vehicle. Often, on-board sensors are exposed to harsh environmental elements (e.g., large temperature swings, ultra violet radiation, oxidation, wind, moisture, etc.), which can prematurely shorten the sensors' lifetimes. Furthermore, mounting the sensors exterior to the vehicle can subject the sensors to an increased risk of impact from road debris, thereby increasing a possibility of damaging the sensors. To alleviate these and other problems, a sensor enclosure may house the sensors. Such a sensor enclosure may offer additional protection against environmental elements and road debris while still allowing the sensors to function or operate. However, encasing sensors in a sensor enclosure, without providing adequate airflow or ventilation, can create operational challenges. For example, while operating during summer, an internal temperature of the sensor enclosure may reach a point beyond operational temperature ranges for the sensors. This can lead to sensor malfunction and can render the autonomous vehicle inoperable. In another example, while operating in winter or rainy conditions, moisture inside the sensor enclosure can condensate or fog up, thereby preventing the sensors from operating normally. These shortfalls are addressed by the present inventions, which provides efficient and effective heat exchange of the sensor enclosure while reducing electricity required for the cooling, and efficiently using saved electricity, for example, to store in a battery powering the vehicle.

SUMMARY

Described herein are systems and methods for heat exchange and cooling for a sensor enclosure on a vehicle, for example, a LiDAR sensor enclosure mounted on a roof of an AV, that are more convenient and reduce a computational burden on the sensor system, such as an AV sensor system. Various embodiments of the present disclosure provide a heat exchange system disposed on a vehicle. The heat exchange system may comprise an enclosure disposed on the vehicle. The enclosure may comprise a vent at a base of the enclosure, a fan disposed at a base of the enclosure, and one or more sensors within the enclosure. The enclosure may comprise a cover on an exterior of the enclosure, the cover comprising a hole pattern to selectively permit an airflow to enter the enclosure. The heat exchange system may comprise a deflector disposed on the vehicle outside the enclosure and configured to direct an airflow through the hole pattern.

In some embodiments, the cover comprises a first layer having a first hole pattern and a second layer disposed over the first layer and having a second hole pattern, and the second layer being configured to rotate about the first layer to adjust an alignment between the first hole pattern and the second hole pattern, the alignment indicating an amount of the airflow that enters the enclosure.

In some embodiments, the one or more sensors are configured to determine a speed of the vehicle, an internal temperature of the enclosure, and an external temperature. The heat exchange system may further comprise: a controller configured to regulate an amount of the airflow that enters the enclosure by: determining an amount of rotation of the second layer about the first layer to adjust the alignment between the first hole pattern and the second hole pattern, based on the speed of the vehicle, the internal temperature of the enclosure, the external temperature, or the difference between the internal temperature of the enclosure and the external temperature; and rotating the second layer about the first layer by the determined amount.

In some embodiments, a controller of the heat exchange system is configured to regulate an amount of the airflow that enters the enclosure by: determining an amount of rotation of the second layer about the first layer to adjust the alignment between the first hole pattern and the second hole pattern, based on a predicted future speed of the vehicle, a predicted future internal temperature of the enclosure, a predicted future external temperature, or a predicted difference between the predicted future internal temperature of the enclosure and the predicted future external temperature; and rotating the second layer about the first layer by the determined amount.

In some embodiments, a controller of the heat exchange system is configured to regulate an amount of the airflow that enters the enclosure by: determining an amount of rotation of the second layer about the first layer to adjust the alignment between the first hole pattern and the second hole pattern, based on one or more temperature gradients or pressure gradients; and rotating the second layer about the first layer by the determined amount to increase a degree of the alignment at a location of a hole in a direction of the one or more temperature gradients.

In some embodiments, a controller of the heat exchange system is configured to regulate an amount of the airflow that enters the enclosure by: determining an amount of rotation of the second layer about the first layer to adjust the alignment between the first hole pattern and the second hole pattern, based on a rotation speed of the fan; and rotating the second layer about the first layer by the determined amount.

In some embodiments, the heat exchange system further comprises: a cabin vent connecting the enclosure to a cabin; and a controller configured to regulate an amount of the airflow that enters the enclosure by: determining an amount of rotation of the second layer about the first layer to adjust the alignment between the first hole pattern and the second hole pattern, based on a size of an opening of the cabin vent; and rotating the second layer about the first layer by the determined amount.

In some embodiments, the first layer comprises columns of holes, each of the columns of holes having a distinct pattern with a distinct number or location of holes from other columns of holes; and the second layer comprises a column of holes and is configured to align with one of the columns of holes of the first layer to permit the airflow to enter into the enclosure through the column of holes.

In some embodiments, the column of holes of the second layer is further configured to align partially with one of the columns of holes of the first layer while being partially offset from one of the columns of holes of the first layer by a distance of less than a diameter of the holes to permit a smaller amount of airflow to enter into the enclosure.

In some embodiments, a space between directly adjacent holes of the first hole pattern exceeds a diameter of holes of the first hole pattern; a space between directly adjacent holes of the second hole pattern exceeds a diameter of holes of the second hole pattern; and the controller is configured to block the airflow from entering into the holes of the first hole pattern and the holes of the second hole pattern by rotating the second hole pattern so that each of the holes of the second hole pattern are aligned with the space between directly adjacent holes of the first hole pattern.

In some embodiments, a controller of the heat exchange system may be configured to regulate an amount of the airflow that enters the enclosure using binary programming to indicate an open or closed state of each hole in the hole pattern.

Various embodiments of the present disclosure provide a heat exchange method for an enclosure disposed on a vehicle, the enclosure comprising a fan disposed at a base of the enclosure, one or more sensors within the enclosure, and a cover on an exterior of the enclosure, the cover comprising a hole pattern. The method may comprise, directing an airflow, through a deflector disposed outside the enclosure, to the cover; and selectively permitting the directed airflow through the hole pattern into the enclosure.

In some embodiments, the heat exchange method may further comprise rotating a second layer of the cover about a first layer of the cover to adjust an alignment between a first hole pattern of the first layer and a second hole pattern of the second layer, the alignment indicating an amount of the airflow entering the enclosure.

In some embodiments, the heat exchange method may further comprise: determining, using the one or more sensors, a speed of the vehicle, an internal temperature of the enclosure, and an external temperature; regulating, by a controller, an amount of the airflow that enters the enclosure by: determining an amount of rotation of the second layer about the first layer to adjust the alignment between the first hole pattern and the second hole pattern, based on the speed of the vehicle, the internal temperature of the enclosure, the external temperature, or the difference between the internal temperature of the enclosure and the external temperature; and rotating the second layer about the first layer by the determined amount.

In some embodiments, the heat exchange method may further comprise: regulating, by a controller, an amount of the airflow that enters the enclosure by: determining an amount of rotation of the second layer about the first layer to adjust the alignment between the first hole pattern and the second hole pattern, based on a predicted future speed of the vehicle, a predicted future internal temperature of the enclosure, a predicted future external temperature, or a predicted difference between the predicted future internal temperature of the enclosure and the predicted future external temperature; and rotating the second layer about the first layer by the determined amount.

In some embodiments, the heat exchange method may further comprise: regulating, by a controller, an amount of the airflow that enters the enclosure by: determining an amount of rotation of the second layer about the first layer to adjust the alignment between the first hole pattern and the second hole pattern, based on one or more temperature gradients or pressure gradients; and rotating the second layer about the first layer by the determined amount to increase a degree of the alignment at a location of a hole in a direction of the one or more temperature gradients.

In some embodiments, the heat exchange method may further comprise: regulating, by a controller, an amount of the airflow that enters the enclosure by: determining an amount of rotation of the second layer about the first layer to adjust the alignment between the first hole pattern and the second hole pattern, based on a rotation speed of the fan; and rotating the second layer about the first layer by the determined amount.

In some embodiments, the enclosure further comprises a cabin vent connecting the enclosure to a cabin, and the heat exchange method further comprises: regulating an amount of the airflow that enters the enclosure by: determining an amount of rotation of the second layer about the first layer to adjust the alignment between the first hole pattern and the second hole pattern, based on a size of an opening of the cabin vent; and rotating the second layer about the first layer by the determined amount.

In some embodiments, the first layer comprises columns of holes, each of the columns of holes having a distinct pattern with a distinct number or location of holes from other columns of holes; and the second layer comprises a column of holes; and the heat exchange method further comprises: aligning the column of holes of the second layer with one of the columns of holes of the first layer to permit the airflow to enter into the enclosure through the column of holes.

In some embodiments, the heat exchange method may further comprise, partially aligning the column of holes of the second layer with one of the columns of holes of the first layer by partially offsetting the column of holes of the second layer from one of the columns of holes of the first layer by a distance of less than a diameter of the holes to permit a smaller amount of airflow to enter into the enclosure.

In some embodiments, a space between directly adjacent holes of the first hole pattern exceeds a diameter of holes of the first hole pattern; a space between directly adjacent holes of the second hole pattern exceeds a diameter of holes of the second hole pattern; and the heat exchange method may further comprise, blocking, by the controller, the airflow from entering into the holes of the first hole pattern and the holes of the second hole pattern by rotating the second hole pattern so that each of the holes of the second hole pattern are aligned with the space between directly adjacent holes of the first hole pattern.

These and other features of the systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

In FIG. 1L, the deflector may be in an inactive mode.

In FIG. 1M, the deflector may be in an active mode.

In FIG. 1N, the deflector may be in a first mode.

In FIG. 1N, the deflector may be in a second mode.

FIGS. 6A-6B illustrate an example vehicle (e.g., autonomous vehicle), comprising a heat exchange system (e.g., including an deflector), in a top view, according to an embodiment of the present disclosure.

FIGS. 6C-6D illustrate an example vehicle (e.g., autonomous vehicle), comprising a heat exchange system (e.g., including an deflector), in a top view, according to an embodiment of the present disclosure.

FIGS. 6E-6F illustrate an example vehicle (e.g., autonomous vehicle), comprising a heat exchange system (e.g., including an deflector), in a top view, according to an embodiment of the present disclosure.

FIGS. 6G-6H illustrate an example vehicle (e.g., autonomous vehicle), comprising a heat exchange system (e.g., including an deflector), in a side view, according to an embodiment of the present disclosure.

FIG. 8 depicts a flowchart of an example of a heat exchange method according to some embodiments.

DETAILED DESCRIPTION

Figure 1A:
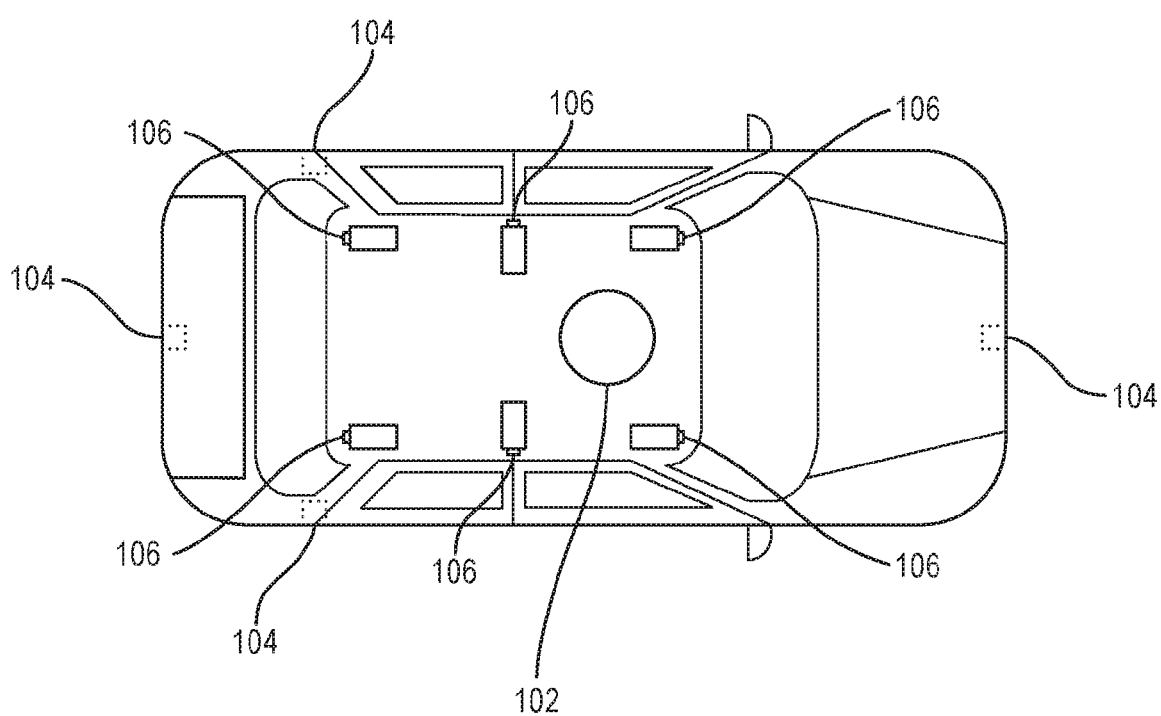
FIG. 1A illustrates an example vehicle (e.g., autonomous vehicle), according to an embodiment of the present disclosure.

In the following description, certain specific details are set forth in order to provide a thorough understanding of various embodiments of the invention. However, one skilled in the art will understand that the invention may be practiced without these details. Moreover, while various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way.

Unless the context requires otherwise, throughout the present specification and claims, the word "comprise" and variations thereof, such as, "comprises" and "comprising"

are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it were individually recited herein. Additionally, the singular forms "a," "an" and "the" include plural referents unless the context clearly dictates otherwise. The phrases "at least one of," "at least one selected from the group of," or "at least one selected from the group consisting of," and the like are to be interpreted in the disjunctive (e.g., not to be interpreted as at least one of A and at least one of B).

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment, but may be in some instances. Furthermore, the particular features, structures, or characteristics may be combined in any suitable manner in one or more embodiments.

In general, a vehicle (e.g., an autonomous vehicle, a driverless vehicle, etc.) can have myriad sensors onboard the vehicle. The myriad sensors can include light detection and ranging sensors (or LiDARs), radars, cameras, GPS, sonar, ultrasonic, IMU (inertial measurement unit), accelerometers, gyroscopes, magnetometers, FIR (far infrared) sensors, etc. The myriad sensors can play a central role in functioning of an autonomous or driverless vehicle. For example, LiDARs can be utilized to detect and identify objects (e.g., other vehicles, road signs, pedestrians, buildings, etc.) in a surrounding. LiDARs can also be utilized to determine relative distances of the objects in the surrounding. For another example, radars can be utilized to aid with collision avoidance, adaptive cruise control, blind side detection, assisted parking, etc. For yet another example, camera can be utilized to recognize, interpret, and/or analyze contents or visual cues of the objects. Cameras and other optical sensors can capture image data using charge coupled devices (CCDs), complementary metal oxide semiconductors (CMOS), or similar elements. An IMU may detect abnormal occurrences such as a bump or pothole in a road. Data collected from these sensors can then be processed and used, as inputs, to make driving decisions (e.g., acceleration, deceleration, direction change, etc.). For example, data from these sensors may be further processed into an image histogram of a graphical representation of tonal distribution in an image captured by the one or more sensors.

Various embodiments overcome problems specifically arising in the realm of autonomous vehicle technology. In various embodiments, the myriad sensors (e.g., LiDARs, radars, cameras, etc.) onboard the autonomous vehicle can be encased or housed in an enclosure. The enclosure allows the myriad sensors to be moved from one vehicle to another vehicle in a single act, rather than to move the myriad sensors one by one. In some embodiments, the enclosure can be installed or mounted onto a fixture of the autonomous vehicle. For example, the enclosure can be installed or mounted onto a roof rack or a custom rack fitted to the autonomous vehicle. The enclosure can be translated or moved along the fixture. In some embodiments, the enclosure is made of a material that is transparent to electromagnetic waves receptive to the myriad sensors encased by the enclosure. For example, the enclosure can be made from a transparent material that allows laser lights, radio waves, and visible lights emitted and/or received by the LiDARs, the radars, and the cameras, respectively, to enter and/or exit the enclosure. In some embodiments, the enclosure can include a signal transmitter. The signal transmitter can emit a signal. This signal can be received or detected by a signal receiver. In some cases, the signal can be reflected before being received or detected by the signal receiver. In one embodiment, both the signal transmitter and the signal receiver are integrated into the enclosure. In another embodiment, the signal transmitter is integrated into the enclosure while the signal receiver is integrated into the fixture of the autonomous vehicle. An intensity of the signal can be determined. Based on the intensity of the signal, a determination on whether the enclosure is properly aligned (positioned or placed) onto the fixture of the autonomous vehicle can be made. In some embodiments, the enclosure can include an audio device that emits an audio cue based on the intensity of the signal. For example, the stronger or higher the intensity, the more audible (e.g., louder, faster, etc.) the audio cue becomes. The audio cue can serve as an indication or a feedback to an extend that the enclosure is properly aligned. Various embodiments are discussed herein in greater detail.

FIG. 1A illustrates an example vehicle (e.g. autonomous vehicle) 100, according to an embodiment of the present disclosure. A vehicle 100 generally refers to a category of vehicles that are capable of sensing and driving in a surrounding by itself. The vehicle 100 can include myriad sensors (e.g., LiDARs, radars, cameras, etc.) to detect and identify objects in the surrounding. Such objects may include, but not limited to, pedestrians, road signs, traffic lights, and/or other vehicles, for example. The vehicle 100 can also include myriad actuators to propel and navigate the vehicle 100 in the surrounding. Such actuators may include, for example, any suitable electro-mechanical devices or systems to control a throttle response, a braking action, a steering action, etc. In some embodiments, the vehicle 100 can recognize, interpret, and analyze road signs (e.g., speed limit, school zone, construction zone, etc.) and traffic lights (e.g., red light, yellow light, green light, flashing red light, etc.). For example, the vehicle 100 can adjust vehicle speed based on speed limit signs posted on roadways. In some embodiments, the vehicle 100 can determine and adjust speed at which the vehicle 100 is traveling in relation to other objects in the surrounding. For example, the vehicle 100 can maintain a constant, safe distance from a vehicle ahead (e.g., adaptive cruise control). In this example, the vehicle 100 maintains this safe distance by constantly adjusting its vehicle speed to that of the vehicle ahead.

In various embodiments, the vehicle 100 may navigate through roads, streets, and/or terrain with limited or no human input. The word "vehicle" or "vehicles" as used in this paper includes vehicles that travel on ground (e.g., cars, trucks, bus, etc.), but may also include vehicles that travel in air (e.g., drones, airplanes, helicopters, etc.), vehicles that travel on water (e.g., boats, submarines, etc.). Further, "vehicle" or "vehicles" discussed in this paper may or may not accommodate one or more passengers therein. Moreover, phrases "autonomous vehicles," "driverless vehicles," or any other vehicles that do not require active human involvement can be used interchangeably.

In general, the vehicle 100 can effectuate any control to itself that a human driver can on a conventional vehicle. For example, the vehicle 100 can accelerate, brake, turn left or right, or drive in a reverse direction just as a human driver can on the conventional vehicle. The vehicle 100 can also sense environmental conditions, gauge spatial relationships (e.g., distances between objects and itself), detect and analyze road signs just as the human driver. Moreover, the vehicle 100 can perform more complex operations, such as parallel parking, parking in a crowded parking lot, collision avoidance, etc., without any human input.

In various embodiments, the vehicle 100 may include one or more sensors. As used herein, the one or more sensors may include laser scanning systems (e.g., LiDARs) 102, radar systems 104, camera systems 106, GPS, sonar, ultrasonic, IMU (inertial measurement unit), accelerometers, gyroscopes, magnetometers, FIR (far infrared) sensors, and/or the like. The one or more sensors allow the vehicle 100 to sense an environment around the vehicle 100. For example, the LiDARs 102 can generate a three-dimensional map of the environment. The LiDARs 102 can also detect objects in the environment. In another example, the radar systems 104 can determine distances and speeds of objects around the vehicle 100. In another example, the camera systems 106 can capture and process image data to detect and identify objects, such as road signs, as well as deciphering content of the objects, such as speed limit posted on the road signs.

In the example of FIG. 1A, the vehicle 100 is shown with a LiDAR 102. The LiDAR 102 may be coupled to a roof or a top of the vehicle 100. As discussed, LiDARs such as LiDAR 102 can be configured to generate three dimensional maps of an environment and detect objects in the environment. In the example of FIG. 1A, the vehicle 100 is shown with four radar systems 104. Two radar systems are coupled to a front-side and a back-side of the vehicle 100, and two radar systems are coupled to a right-side and a left-side of the vehicle 100. In some embodiments, the front-side and the back-side radar systems can be configured for adaptive cruise control and/or accident avoidance. For example, the front-side radar system can be used by the vehicle 100 to maintain a healthy distance from a vehicle ahead of the vehicle 100. In another example, if the vehicle ahead experiences a sudden reduction in speed, the vehicle 100 can detect this sudden change in motion and adjust its vehicle speed accordingly. In some embodiments, the right-side and the left-side radar systems can be configured for blind-spot detection. In the example of FIG. 1A, the vehicle 100 is shown with six camera systems 106. Two camera systems are coupled to the front-side of the vehicle 100, two camera systems are coupled to the back-side of the vehicle 100, and two camera systems are couple to the right-side and the left-side of the vehicle 100. In some embodiments, the front-side and the back-side camera systems can be configured to detect, identify, and decipher objects, such as cars, pedestrian, road signs, in the front and the back of the vehicle 100. For example, the front-side camera systems can be utilized by the vehicle 100 to determine speed limits. In some embodiments, the right-side and the left-side camera systems can be configured to detect objects, such as lane markers. For example, side camera systems can be used by the vehicle 100 to ensure that the vehicle 100 drives within its lane.

Figure 1B:
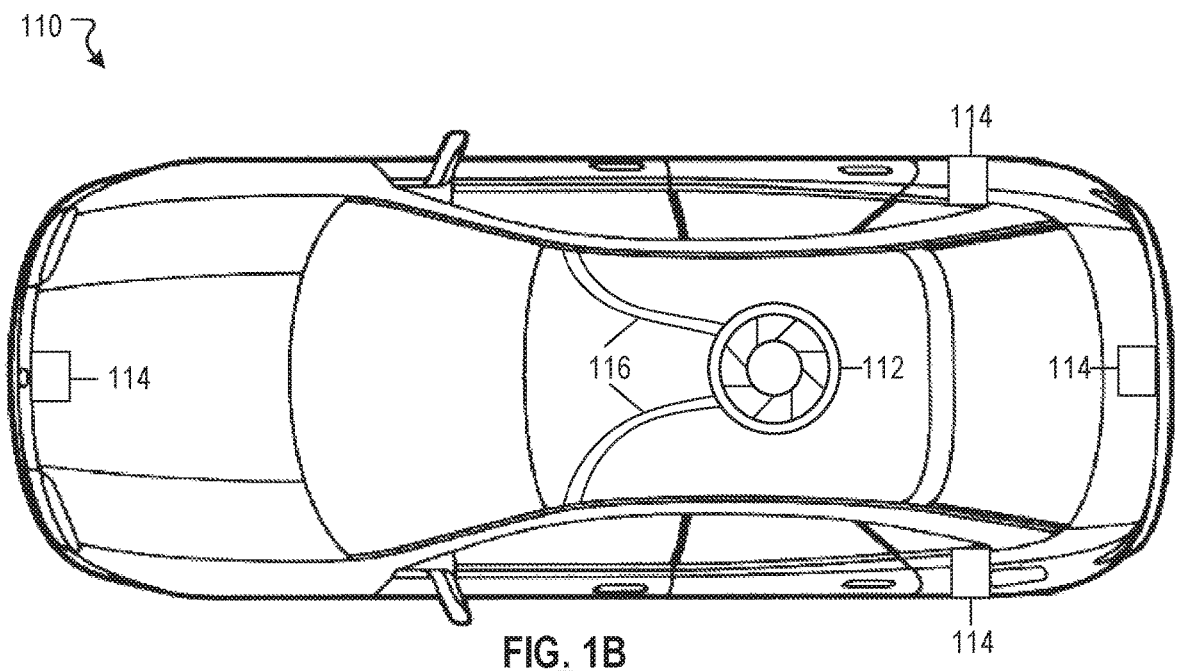
FIG. 1B illustrates an example vehicle (e.g., autonomous vehicle), comprising a heat exchange system (e.g., including an deflector), in a top view, according to an embodiment of the present disclosure.

FIG. 1B illustrates an example vehicle (e.g., autonomous vehicle), comprising a heat exchange system (e.g., including an deflector), in a top view, according to an embodiment of the present disclosure. The example vehicle 110 is shown with an enclosure 112 (e.g., to house one or more sensors), four radar systems 114, and an deflector 116. The enclosure 112 can include a LiDAR and one or more camera systems. As discussed, the enclosure 112 can provide an additional protection for the LiDAR and the one or more camera systems against various environmental conditions while still letting in wavelengths of light receptive to the LiDAR and the one or more camera systems. In general, the LiDAR and the one or more camera systems of the enclosure 112 and the four radar systems work the same as the LiDAR, camera systems, and radar systems discussed with respect with FIG. 1A.

The deflector 116 may increase an efficiency or an amount of air flowing into the enclosure. In FIG. 1B, two deflectors 116 are shown. However, the heat exchange system may include any number of deflectors 116. The deflectors 116 may be connected to the enclosure 112. For example, the deflectors 116 may directly contact the enclosure 112. The deflectors 116 may be configured to channel an airflow (e.g., wind) while the vehicle 110 is driving, and direct the channeled airflow into a vent (not visible in top view) of the enclosure 112. As an example, the deflectors 116 may curve outward (e.g., the deflectors 116 may be convex) as a distance between the deflectors 116 and the enclosure 112 increases. The deflectors 116 may also be concave (not shown). The deflectors 116 may have smooth and/or rounded edges to prevent turbulent flow. The deflectors 116 may be comprised of a material such as a plastic, metal, fiberglass, nanomaterial, a shape memory alloy such as copper-aluminum-nickel, nickel-titanium (NiTi), Fe—Mn—Si, Cu—Zn—Al, Cu—Al—Ni, and the like, or other suitable material.

Figure 1C:
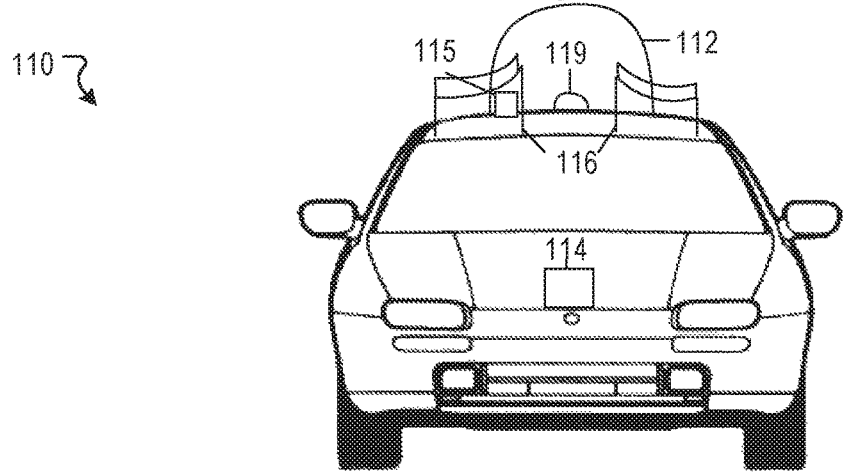
FIG. 1C illustrates an example vehicle (e.g., autonomous vehicle), comprising a heat exchange system (e.g., including an deflector), in a front view, corresponding to FIG. 1B, according to an embodiment of the present disclosure.

FIG. 1C illustrates an example vehicle (e.g., autonomous vehicle), comprising a heat exchange system (e.g., including an deflector), in a front view, corresponding to FIG. 1B, according to an embodiment of the present disclosure. FIG. 1C illustrates the components of FIG. 1B, and further illustrates a vent 119. The vent 119 may be an opening in a form of a circle, semicircle, grill, slit, or the like. The vent 119 may be disposed at a base of the enclosure 112 and may be connected to a roof of the vehicle 110. The deflectors 116 may comprise an air quality sensor 115 configured to determine an air quality, for example, as an air quality index (AQI). The air quality sensor 115 may determine an attenuation of infrared radiation, and may comprise an infrared radiation source, a light water pipe, and an infrared detector having a filter. Alternatively, the air quality sensor 115 may be disposed elsewhere on the vehicle 110 (e.g., elsewhere on the roof of the vehicle 110).

Figure 1D:
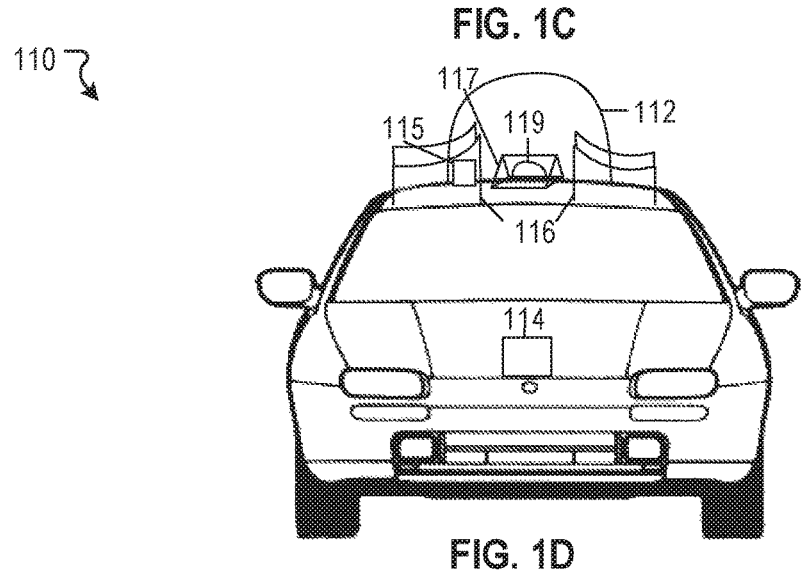
FIG. 1D illustrates an example vehicle (e.g., autonomous vehicle), comprising a heat exchange system (e.g., including an deflector), in a front view, according to an embodiment of the present disclosure.

FIG. 1D illustrates an example vehicle (e.g., autonomous vehicle), comprising a heat exchange system (e.g., including an deflector), in a front view, according to an embodiment of the present disclosure. FIG. 1D illustrates the components of FIG. 1B and FIG. 1C, and further illustrates a third deflector 117. The third deflector 117 may partially cover the vent, and one surface of the third deflector may be disposed at an oblique angle with respect to the enclosure 112. The third deflector 117 may be comprised of a material such as a plastic, metal, fiberglass, nanomaterial, a shape memory alloy such as copper-aluminum-nickel, nickel-titanium (NiTi), Fe—Mn—Si, Cu—Zn—Al, Cu—Al—Ni, and the like, or other suitable material. The deflectors 116 may comprise an air quality sensor 115 configured to determine an air quality, for example, as an air quality index (AQI). The air quality sensor 115 may determine an attenuation of infrared radiation, and may comprise an infrared radiation source, a light water pipe, and an infrared detector having a filter.

Figure 1E:
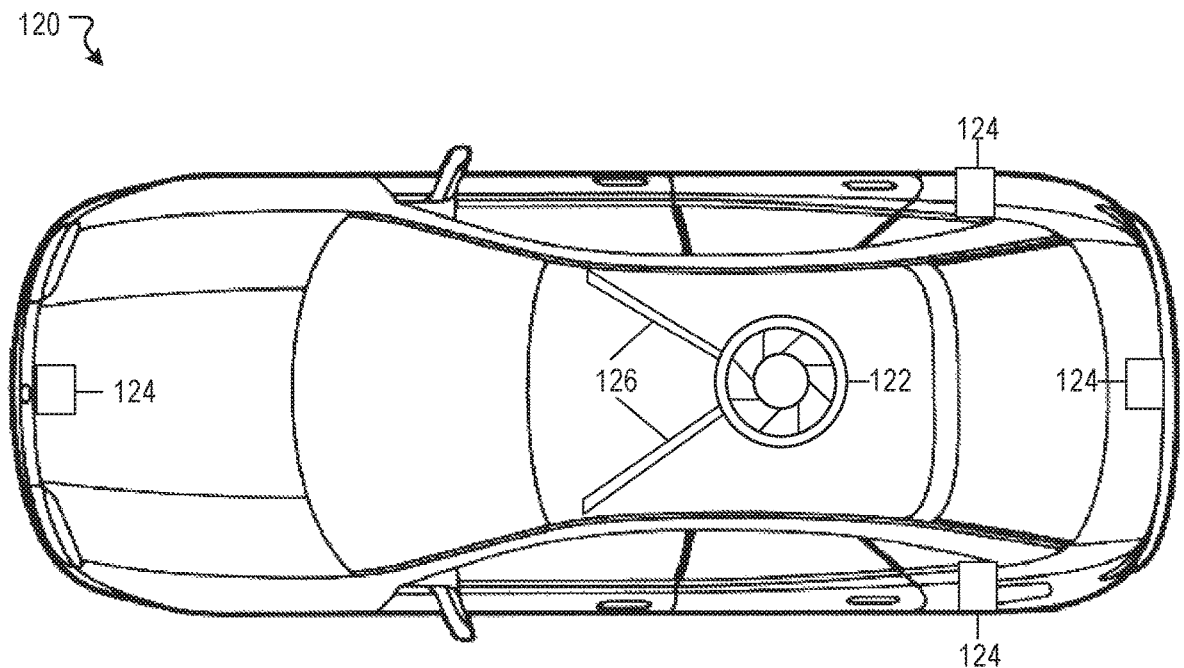
FIG. 1E illustrates an example vehicle (e.g., autonomous vehicle), comprising a heat exchange system (e.g., including an deflector), in a top view, according to an embodiment of the present disclosure.

FIG. 1E illustrates an example vehicle (e.g., autonomous vehicle), comprising a heat exchange system (e.g., including an deflector), in a top view, according to an embodiment of the present disclosure. The example vehicle 120 is shown with an enclosure 122 (e.g., to house one or more sensors), four radar systems 124, and an deflector 126. The enclosure 122 can include a LiDAR and one or more camera systems. As discussed, the enclosure 122 can provide an additional protection for the LiDAR and the one or more camera systems against various environmental conditions while still letting in wavelengths of light receptive to the LiDAR and the one or more camera systems. In general, the LiDAR and the one or more camera systems of the enclosure 122 and the four radar systems work the same as the LiDAR, camera systems, and radar systems discussed with respect with FIG. 1A.

The deflector 126 may increase an efficiency or an amount of air flowing into the enclosure 122. In FIG. 1E, two deflectors 126 are shown. However, the heat exchange system may include any number of deflectors 126, such as one deflector, or an deflector and a second deflector. The deflectors 126 may be connected to the enclosure 122. For example, the deflectors 126 may directly contact the enclosure 122. The deflectors 126 may be configured to channel an airflow (e.g., wind) while the vehicle 120 is driving, and direct the channeled airflow into a vent (not visible in top view) of the enclosure 122. As an example, the deflectors 126 may extend along a straight line from the enclosure 122. The deflectors 126 may have smooth and/or rounded edges to prevent turbulent flow. The deflectors 126 may be comprised of a material such as a plastic, metal, fiberglass, nanomaterial, or other suitable material.

Figure 1F:
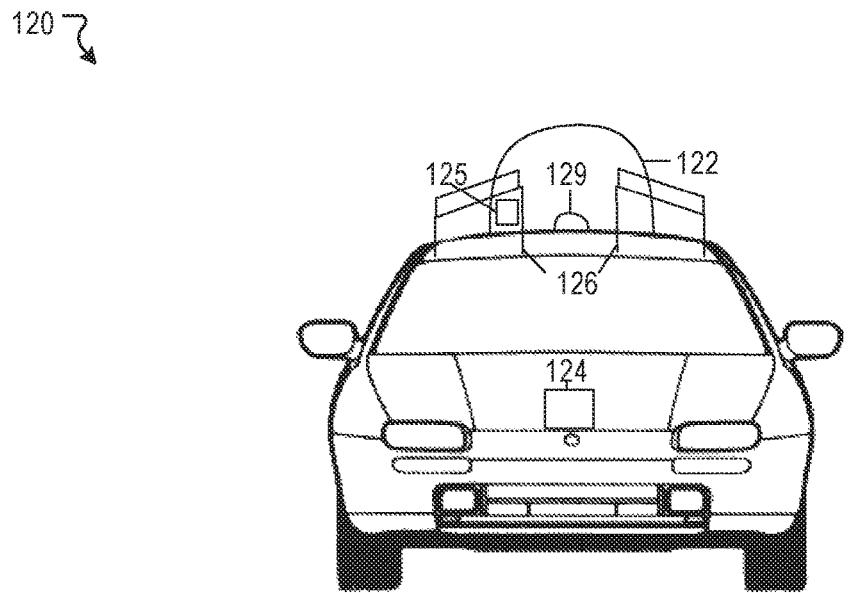
FIG. 1F illustrates an example vehicle (e.g., autonomous vehicle), comprising a heat exchange system (e.g., including an deflector), in a front view, corresponding to FIG. 1E, according to an embodiment of the present disclosure.

FIG. 1F illustrates an example vehicle (e.g., autonomous vehicle), comprising a heat exchange system (e.g., including an deflector), in a front view, corresponding to FIG. 1E, according to an embodiment of the present disclosure. FIG. 1F illustrates the components of FIG. 1E, and further illustrates a vent 129. The vent 129 may be an opening in a form of a circle, semicircle, grill, slit, or the like. The vent 129 may be disposed at a base of the enclosure 122 and may be connected to a roof of the vehicle 120. The deflectors 126 may comprise an air quality sensor 125 configured to determine an air quality, for example, as an air quality index (AQI). The air quality sensor 125 may determine an attenuation of infrared radiation, and may comprise an infrared radiation source, a light water pipe, and an infrared detector having a filter. Alternatively, the air quality sensor 125 may be disposed elsewhere on the vehicle 120 (e.g., elsewhere on the roof of the vehicle 120).

Figure 1G:
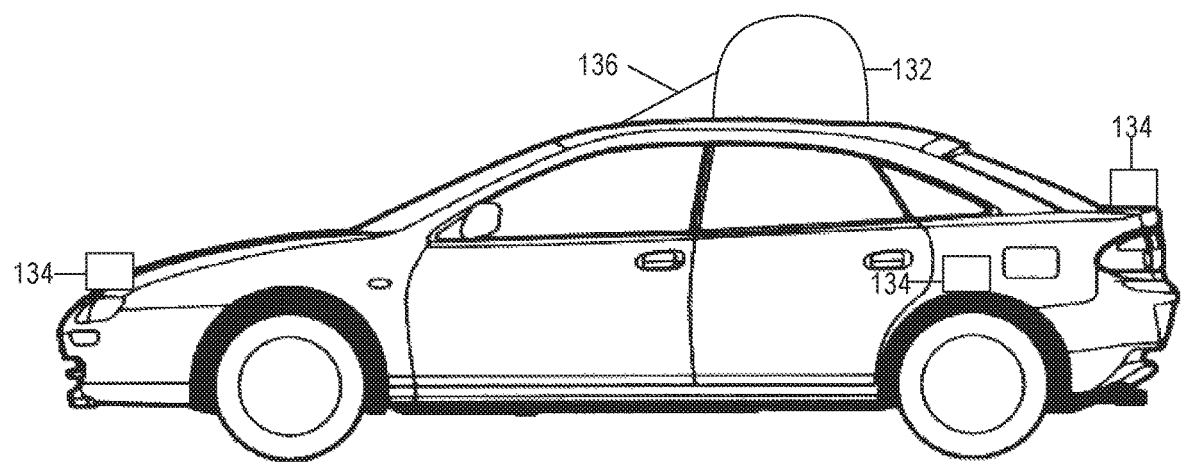
FIG. 1G illustrates an example vehicle (e.g., autonomous vehicle), comprising a heat exchange system (e.g., including an deflector), in a side view, according to an embodiment of the present disclosure.

FIG. 1G illustrates an example vehicle (e.g., autonomous vehicle), comprising a heat exchange system (e.g., including an deflector), in a side view, according to an embodiment of the present disclosure. The example vehicle 130 is shown with an enclosure 132 (e.g., to house one or more sensors), four radar systems 134, and an deflector 136. The enclosure 132 can include a LiDAR and one or more camera systems. As discussed, the enclosure 132 can provide an additional protection for the LiDAR and the one or more camera systems against various environmental conditions while still letting in wavelengths of light receptive to the LiDAR and the one or more camera systems. In general, the LiDAR and the one or more camera systems of the enclosure 132 and the four radar systems work the same as the LiDAR, camera systems, and radar systems discussed with respect with FIG. 1A. The enclosure 132 may also include a vent (not shown because hidden from view) similar to vents 119 and 129.

The deflector 136 (or multiple deflectors 136) may be connected to the enclosure 132. For example, the deflector 136 may directly contact the enclosure 132. The deflector 136 may be configured to channel an airflow (e.g., wind) while the vehicle 130 is driving, and direct the channeled airflow into a vent (not visible in top view) of the enclosure 132. The deflector 136 may increase an efficiency or an amount of air flowing into the enclosure. As an example, a vertical height of the deflector 136 above a roof of the vehicle 130 may decrease as the deflector 136 extends away from the enclosure 132. As an example, the vertical height of the deflector 136 may decrease at a constant, linear rate with respect to a distance from the deflector 136 to the enclosure 132. The deflector 136 may have smooth and/or rounded edges to prevent turbulent flow. The deflector 136 may be comprised of a material such as a plastic, metal, fiberglass, nanomaterial, a shape memory alloy such as copper-aluminum-nickel, nickel-titanium (NiTi), Fe—Mn—Si, Cu—Zn—Al, Cu—Al—Ni, and the like, or other suitable material. The deflector 136 may comprise an air quality sensor (not shown, same or similar to 115, 125) configured to determine an air quality, for example, as an air quality index (AQI). The air quality sensor may determine an attenuation of infrared radiation, and may comprise an infrared radiation source, a light water pipe, and an infrared detector having a filter. Alternatively, the air quality sensor may be disposed elsewhere on the vehicle 130 (e.g., elsewhere on the roof of the vehicle 130).

Figure 1H:
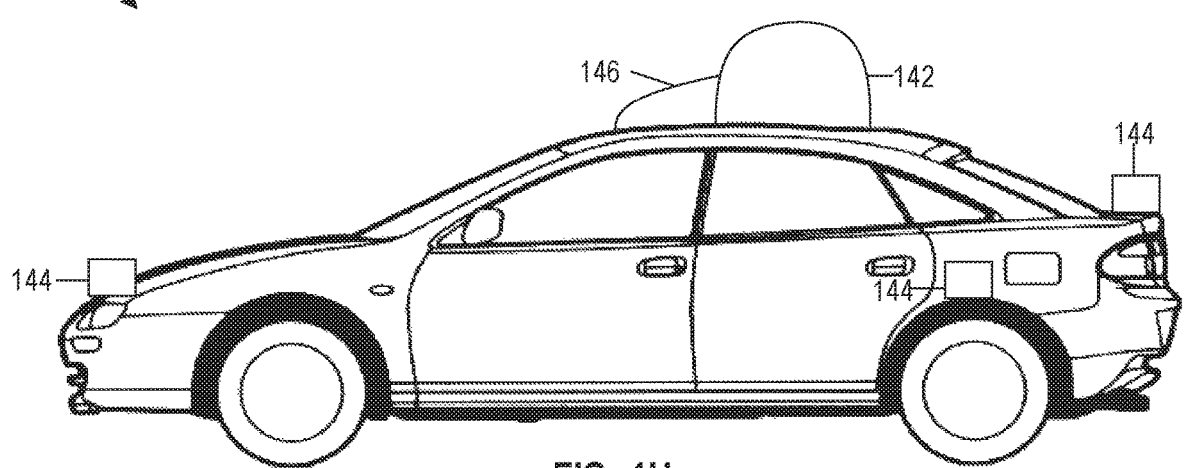
FIG. 1H illustrates an example vehicle (e.g., autonomous vehicle), comprising a heat exchange system (e.g., including an deflector), in a side view, according to an embodiment of the present disclosure.

FIG. 1H illustrates an example vehicle (e.g., autonomous vehicle), comprising a heat exchange system (e.g., including an deflector), in a side view, according to an embodiment of the present disclosure. The example vehicle 140 is shown with an enclosure 142 (e.g., to house one or more sensors), four radar systems 144, and an deflector 146. The enclosure 142 can include a LiDAR and one or more camera systems. As discussed, the enclosure 142 can provide an additional protection for the LiDAR and the one or more camera systems against various environmental conditions while still letting in wavelengths of light receptive to the LiDAR and the one or more camera systems. In general, the LiDAR and the one or more camera systems of the enclosure 142 and the four radar systems work the same as the LiDAR, camera systems, and radar systems discussed with respect with FIG. 1A. The enclosure 142 may also include a vent (not shown because hidden from view) similar to vents 119 and 129.

The deflector 146 (or multiple deflectors 146) may be connected to the enclosure 142. For example, the deflector 146 may directly contact the enclosure 142. The deflector 146 may be configured to channel an airflow (e.g., wind) while the vehicle 140 is driving, and direct the channeled airflow into a vent (not visible in top view) of the enclosure 142. The deflector 146 may increase an efficiency or an amount of air flowing into the enclosure. As an example, a vertical height of the deflector 146 above a roof of the vehicle 140 may decrease as the deflector 146 extends away from the enclosure 142. As an example, the vertical height of the deflector 146 may decrease at a nonconstant rate with respect to a distance from the deflector 146 to the enclosure 142. For example, the vertical height of the deflector 146 may decrease at a faster rate as a distance from the deflector 146 to the enclosure 142 increases. In other words, as the vertical height of the deflector 146 decreases, a rate of decrease of the vertical height of the deflector 146 may be accelerated. The deflector 146 may have smooth and/or rounded edges to prevent turbulent flow. The deflector 146 may be comprised of a material such as a plastic, metal, fiberglass, nanomaterial, a shape memory alloy such as copper-aluminum-nickel, nickel-titanium (NiTi), Fe—Mn—Si, Cu—Zn—Al, Cu—Al—Ni, and the like, or other suitable material. The deflector 146 may comprise an air quality sensor (not shown, same or similar to 115, 125) configured to determine an air quality, for example, as an air quality index (AQI). The air quality sensor may determine an attenuation of infrared radiation, and may comprise an infrared radiation source, a light water pipe, and an infrared detector having a filter. Alternatively, the air quality sensor may be disposed elsewhere on the vehicle 140 (e.g., elsewhere on the roof of the vehicle 140).

Figure 1I:
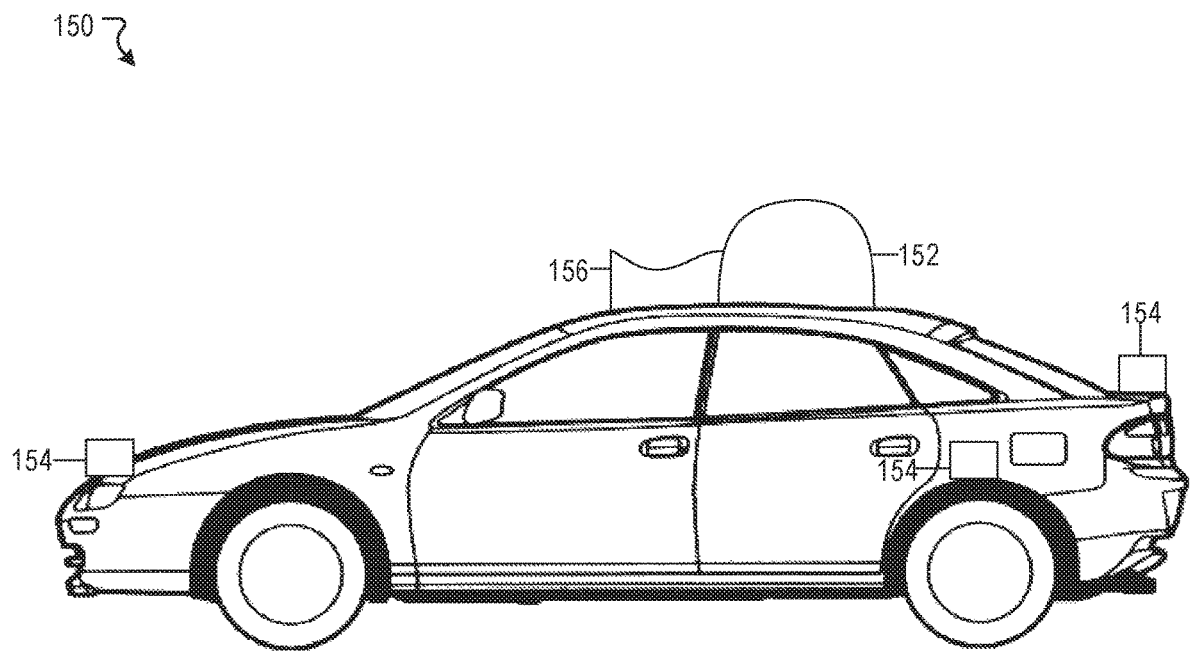
FIG. 1I illustrates an example vehicle (e.g., autonomous vehicle), comprising a heat exchange system (e.g., including an deflector), in a side view, according to an embodiment of the present disclosure.

FIG. 1I illustrates an example vehicle (e.g., autonomous vehicle), comprising a heat exchange system (e.g., including an deflector), in a side view, according to an embodiment of the present disclosure. The example vehicle 150 is shown with an enclosure 152 (e.g., to house one or more sensors), four radar systems 154, and an deflector 156. The enclosure 152 can include a LiDAR and one or more camera systems. As discussed, the enclosure 152 can provide an additional protection for the LiDAR and the one or more camera systems against various environmental conditions while still letting in wavelengths of light receptive to the LiDAR and the one or more camera systems. In general, the LiDAR and the one or more camera systems of the enclosure 152 and the four radar systems work the same as the LiDAR, camera systems, and radar systems discussed with respect with FIG. 1A. The enclosure 152 may also include a vent (not shown because hidden from view) similar to vents 119 and 129.

The deflector 156 (or multiple deflectors 156) may be connected to the enclosure 152. For example, the deflector 156 may directly contact the enclosure 152. The deflector 156 may be configured to channel an airflow (e.g., wind) while the vehicle 150 is driving, and direct the channeled airflow into a vent (not visible in top view) of the enclosure 152. The deflector 156 may increase an efficiency or an amount of air flowing into the enclosure. As an example, a vertical height of the deflector 156 above a roof of the vehicle 150 may change as the deflector 156 extends away from the enclosure 152. As an example, the vertical height of the deflector 156 may decrease as the deflector 156 extends away from the enclosure 152 at a first section (e.g., closer to the enclosure 152) and the vertical height of the deflector 156 may increase as the deflector 156 extends away from the enclosure 152 at a second section (e.g., farther from the enclosure 152 compared to the first section). A rate of increase and/or decrease in the vertical height may be nonconstant, with respect to a distance from the deflector 156 to the enclosure 152. For example, the vertical height of the deflector 156 may decrease at a faster rate as a distance from the deflector 156 to the enclosure 152 increases, in the first section. In other words, in the first section, as the vertical height of the deflector 156 decreases, a rate of decrease of the vertical height of the deflector 156 may be accelerated. In the second section, the rate of increase of the vertical height of the deflector 156 may increase as a distance from the deflector 156 to the enclosure 152 increases. The deflector 156 may have smooth and/or rounded edges to prevent turbulent flow. The deflector 156 may be comprised of a material such as a plastic, metal, fiberglass, nanomaterial, a shape memory alloy such as copper-aluminum-nickel, nickel-titanium (NiTi), Fe—Mn—Si, Cu—Zn—Al, Cu—Al—Ni, and the like, or other suitable material. The deflector 156 may comprise an air quality sensor (not shown, same or similar to 115, 125) configured to determine an air quality, for example, as an air quality index (AQI). The air quality sensor may determine an attenuation of infrared radiation, and may comprise an infrared radiation source, a light water pipe, and an infrared detector having a filter. Alternatively, the air quality sensor may be disposed elsewhere on the vehicle 150 (e.g., elsewhere on the roof of the vehicle 150).

Figure 1J:
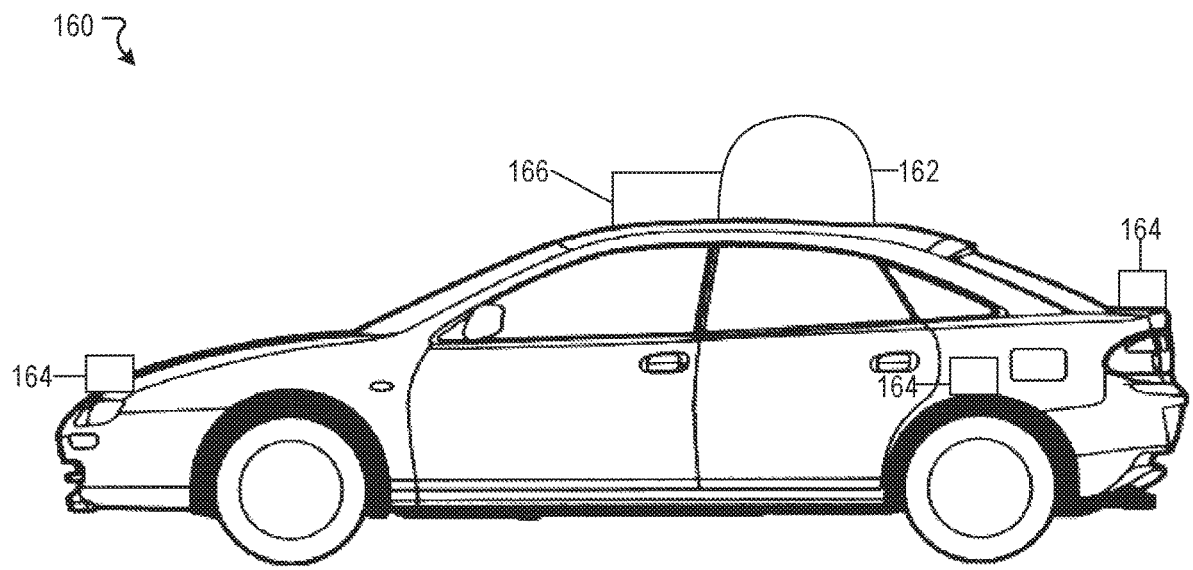
FIG. 1J illustrates an example vehicle (e.g., autonomous vehicle), comprising a heat exchange system (e.g., including an deflector), in a side view, according to an embodiment of the present disclosure.

FIG. 1J illustrates an example vehicle (e.g., autonomous vehicle), comprising a heat exchange system (e.g., including an deflector), in a side view, according to an embodiment of the present disclosure. The example vehicle 160 is shown with an enclosure 162 (e.g., to house one or more sensors), four radar systems 164, and an deflector 166. The enclosure 162 can include a LiDAR and one or more camera systems. As discussed, the enclosure 162 can provide an additional protection for the LiDAR and the one or more camera systems against various environmental conditions while still letting in wavelengths of light receptive to the LiDAR and the one or more camera systems. In general, the LiDAR and the one or more camera systems of the enclosure 162 and the four radar systems work the same as the LiDAR, camera systems, and radar systems discussed with respect with FIG. 1A. The enclosure 162 may also include a vent (not shown because hidden from view) similar to vents 119 and 129.

The deflector 166 (or multiple deflectors 166) may be connected to the enclosure 162. For example, the deflector 166 may directly contact the enclosure 162. The deflector 166 may be configured to channel an airflow (e.g., wind) while the vehicle 160 is driving, and direct the channeled airflow into a vent (not visible in top view) of the enclosure 162. The deflector 166 may increase an efficiency or an amount of air flowing into the enclosure. As an example, a vertical height of the deflector 166 above a roof of the vehicle 160 may be constant as the deflector 166 extends away from the enclosure 162. The deflectors 166 may have smooth and/or rounded edges to prevent turbulent flow. The deflector 166 may be comprised of a material such as a plastic, metal, fiberglass, nanomaterial, a shape memory alloy such as copper-aluminum-nickel, nickel-titanium (NiTi), Fe—Mn—Si, Cu—Zn—Al, Cu—Al—Ni, and the like, or other suitable material. The deflector 166 may comprise an air quality sensor (not shown, same or similar to 115, 125) configured to determine an air quality, for example, as an air quality index (AQI). The air quality sensor may determine an attenuation of infrared radiation, and may comprise an infrared radiation source, a light water pipe, and an infrared detector having a filter. Alternatively, the air quality sensor may be disposed elsewhere on the vehicle 160 (e.g., elsewhere on the roof of the vehicle 160).

Figure 1K:
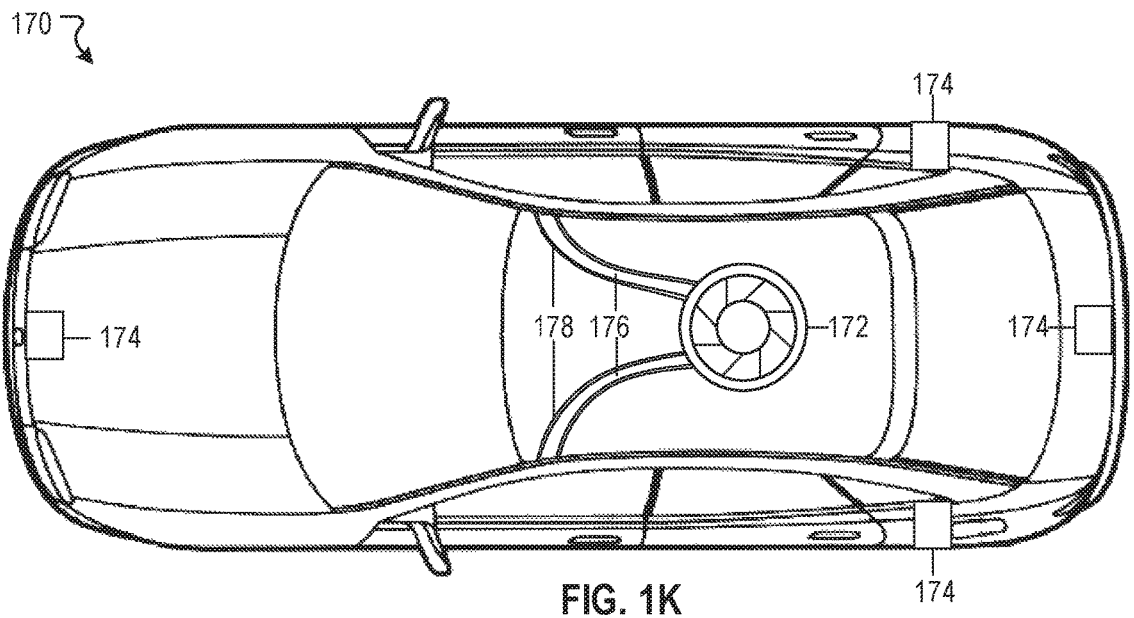
FIG. 1K illustrates an example vehicle (e.g., autonomous vehicle), comprising a heat exchange system (e.g., including an deflector), in a top view, according to an embodiment of the present disclosure.

FIG. 1K illustrates an example vehicle (e.g., autonomous vehicle), comprising a heat exchange system (e.g., including an deflector), in a top view, according to an embodiment of the present disclosure. The example vehicle 170 is shown with an enclosure 172 (e.g., to house one or more sensors), four radar systems 174, an deflector 176, and a groove 178 in which the deflector 176 may snugly fit, and in which the deflector 176 may be controlled (e.g., by a controller in the enclosure 172, as described in FIG. 1P, 2-5) to move up and down. As an example, the deflector 176 may be moved up and down based on a speed of the vehicle 170, an internal temperature of the enclosure 172, an external temperature, a difference between the internal temperature of the enclosure 172 and the external temperature, or a wind speed. As an example, the deflector 176 may be moved up and down based on any one or any combination of the aforementioned factors.

The enclosure 172 can include a LiDAR and one or more camera systems. As discussed, the enclosure 172 can provide an additional protection for the LiDAR and the one or more camera systems against various environmental conditions while still letting in wavelengths of light receptive to the LiDAR and the one or more camera systems. In general, the LiDAR and the one or more camera systems of the enclosure 172 and the four radar systems work the same as the LiDAR, camera systems, and radar systems discussed with respect with FIG. 1A. The enclosure 172 may also include a vent (not shown because hidden from view) similar to vents 119 and 129.

In FIG. 1K, two deflectors 176 are shown. However, the heat exchange system may include any number of deflectors 176. The deflectors 176 may be connected to the enclosure 172. For example, the deflectors 176 may directly contact the enclosure 172. The deflectors 176 may be configured to channel an airflow (e.g., wind) while the vehicle 170 is driving, and direct the channeled airflow into a vent (not visible in top view) of the enclosure 172. The deflector 176 may increase an efficiency or an amount of air flowing into the enclosure. As an example, the deflectors 176 may be curved outward as they extend away from the enclosure 172. The deflectors 116 may also be concave (not shown). The deflectors 176 may have smooth and/or rounded edges to prevent turbulent flow. The deflectors 176 may be comprised of a material such as a plastic, metal, fiberglass, nanomaterial, a shape memory alloy such as copper-aluminum-nickel, nickel-titanium (NiTi), Fe—Mn—Si, Cu—Zn—Al, Cu—Al—Ni, and the like, or other suitable material. The deflectors 176 may comprise an air quality sensor (not shown, same or similar to 115, 125) configured to determine an air quality, for example, as an air quality index (AQI). The air quality sensor may determine an attenuation of infrared radiation, and may comprise an infrared radiation source, a light water pipe, and an infrared detector having a filter. Alternatively, the air quality sensor may be disposed elsewhere on the vehicle 170 (e.g., elsewhere on the roof of the vehicle 170).

Figure 1L:
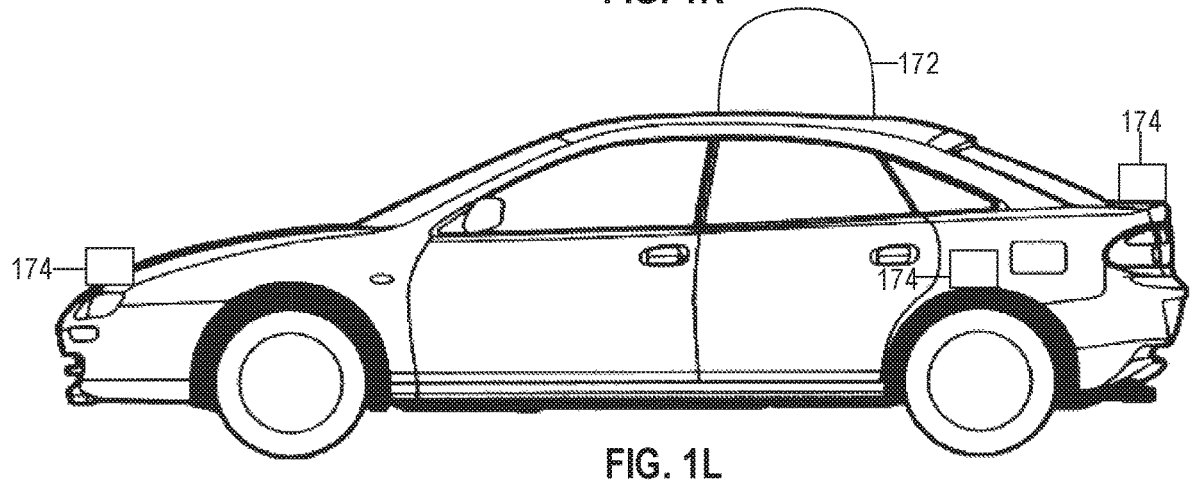
FIG. 1L illustrates an example vehicle (e.g., autonomous vehicle), comprising a heat exchange system (e.g., including an deflector), in a side view, corresponding to FIG. 1K, according to an embodiment of the present disclosure.

FIG. 1L illustrates an example vehicle (e.g., autonomous vehicle), comprising a heat exchange system (e.g., including an deflector), in a side view, corresponding to FIG. 1K, according to an embodiment of the present disclosure. FIG. 1L illustrates an example of an operation of the deflector(s) 176 as referenced in FIG. 1K, being controlled to move up and down. In FIG. 1L, the deflector(s) 176 may be in an inactive mode. During the inactive mode, the deflector(s) 176 may be fully embedded in the groove(s) 178, and the deflector(s) 176 may not extend vertically, above a plane of the vehicle 170 (e.g., a roof of the vehicle 170). Thus, the deflector(s) 176 may be hidden from view, and not be used. For example, during the inactive mode, the controller may determine that no airflow to the enclosure 172 is needed or desired, because no cooling is needed or desired.

Figure 1M:
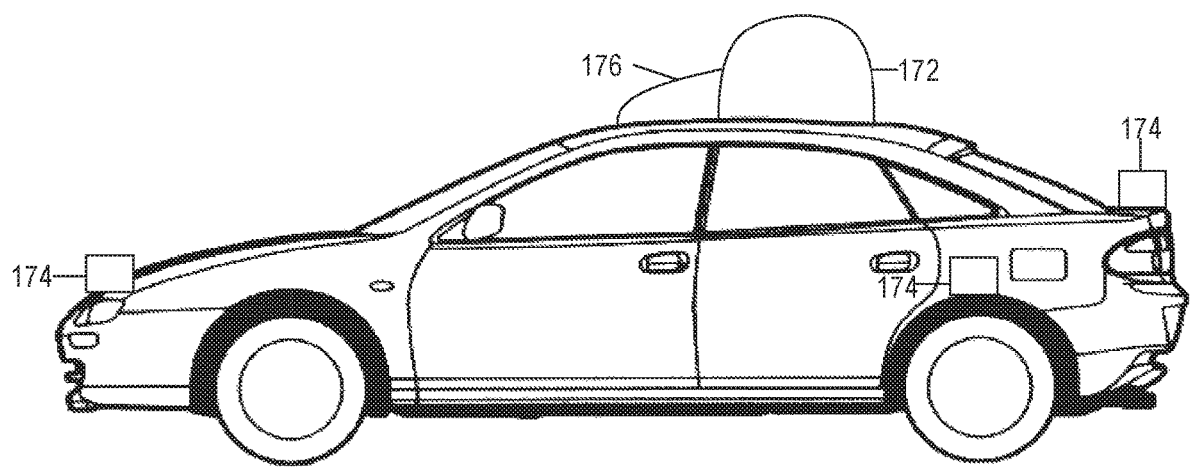
FIG. 1M illustrates an example vehicle (e.g., autonomous vehicle), comprising a heat exchange system (e.g., including an deflector), in a side view, corresponding to FIG. 1K and FIG. 1L, according to an embodiment of the present disclosure.

FIG. 1M illustrates an example vehicle (e.g., autonomous vehicle), comprising a heat exchange system (e.g., including an deflector), in a side view, corresponding to FIG. 1K and FIG. 1L, according to an embodiment of the present disclosure. FIG. 1M illustrates an example of an operation of the deflector(s) 176 as referenced in FIG. 1K. In FIG. 1M, the deflector(s) 176 may be in an active mode. During the active mode, the deflector(s) 176 may be vertically extended above the groove(s) 178, and above a plane of the vehicle 170 (e.g., a roof of the vehicle 170). For example, during the active mode, the controller may determine that airflow to the enclosure 172 is needed or desired.

Figure 1N:
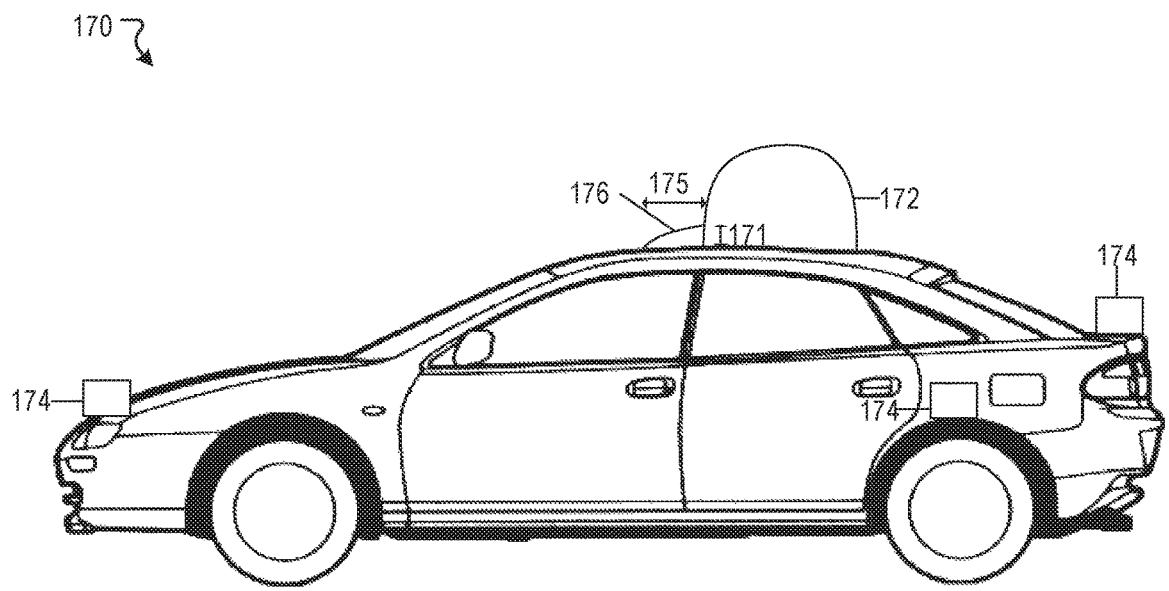
FIG. 1N illustrates an example vehicle (e.g., autonomous vehicle), comprising a heat exchange system (e.g., including an deflector), in a side view, corresponding to FIG. 1K, according to an embodiment of the present disclosure.

FIG. 1N illustrates an example vehicle (e.g., autonomous vehicle), comprising a heat exchange system (e.g., including an deflector), in a side view, corresponding to FIG. 1K, according to an embodiment of the present disclosure. FIG. 1N illustrates an example of an operation of the deflector(s) 176 as referenced in FIG. 1K. In FIG. 1N, the deflector(s) 176 may be in a first mode. During the first mode, the deflector(s) 176 may be vertically extended above the groove(s) 178, and above a plane of the vehicle 170 (e.g., a roof of the vehicle 170), by a first height 171, which is less than a maximum height that the deflector(s) 176 could be extended above the roof of the vehicle 170. For example, the first height may be measured at a highest point of the deflector(s) above the plane of the roof of the vehicle, and the first height may be less than the maximum height (e.g., measured at a highest point of the deflector(s) above the plane of the roof of the vehicle.

Figure 1O:
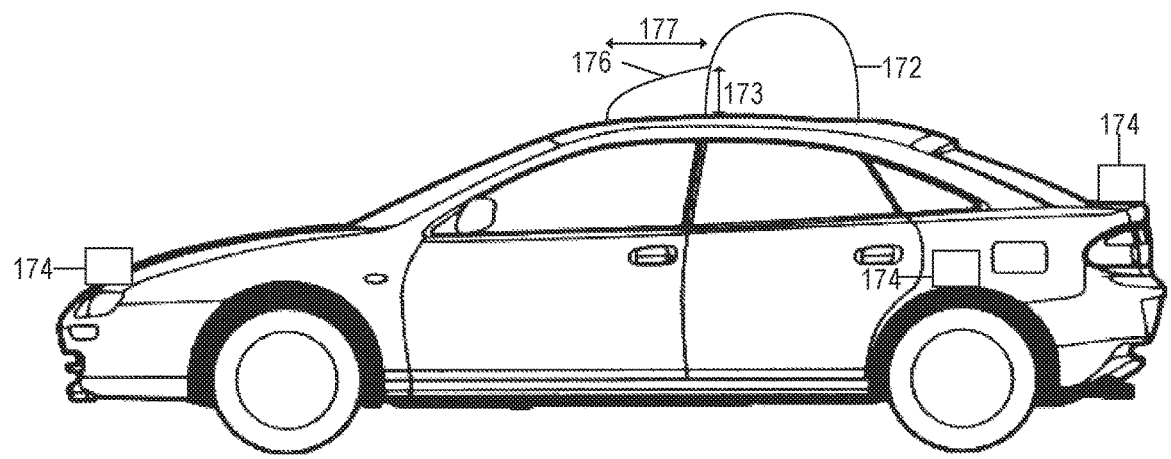
FIG. 1O illustrates an example vehicle (e.g., autonomous vehicle), comprising a heat exchange system (e.g., including an deflector), in a side view, corresponding to FIG. 1K and FIG. 1N, according to an embodiment of the present disclosure.

FIG. 1O illustrates an example vehicle (e.g., autonomous vehicle), comprising a heat exchange system (e.g., including an deflector), in a side view, corresponding to FIG. 1K and FIG. 1N, according to an embodiment of the present disclosure. FIG. 1N illustrates an example of an operation of the deflector(s) 176 as referenced in FIG. 1K. In FIG. 1N, the deflector(s) 176 may be in a second mode. During the second mode, the deflector(s) 176 may be vertically extended above the groove(s) 178, and above a plane of the vehicle 170 (e.g., a roof of the vehicle 170), by a second height 173 which is more than the first height 171 referred to in FIG. 1N. For example, the second height 173 may be measured at a highest point of the deflector(s) above the plane of the roof of the vehicle. In the second mode, a length (e.g., second length 177) of a portion of the deflector(s) 176 that is above the roof of the vehicle 170 may be greater than a length (e.g., first length 175) of a portion of the deflector(s) 176 that is above the roof of the vehicle 170 during the first mode. The deflector(s) 176 may increase an efficiency or an amount of air flowing into the enclosure.

Figure 1P:
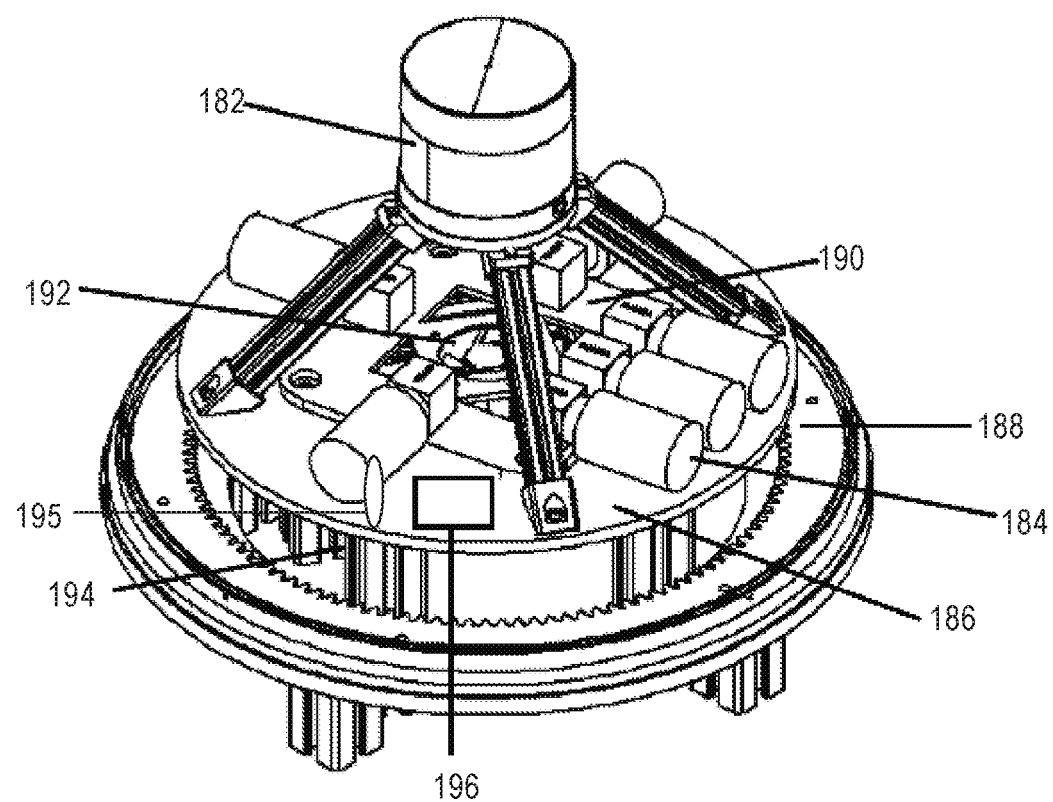
FIG. 1P illustrates an example of a sensor system for a vehicle (e.g., autonomous vehicle), according to an embodiment of the present disclosure.

FIG. 1P illustrates an example of a sensor system 180 in a vehicle such as an autonomous vehicle (e.g., vehicle 100) without an enclosure, for illustrative purposes. The sensor system 180 may determine one or more parameters oft include a LiDAR system 182, a camera system 184, a frame 186, a ring 188, a temperature sensor 190, a fan 192, an air conditioning (AC) vent or cabin vent 194, a pressure sensor 195, and a controller 196. For example, the LiDAR system 182 may be supported on the frame 186. The camera 184 may also be attached (e.g., indirectly or directly) to the frame 186 or a lower base plate of the frame 186 at or near a bottom surface of the sensor system 180. The ring 188 may be disposed underneath the frame 186 or a lower base plate of the frame 186, and may be utilized to anchor an enclosure for the sensor system 180. The frame 186 may also include struts, a stand or tripod. The ring 188 may be metallic, as an example. The temperature sensor 190 may be a thermostat or a thermometer, and may be attached directly or indirectly to the frame 186. The fan 192 may be a DC fan, and may be attached directly or indirectly to the frame 186. The AC vent or cabin vent 194 may selectively pass cool air to the LiDAR system 182, the camera system 184, the bottom surface 186, the temperature sensor 190, the fan 192, and/or the controller 196. The pressure sensor 195 may determine an internal air pressure of the enclosure.

The controller 196 may control the operations of one or more of, or all of, the LiDAR system 182, the camera system 184, the temperature sensor 190, the fan 192, the AC vent 194, and an deflector (e.g., any of deflectors 116, 126, 136, 146, 156, 166, 176).

For example, the controller 196 may regulate a vertical height of an deflector or deflectors based on a speed of the vehicle, a temperature (e.g., internal temperature) measured by the temperature sensor 190, an external temperature, a difference between the temperature measured by the temperature sensor 190 and the external temperature, or a wind speed. As an example, the controller 196 may regulate the vertical height of the deflector(s) to increase with the difference between the external and internal temperatures. For example, the vertical height of the deflector(s) may vary linearly based on the difference between the external and internal temperatures. As another example, the vertical height of the deflector(s) may vary based on whether the internal temperature exceeds a threshold temperature. If the internal temperature exceeds the threshold temperature, the vertical height of the deflector(s) may vary linearly with how much the internal temperature exceeds the threshold temperature. As another example, the vertical height of the deflector(s) may be regulated to increased linearly with the wind speed. The vertical height of the deflector(s) may be regulated by the controller 196 in iterations. In a first iteration, the vertical height of the deflector(s) may be adjusted or regulated linearly based on the difference between the external and internal temperatures. Next, the vertical height of the deflector(s) may be adjusted or regulated linearly based on how much the internal temperature exceeds the threshold temperature. Next, the vertical height of the deflector(s) may be adjusted or regulated linearly based on the wind speed.

The controller 196 may further regulate the vertical height of the deflector(s) based on one or any combination of predicted future conditions, such as anticipated speed, anticipated external temperature, or anticipated internal temperature of the enclosure 200. For example, if the controller 196 predicts, based on a navigation route selected, or weather forecast, that the temperature at a destination is high, the controller may preemptively increase the vertical height of the deflector(s). As another example, if the controller 196 predicts that the LiDAR system 182 or the camera system 184 will be heavily used in a near future, the controller may preemptively increase the vertical height of the deflector(s). As another example, if the controller 196 predicts that the vehicle speed will increase based on a type of road (e.g., highway), traffic conditions, road conditions, and/or amount of battery/gasoline remaining, the controller may preemptively increase the vertical height of the deflector(s).

The controller 196 may regulate a rotation speed of the fan 192 based on the vertical height of the deflector(s). For example, the controller 196 may regulate the rotation speed of the fan 192 to increase as the vertical height of the deflector(s) increases. For example, the increase of the rotation speed of the fan 192 may be linear with respect to the increase in the vertical height of the deflector(s). The controller 196 may also regulate the rotation speed of the fan 192 based on a speed of the vehicle, a temperature measured by the temperature sensor 190, an external temperature, or a difference between the temperature measured by the temperature sensor 190 and the external temperature, and operate the fan 192 at the regulated rotation speed. For example, the controller 196 may regulate a rotation speed of the fan 192 based on a speed of the vehicle, a temperature measured by the temperature sensor 190, an external temperature, or a difference between the temperature measured by the temperature sensor 190 and the external temperature, and operate the fan 192 at the regulated rotation speed. For example, the controller 196 may regulate the rotation speed of the fan 192 to be linearly based on the difference between the external and internal temperatures. As another example, the controller 196 may regulate the rotation speed of the fan 192 based on whether the internal temperature exceeds a threshold temperature. If the internal temperature exceeds the threshold temperature, the rotation speed of the fan 192 may vary linearly with how much the internal temperature exceeds the threshold temperature. The rotation speed of the fan 192 may be regulated by the controller 196 in iterations.

In a first iteration, the rotation speed of the fan 192 may be adjusted or regulated linearly based on the difference between the external and internal temperatures. Next, the rotation speed of the fan 192 may be adjusted or regulated linearly based on how much the internal temperature exceeds the threshold temperature. Next, the rotation speed of the fan 192 may be adjusted or regulated (e.g., linearly) based on the speed of the vehicle.

Furthermore, the controller 196 may, in addition to, or instead of, regulating the rotation speed of the fan 192, regulate an amount of air entering from the AC vent 194, for example, depending or based on how much cooling is required for one or more of the sensors of the sensor system 180. For example, the controller 196 may regulate the amount of air entering into the AC vent 194 based on one or more of, or any combination of, the speed of the autonomous vehicle, the temperature measured by the temperature sensor 190, the external temperature, the difference between the temperature measured by the temperature sensor 190 and the external temperature, or based on an internal temperature of the LiDAR system 182 or the cameras 184 (which may indicate how heavily the LiDAR system 182 or the cameras 184 are being used). For example, the controller 196 may regulate the amount of air entering into the AC vent 194 by adjusting a size of an opening of the AC vent 194 (e.g., a radius of the opening of the AC vent 194), or by regulating an amount of cool air extracted into the AC vent 194. In another embodiment, the controller 196 may regulate an amount of air entering from the AC vent 194 based on the rotation speed of the fan 192. For example, in one embodiment, if the rotation speed of the fan 192 is increased, the controller 196 may reduce the amount of air entering into the AC vent 194 because adequate cooling of the sensor system 180 may already be provided by the fan 192. In one embodiment, the controller 196 may select between using the fan 192 and the AC vent 194 to cool the sensor system 180, based on which method is more energy efficient. On the other hand, if the operation of the fan 192 at high rotation speed itself generates heat internally for the fan 192, the controller 196 may increase the amount of air entering into the AC vent 196 to provide cooling for the fan 192. Thus, the controller 196 may increase the amount of air entering into the AC vent 194 as the rotation speed of the fan 192 is increased.

Figure 2:
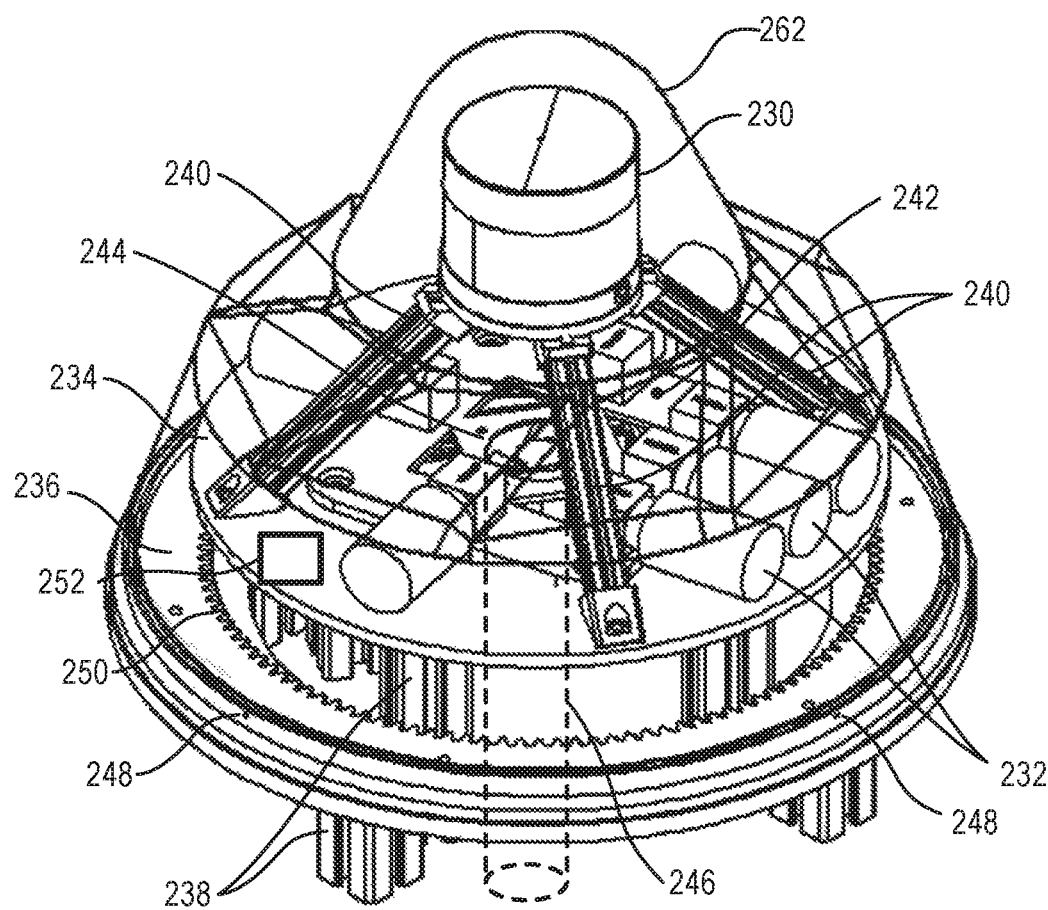
FIG. 2 illustrates an example of an enclosure for a sensor system according to some embodiments.

FIG. 2 illustrates an example of an enclosure 200 for a sensor system (e.g. sensor system 180), according to an embodiment of the present disclosure. In some embodiments, features of the sensor system 180 of FIG. 1P can be implemented as part of the enclosure 200 of FIG. 2. The sensor system may be configured to determine a parameter of the enclosure 200 or the vehicle (e.g., vehicle 100). For example, the controller 196 can be implemented as part of the enclosure 200 of FIG. 2. Deflector(s) (e.g., 116, 126, 136, 146, 156, 166, 176) may be positioned outside the enclosure 200. FIG. 2 may include a cover 262 to encase a sensor system, which may include LiDAR sensor 230 and cameras 232. For example, the cover 262 may be detachable or removable to allow easy access to the sensor system. In some embodiments, the cover 262 may rotate circularly, or in three hundred sixty degrees, relative to the sensor system about a central vertical axis of the cover 262. In some embodiments, the cover 262 may have a profile or shape that has a low wind resistance or coefficient of drag, and thereby reducing negative impacts to fuel economy of the vehicle. For example, the cover 262 may have a smooth surface so that a boundary layer formed between the air and the cover 262 would be laminar rather than turbulent. For example, the cover 262 may have a sleek angular profile. In some embodiments, the outer contour of the cover 262 can have multiple distinct sections (e.g., portions, regions, etc.) with different shapes. For example, a top portion of the cover 262 may have a circular dome shape with a first diameter measured at a base of the top portion and may encase the LiDAR sensor 230 of the autonomous vehicle. A middle portion of the cover 262 directly below the top portion may have a trapezoidal or truncated cone shape with a second diameter measured at a base on the middle portion, and the second diameter may be larger than the first diameter. A lower portion of the cover 262 directly below the middle portion may have a trapezoidal or truncated cone shape with a third diameter measured at a base on the lower portion. The third diameter may be larger than the second diameter. In other embodiments, the cover 262 may be entirely comprised of a single shape, such as a circular dome shape, a trapezoidal or truncated cone shape.

The cover 262 may be made from any suitable material that allows the one or more sensors of the enclosure 200 to properly function while shielding the one or more sensors from environmental elements (e.g., rain, snow, moisture, wind, dust, radiation, oxidation, etc.). Further, the suitable material may be transparent to wavelengths of light or electro-magnetic waves receptive to the LiDAR sensor 230 and the plurality of cameras 232. For example, for the LiDAR sensor 230 to properly operate, the cover 262 should allow laser pulses emitted from the LiDAR sensor 230 to pass through the cover 262 to reach a target and then reflect back through the cover 262 and back to the LiDAR sensor 230. Similarly, for the plurality of cameras 232 to properly operate, the cover 262 should allow visible light to enter. In addition to being transparent to wavelengths of light, the suitable material should also be able to withstand potential impacts from roadside debris without causing damages to the LiDAR sensor 230 or the plurality of cameras 232. In an implementation, the cover 262 can be made of acrylic glass (e.g., Cylux, Plexiglas, Acrylite, Lucite, Perspex, etc.). In another implementation, the cover 262 can be made of strengthen glass (e.g., Coring® Gorilla® glass). In yet another implementation, the cover 262 can be made of laminated safety glass held in place by layers of polyvinyl butyral (PVB), ethylene-vinyl acetate (EVA), or other similar chemical compounds. Many implementations are possible and contemplated.

In some embodiments, the cover 262 can be tinted with a thin-film neural filter to reduce transmittance of light entering the cover 262. For example, in an embodiment, a lower portion of the cover 262 can be selectively tinted with the thin-film neutral filter to reduce an intensity of visible light seen by the plurality of cameras 232. In this example, transmittance of laser pulses emitted from the LiDAR sensor 230 is not be affected by the tint because only the lower portion of the cover 262 is tinted. In another embodiment, the lower portion of the cover 262 can be tinted with a thin-film graduated neural filter in which the transmittance of visible light can vary along an axis. In yet another embodiment, the whole cover 262 can be treated or coated with a reflective coating such that the components of the enclosure 200 is not visible from an outside vantage point while still being transparent to wavelengths of light receptive to the LiDAR sensor 230 and the plurality of cameras 232. Many variations, such as adding a polarization layer or an anti-reflective layer, are possible and contemplated.

In some embodiments, the enclosure 200 may comprise a frame 234, a ring 236, and a plurality of anchoring posts 238. The frame 234 provides mechanical support for the LiDAR sensor 230 and the plurality of cameras 232. The ring 236 provides mounting points for the cover 262 such that the cover 262 encases and protects the sensor system from environmental elements. The plurality of anchoring posts 238 provides mechanical couplings to secure or mount the enclosure 200 to the autonomous vehicle.

In some embodiments, the frame 234 may have two base plates held in place by struts 240. An upper base plate of the frame 234 may provide a mounting surface for the LiDAR sensor 230 while a lower base plate of the frame 234 may provide a mounting surface for the plurality of cameras 232. In general, any number of LiDAR sensors 230 and cameras 232 may be mounted to the frame 234. The frame 234 is not limited to having one LiDAR sensor and six cameras as shown in FIG. 2. For example, in an embodiment, the frame 234 can have more than two base plates held in place by the struts 240. In this example, the frame 234 may have three base plates with upper two base plates reserved for two LiDAR sensors 230 and a lower base plate for six cameras 232. In another embodiment, the lower base plate can have more than six cameras 232. For instance, there can be three cameras pointed in a forward direction of an autonomous vehicle, two cameras pointed to in a right and a left direction of the autonomous vehicle, and two cameras pointed in a reverse direction of the autonomous vehicle. Many variations are possible.

The frame 234 may include a temperature sensor 242, a fan 244, an air conditioning (AC) vent or cabin vent 246, and a pressure sensor 255. The temperature sensor 242 may be configured to measure a temperature inside of the enclosure 200. In general, the temperature sensor 242 can be placed anywhere on the frame 234 that is representative of the temperature of the enclosure 200. In a typical implementation, the temperature sensor 242 is placed in a region in which heat generated by the LiDAR sensor 230 and the plurality of cameras 232 are most localized. In the example of FIG. 2, the temperature sensor 242 is placed on the lower base plate of the frame 234, right behind the three front cameras. In some embodiments, the frame 234 comprises multiple temperature sensors, one for each sensor, for example, so that each sensor temperature may be determined independently, and each sensor may be selectively cooled without affecting other sensors. The fan 244 may be configured to draw an inlet airflow from an external source. The fan 244, in various implementations, works in conjunction with the temperature sensor 242 to maintain a steady temperature condition inside the enclosure 200. The fan 244 can vary its rotation speed depending on the temperature of the enclosure 200. For example, when the enclosure temperature is high, as measured by the temperature sensor 242, the fan 244 may increase its rotation speed to draw additional volume of air to lower the temperature of the enclosure 200 and thus cooling the sensors. Similarly, when the temperature of the enclosure 200 is low, the fan 244 does not need to operate as fast. The fan 244 may be located centrally on the lower base plate of the frame 234. The AC vent or cabin vent 246 may be a duct, tube, or a conduit that conveys cooling air into the enclosure 200. In an embodiment, the AC vent or cabin vent 246 may be connected to a cabin of the autonomous vehicle. In another embodiment, the AC vent or cabin vent 246 may be connected to a separate air conditioner unit that provides cooling air separate from the cabin of the autonomous vehicle. The AC vent or cabin vent 246 may be directly connected to the enclosure 200 at a surface of the frame 234. The pressure sensor 255 may be configured to determine an internal air pressure of the enclosure 200.

In some embodiments, the frame 234 can also include a powertrain. The powertrain is an electric motor coupled to a drivetrain comprising one or more gears. The powertrain can rotate the ring 236 clockwise or counterclockwise. In various embodiments, the electric motor can be a direct current brush or brushless motor, or an alternate current synchronous or asynchronous motor. Many variations are possible. In various embodiments, the one or more gears of the drivetrain can be configured to have various gear ratios designed to provide various amounts of torque delivery and rotational speed.

In general, the frame 234 can be made from any suitable materials that can withstand extreme temperature swings and weather various environmental conditions (e.g., rain, snow, corrosion, oxidation, etc.). The frame 234 can be fabricated using various metal alloys (e.g., aluminum alloys, steel alloys, etc.). The frame 234 can also be fabricated with three dimensional printers using thermoplastics (e.g., polylactic acid, acrylonitrile butadiene styrene, polyamide, high impact polystyrene, thermoplastic elastomer, etc.). Similarly, the air duct 246 can be made from rigid materials (e.g., hard plastics, polyurethane, metal alloys, etc.) or semi-rigid materials (e.g., rubber, silicone, etc.). Many variations are possible.

The ring 236 can provide mounting points for the cover 262 to encase the internal structure 204 of the enclosure 200. In the example of FIG. 2, the ring 236 has an outer portion that includes attaching points 248 through which the cover 262 can be attached and secured. The ring 236 also has an inner portion that comprises gear teeth 250 (or cogs) such that when the gear teeth 250 is driven by the powertrain of the frame 234, the whole ring 236 rotates as a result.

Similar to the frame 234, the ring 236 can be made from any suitable material that can withstand extreme temperature swings and weather various environmental conditions. However, in most implementations, the suitable material for the ring 236 must be somewhat more durable than the material used for the frame 234. This is because the gear teeth 250 of the ring 236 are subject to more wear and tear from being coupled to the powertrain of the frame 234. The ring 236 can be fabricated using various metal alloys (e.g., carbon steel, alloy steel, etc.). The ring 236 can also be fabricated with three dimensional printers using thermoplastics (e.g., polylactic acid, acrylonitrile butadiene styrene, polyamide, high impact polystyrene, thermoplastic elastomer, etc.).

The plurality of the anchoring posts 238 can provide mechanical couplings to secure or mount the enclosure 200 to an autonomous vehicle. In general, any number of anchoring posts 238 may be used. In the example of FIG. 2, the enclosure 200 is shown with eight anchoring posts: four anchoring posts to secure the frame 234 to the autonomous vehicle and four anchoring posts to secure the ring 236 to the autonomous vehicle. Similar to the frame 234 and the ring 236, the plurality of the anchoring posts 238 can be made from any suitable materials and fabricated using metal alloys (e.g., carbon steel, alloy steel, etc.) or three dimensional printed with thermoplastics (e.g., polylactic acid, acrylonitrile butadiene styrene, polyamide, high impact polystyrene, thermoplastic elastomer, etc.).

A controller 252 may be disposed on the frame 234, the upper base plate of the frame 234, or the lower base plate of the frame 234. The controller 252 may control the operations of one of more of the LiDAR sensor 230, the cameras 232, the temperature sensor 242, the fan 244, and/or the AC vent or cabin vent 246. As discussed above, with reference to FIG. 1P, the controller 252 may regulate a height of deflector(s) outside the enclosure 200 based on a speed of the vehicle, a temperature measured by the temperature sensor 242, an external temperature, a difference between the temperature measured by the temperature sensor 242 and the external temperature, or a wind speed.

For example, the controller 252 may regulate a rotation speed of the fan 244 based on the speed of the vehicle, the temperature measured by the temperature sensor 242, the external temperature, or the difference between the temperature measured by the temperature sensor 242 and the external temperature, and operate the fan 244 at the regulated rotation speed. For example, the controller 252 may regulate a rotation speed of the fan 244 based on any combination of the aforementioned factors. As an example, the controller 252 may regulate a rotation speed of the fan 244 based on whether the access from the enclosure 200 to the AC vent or cabin vent 246 is turned on. For example, the controller 252 may increase or decrease a rotation speed of the fan 244 if the access from the enclosure 200 to the AC vent or cabin vent 246 is turned off (e.g., no air flows from the AC vent or cabin vent 246 to the enclosure 200). For example, the controller 252 may increase or decrease a rotation speed of the fan 244 if the access from the enclosure 200 if the access from the enclosure 200 to the AC vent or cabin vent 246 is turned on. Furthermore, the controller 252 may, in addition to, or instead of, regulating the rotation speed of the fan 244, regulate an amount of air entering from the AC vent or cabin vent 246, for example, depending or based on how much cooling is required for one or more of the sensors of the enclosure 200. For example, the controller 252 may regulate the amount of air entering into the AC vent or cabin vent 246 based on one or more of, or any combination of, the speed of the autonomous vehicle, the temperature measured by the temperature sensor 242, the external temperature, the difference between the temperature measured by the temperature sensor 242 and the external temperature, or based on an internal temperature of the LiDAR sensor 230 or the cameras 232 (which may indicate how heavily the LiDAR sensor 230 or the cameras 232 are being used). For example, the controller 252 may regulate the amount of air entering into the AC vent or cabin vent 246 by adjusting a size of an opening of the AC vent or cabin vent 246 (e.g., a radius of the opening of the AC vent or cabin vent 246, or by regulating an amount of air extracted into the AC vent or cabin vent 246. In another embodiment, the controller 252 may regulate an amount of air entering from the AC vent or cabin vent 246 based on the rotation speed of the fan 244. For example, in one embodiment, if the rotation speed of the fan 244 is increased, the controller 252 may reduce the amount of air entering into the AC vent or cabin vent 246 because adequate cooling of the enclosure 200 may already be provided by the fan 244. In one embodiment, the controller 252 may select between using the fan 244 and the AC vent or cabin vent 246 to cool the enclosure 200. For example, the controller 252 may select between using the fan 244 and the AC vent or cabin vent 246 to cool the enclosure 200 based on which method is more energy efficient. In one embodiment, the controller 252 may select using the fan 244 when an amount of cooling to be provided (e.g. which may correspond to the temperature measured by temperature sensor 242) is lower than a threshold (e.g., first threshold) and using the AC vent or cabin vent 246 when the amount of cooling to be provided is greater than the threshold (e.g., first threshold). On the other hand, if the operation of the fan 244 at high rotation speed itself generates heat internally for the fan 244, the controller 252 may increase the amount of air entering into the AC vent or cabin vent 246, or allow air to pass through the AC vent or cabin vent 246 (if no air previously was passing through) to provide cooling for the fan 244. Thus, the controller 252 may increase the amount of air entering into the AC vent or cabin vent 246 as the rotation speed of the fan 244 is increased.

The controller 252 may further be configured to turn on or turn off access from the AC vent or cabin vent 246 to the enclosure 200 based on the temperature of the enclosure 200 measured by the temperature sensor 242 or the internal air pressure of the enclosure 200 measured by the pressure sensor 255. For example, an increase in the internal temperature of the enclosure 200 may result in changes in internal air pressure of a portion of the enclosure 200 because warmer air rises. To compensate for changes in the temperature and/or pressure inside the enclosure 200, the AC vent or cabin vent 246 may be turned on to allow AC air or cabin air to flow into the AC vent or cabin vent 246. Furthermore, the controller 252 may be configured to increase or decrease an amount of AC air or cabin air going into the enclosure 200, for example, by increasing or decreasing a size of the AC vent or cabin vent 246. In another embodiment, the controller 252 may be configured to increase or decrease an amount of AC air or cabin air, for example, based on a gradient of temperature inside the enclosure 200 or a gradient of pressure inside the enclosure 200. As an example, if a gradient of temperature inside the enclosure 200 exceeds a threshold (e.g., second threshold), the controller 252 may be configured to increase or decrease an amount of AC air or cabin air. As an example, if a gradient of pressure inside the enclosure 200 exceeds a threshold (e.g., third threshold), the controller 252 may be configured to increase or decrease an amount of AC air or cabin air.

The controller 252 may further adjust a rotation speed of the fan 244, and/or an amount of air entering the AC vent or cabin vent 246, based on one or any combination of predicted future conditions, such as anticipated speed, anticipated external temperature, or anticipated internal temperature of the enclosure 200. For example, if the controller 252 predicts, based on a navigation route selected, or weather forecast, that the temperature at a destination is high, the controller may preemptively precool the enclosure 200 by increasing the rotation speed of the fan 244 or increasing the amount of air entering the AC vent or cabin vent 246. As another example, if the controller 252 predicts that the LiDAR sensor 230 or the cameras 232 will be heavily used in a near future, the controller may preemptively precool the enclosure 200 by increasing the rotation speed of the fan 244 or increasing the amount of air entering the AC vent or cabin vent 246. As another example, if the controller 252 predicts that the vehicle speed will increase based on a type of road (e.g., highway), traffic conditions, road conditions, and/or amount of battery/gasoline remaining, the controller may preemptively precool the enclosure 200 by increasing the rotation speed of the fan 244 or increasing the amount of air entering the AC vent or cabin vent 246.

Figure 3:
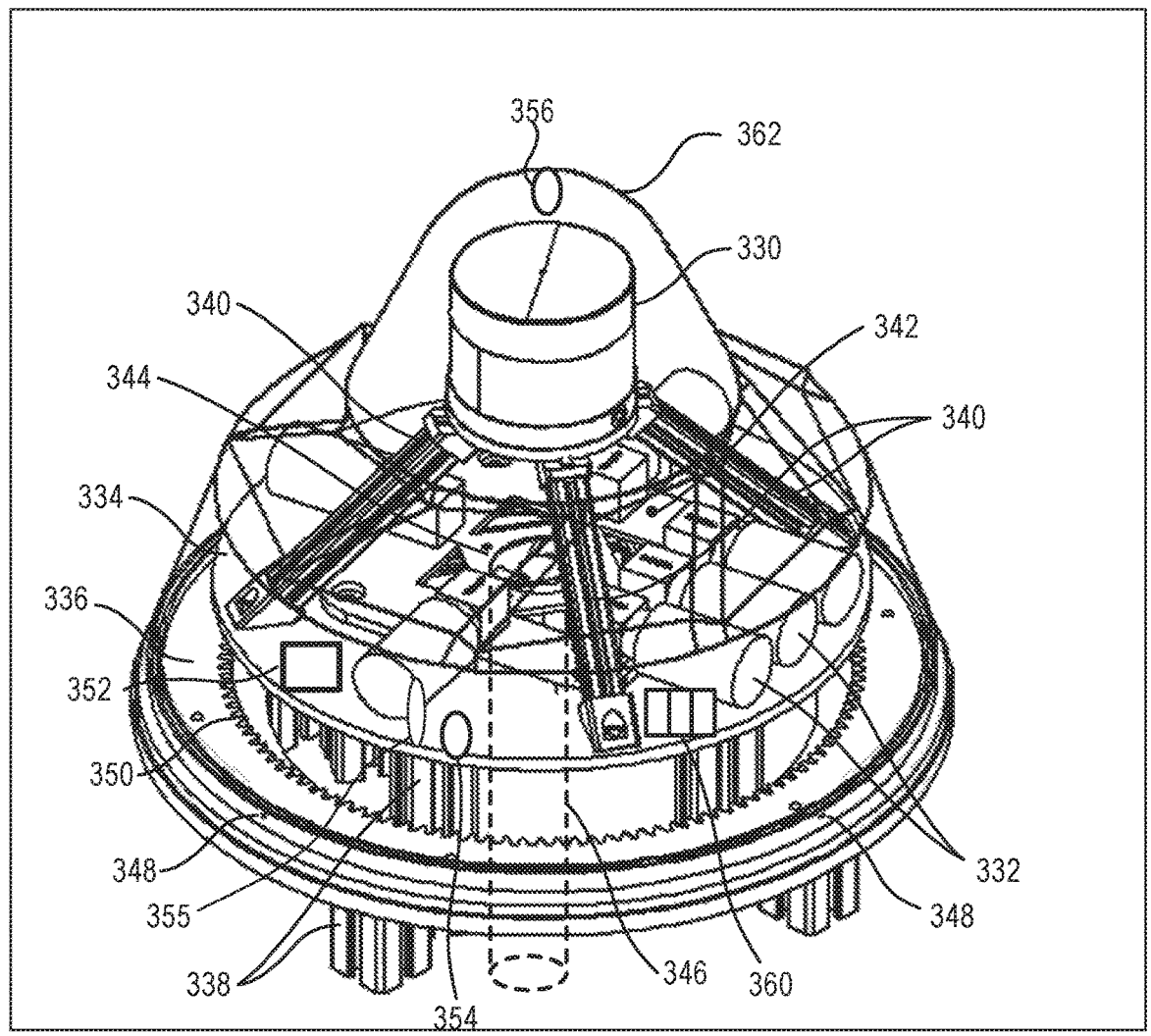
FIG. 3 illustrates an example of an enclosure for a sensor system according to some embodiments.

FIG. 3 illustrates an example of an enclosure 300 for a sensor system (e.g. sensor system 180), according to an embodiment of the present disclosure. In some embodiments, features of the sensor system 180 of FIG. 1P can be implemented as part of the enclosure 300 of FIG. 3. The sensor system may be configured to determine a parameter of the enclosure 300 or the vehicle (e.g., vehicle 100). For example, the controller 196 can be implemented as part of the enclosure 300 of FIG. 3. FIG. 3 may include a cover 362 to encase a sensor system, which may include LiDAR sensor 330 and cameras 332. For example, the cover 362 may be detachable or removable to allow easy access to the sensor system. In some embodiments, the cover 362 can rotate circularly, or in three hundred sixty degrees, relative to the sensor system about a central vertical axis of the cover 362. In some embodiments, the cover 362 may have a profile or shape that has a low wind resistance or coefficient of drag, and thereby reducing negative impacts to fuel economy of the autonomous vehicle. For example, the cover 362 may have a smooth surface so that a boundary layer formed between the air and the cover 362 would be laminar rather than turbulent. For example, the cover 362 may have a sleek angular profile. In some embodiments, the outer contour of the cover 362 can have multiple distinct sections (e.g., portions, regions, etc.) with different shapes. For example, a top portion of the cover 362 may have a circular dome shape with a first diameter measured at a base of the top portion and may encase the LiDAR sensor 330 of the autonomous vehicle. A middle portion of the cover 362 directly below the top portion may have a trapezoidal or truncated cone shape with a second diameter measured at a base on the middle portion, and the second diameter may be larger than the first diameter. A lower portion of the cover 362 directly below the middle portion may have a trapezoidal or truncated cone shape with a third diameter measured at a base on the lower portion. The third diameter may be larger than the second diameter. In other embodiments, the cover 362 may be entirely comprised of a single shape, such as a circular dome shape, a trapezoidal or truncated cone shape.

The cover 362 may be made from any suitable material that allows the one or more sensors of the enclosure 300 to properly function while shielding the one or more sensors from environmental elements (e.g., rain, snow, moisture, wind, dust, radiation, oxidation, etc.). Further, the suitable material must be transparent to wavelengths of light or electro-magnetic waves receptive to the LiDAR sensor 330 and the plurality of cameras 332. For example, for the LiDAR sensor 330 to properly operate, the cover 362 must allow laser pulses emitted from the LiDAR sensor 330 to pass through the cover 362 to reach a target and then reflect back through the cover 362 and back to the LiDAR sensor 330. Similarly, for the plurality of cameras 332 to properly operate, the cover 362 must allow visible light to enter. In addition to being transparent to wavelengths of light, the suitable material must also be able to withstand potential impacts from roadside debris without causing damages to the LiDAR sensor 330 or the plurality of cameras 332. In an implementation, the cover 362 can be made of acrylic glass (e.g., Cylux, Plexiglas, Acrylite, Lucite, Perspex, etc.). In another implementation, the cover 362 can be made of strengthen glass (e.g., Coring® Gorilla® glass). In yet another implementation, the cover 362 can be made of laminated safety glass held in place by layers of polyvinyl butyral (PVB), ethylene-vinyl acetate (EVA), or other similar chemical compounds. Many implementations are possible and contemplated.

In some embodiments, the cover 362 can be tinted with a thin-film neural filter to reduce transmittance of light entering the cover 362. For example, in an embodiment, a lower portion of the cover 362 can be selectively tinted with the thin-film neutral filter to reduce an intensity of visible light seen by the plurality of cameras 332. In this example, transmittance of laser pulses emitted from the LiDAR sensor 330 is not be affected by the tint because only the lower portion of the cover 342 is tinted. In another embodiment, the lower portion of the cover 362 can be tinted with a thin-film graduated neural filter in which the transmittance of visible light can vary along an axis. In yet another embodiment, the whole cover 362 can be treated or coated with a reflective coating such that the components of the enclosure 300 is not visible from an outside vantage point while still being transparent to wavelengths of light receptive to the LiDAR sensor 330 and the plurality of cameras 332. Many variations, such as adding a polarization layer or an anti-reflective layer, are possible and contemplated.

In some embodiments, the enclosure 300 may comprise a frame 334, a ring 336, and a plurality of anchoring posts 338. The frame 334 provides mechanical support for the LiDAR sensor 330 and the plurality of cameras 332. The ring 336 provides mounting points for the cover 362 such that the cover 362 encases and protects the sensor system from environmental elements. The plurality of anchoring posts 338 provides mechanical couplings to secure or mount the enclosure 300 to the autonomous vehicle.

In some embodiments, the frame 334 may have two base plates held in place by struts 340. An upper base plate of the frame 334 may provide a mounting surface for the LiDAR sensor 330 while a lower base plate of the frame 334 may provide a mounting surface for the plurality of cameras 332. In general, any number of LiDAR sensors 330 and cameras 332 may be mounted to the frame 334. The frame 334 is not limited to having one LiDAR sensor and six cameras as shown in FIG. 3. For example, in an embodiment, the frame 334 can have more than two base plates held in place by the struts 340. In this example, the frame 334 may have three base plates with upper two base plates reserved for two LiDAR sensors 330 and a lower base plate for six cameras 332. In another embodiment, the lower base plate can have more than six cameras 332. For instance, there can be three cameras pointed in a forward direction of an autonomous vehicle, two cameras pointed to in a right and a left direction of the autonomous vehicle, and two cameras pointed in a reverse direction of the autonomous vehicle. Many variations are possible.

The frame 334 may include a temperature sensor 342, a fan 344, an air conditioning (AC) vent or cabin vent 346, and a pressure sensor 355. The temperature sensor 342 can be configured to measure a temperature of the enclosure 300. In general, the temperature sensor 342 can be placed anywhere on the frame 334 that is representative of the enclosure temperature. In a typical implementation, the temperature sensor 342 is placed in a region in which heat generated by the LiDAR sensor 330 and the plurality of cameras 332 are most localized. In the example of FIG. 3, the temperature sensor 342 is placed on the lower base plate of the frame 334, right behind the three front cameras. The fan 344 can be configured to draw an inlet airflow from an external source. The fan 344, in various implementations, works in conjunction with the temperature sensor 342 to maintain a steady temperature condition inside the enclosure 300. The fan 344 can vary its rotation speed depending on the enclosure temperature. For example, when the enclosure temperature is high, as measured by the temperature sensor 342, the fan 344 may increase its rotation speed to draw additional volume of air to lower the temperature of the enclosure 300 and thus cooling the sensors. Similarly, when the temperature of the enclosure 300 is low, the fan 344 does not need to operate as fast. The fan 344 may be located centrally on the lower base plate of the frame 334. The AC vent or cabin vent 346 may be a duct, tube, or a conduit that conveys cooling air into the enclosure 300. In an embodiment, the AC vent or cabin vent 346 may be connected to a cabin of the autonomous vehicle. In another embodiment, the AC vent or cabin vent 346 may be connected to a separate air conditioner unit that provides cooling air separate from the cabin of the autonomous vehicle. The AC vent or cabin vent 346 may be directly connected to the enclosure 300 at a surface of the frame 334. The pressure sensor 355 may be configured to determine an internal air pressure of the enclosure 300.

In some embodiments, the frame 334 can also include a powertrain. The powertrain is an electric motor coupled to a drivetrain comprising one or more gears. The powertrain can rotate the ring 336 clockwise or counter-clockwise. In various embodiments, the electric motor can be a direct current brush or brushless motor, or an alternate current synchronous or asynchronous motor. Many variations are possible. In various embodiments, the one or more gears of the drivetrain can be configured to have various gear ratios designed to provide various amounts of torque delivery and rotational speed.

In general, the frame 334 can be made from any suitable materials that can withstand extreme temperature swings and weather various environmental conditions (e.g., rain, snow, corrosion, oxidation, etc.). The frame 334 can be fabricated using various metal alloys (e.g., aluminum alloys, steel alloys, etc.). The frame 334 can also be fabricated with three dimensional printers using thermoplastics (e.g., polylactic acid, acrylonitrile butadiene styrene, polyamide, high impact polystyrene, thermoplastic elastomer, etc.). Similarly, the air duct 346 can be made from rigid materials (e.g., hard plastics, polyurethane, metal alloys, etc.) or semi-rigid materials (e.g., rubber, silicone, etc.). Many variations are possible.

The ring 336 can provide mounting points for the cover 362 to encase the internal structure 304 of the enclosure 300. In the example of FIG. 3, the ring 336 has an outer portion that includes attaching points 348 through which the cover 362 can be attached and secured. The ring 336 also has an inner portion that comprises gear teeth 350 (or cogs) such that when the gear teeth 350 is driven by the powertrain of the frame 334, the whole ring 336 rotates as a result.

Similar to the frame 334, the ring 336 can be made from any suitable material that can withstand extreme temperature swings and weather various environmental conditions. However, in most implementations, the suitable material for the ring 336 must be somewhat more durable than the material used for the frame 334. This is because the gear teeth 350 of the ring 336 are subject to more wear and tear from being coupled to the powertrain of the frame 334. The ring 336 can be fabricated using various metal alloys (e.g., carbon steel, alloy steel, etc.). The ring 336 can also be fabricated with three dimensional printers using thermoplastics (e.g., polylactic acid, acrylonitrile butadiene styrene, polyamide, high impact polystyrene, thermoplastic elastomer, etc.).

The plurality of the anchoring posts 338 can provide mechanical couplings to secure or mount the enclosure 300 to an autonomous vehicle. In general, any number of anchoring posts 338 may be used. In the example of FIG. 3, the enclosure 300 is shown with eight anchoring posts: four anchoring posts to secure the frame 334 to the autonomous vehicle and four anchoring posts to secure the ring 336 to the autonomous vehicle. Similar to the frame 334 and the ring 336, the plurality of the anchoring posts 338 can be made from any suitable materials and fabricated using metal alloys (e.g., carbon steel, alloy steel, etc.) or three dimensional printed with thermoplastics (e.g., polylactic acid, acrylonitrile butadiene styrene, polyamide, high impact polystyrene, thermoplastic elastomer, etc.).

A first vent 354 and/or a second vent 356 may be disposed on the cover 362. For example, the first vent 354 may be disposed on near the frame 344 or between the upper base plate of the frame 334 and the lower base plate of the frame 334. For example, the second vent 356 may be disposed at or near the top of the cover 362. The first vent 354 allows air from outside to flow into the enclosure 300, and may be used to prevent humidification and/or overheating. The second vent 356 allows warm/hot air to be expelled from the enclosure 300. The first vent 354 and/or the second vent 356 may be conducive to laminar flow of air. For example, a boundary layer created by the air entering and the first vent 354 would be laminar so that the boundary layer does not create turbulent flow. The first vent 354 and/or the second vent 356 may comprise a smooth orifice, and may be shaped to have a circular or elliptical cross section. The first vent 354 and/or the second vent 356 may be shaped so that the Reynolds number of air flowing through the second vent 356 may be at most 2000, to create laminar flow. In some embodiments, the Reynolds number of air flowing through the first vent 354 and/or the second vent 356 may be at most 3000, or at most 1000.

A controller 352 may be disposed on the frame 334, the upper base plate of the frame 334, or the lower base plate of the frame 334. The controller 352 may control the operations of one of more of the LiDAR sensor 330, the cameras 332, the temperature sensor 342, the fan 344, the AC vent or cabin vent 346, the first vent 354, and/or the second vent 356.

For example, the controller 352 may regulate a rotation speed of the fan 344 based on a speed of the vehicle, a temperature measured by the temperature sensor 342, an external temperature, or a difference between the temperature measured by the temperature sensor 342 and the external temperature, and operate the fan 344 at the regulated rotation speed. For example, the controller 352 may regulate a rotation speed of the fan 344 based on any combination of the aforementioned factors. As an example, the controller 352 may regulate a rotation speed of the fan 344 based on whether the access from the enclosure 300 to the AC vent or cabin vent 346 is turned on. For example, the controller 352 may increase or decrease a rotation speed of the fan 344 if the access from the enclosure 300 to the AC vent or cabin vent 346 is turned off (e.g., no air flows from the AC vent or cabin vent 346 to the enclosure 300). For example, the controller 352 may increase or decrease a rotation speed of the fan 344 if the access from the enclosure 300 if the access from the enclosure 300 to the AC vent or cabin vent 346 is turned on. For example, the controller 352 may regulate a rotation speed of the fan 344 based on a level of wind external to the enclosure 300. For example, the level of wind may be determined by an amount of airflow entering through the first vent 354. For example, if enough air is entering through the first vent 354 to provide cooling and/or ventilation, the controller 352 may reduce the rotation speed of the fan 344 or shut off the fan 344. Furthermore, the controller 352 may, in addition to, or instead of, regulating the rotation speed of the fan 344, regulate an amount of air entering from the AC vent or cabin vent 346, for example, depending or based on how much cooling is required for one or more of the sensors of the enclosure 300. For example, the controller 352 may regulate the amount of air entering into the AC vent or cabin vent 346 based on one or more of, or any combination of, the speed of the autonomous vehicle, the temperature measured by the temperature sensor 342, the external temperature, the difference between the temperature measured by the temperature sensor 342 and the external temperature, or based on an internal temperature of the LiDAR sensor 330 or the cameras 332 (which may indicate how heavily the LiDAR sensor 330 or the cameras 332 are being used). For example, the controller 352 may regulate the amount of air entering into the AC vent or cabin vent 346 by adjusting a size of an opening of the AC vent or cabin vent 346 (e.g., a radius of the opening of the AC vent or cabin vent 346, or by regulating an amount of air extracted into the AC vent or cabin vent 346. In another embodiment, the controller 352 may regulate an amount of air entering from the AC vent or cabin vent 346 based on the rotation speed of the fan 344. For example, in one embodiment, if the rotation speed of the fan 344 is increased, the controller 352 may reduce the amount of air entering into the AC vent or cabin vent 346 because adequate cooling of the enclosure 300 may already be provided by the fan 344. In one embodiment, the controller 352 may select between using the fan 344 and the AC vent or cabin vent 346 to cool the enclosure 300. For example, the controller 352 may select between using the fan 344 and the AC vent or cabin vent 346 to cool the enclosure 300 based on which method is more energy efficient. In one embodiment, the controller 352 may select using the fan 344 when an amount of cooling to be provided (e.g. which may correspond to the temperature measured by temperature sensor 342) is lower than a threshold (e.g., first threshold) and using the AC vent or cabin vent 346 when the amount of cooling to be provided is greater than the threshold (e.g., first threshold). On the other hand, if the operation of the fan 344 at high rotation speed itself generates heat internally for the fan 344, the controller 352 may increase the amount of air entering into, or permit air to enter through, the AC vent or cabin vent 346 to provide cooling for the fan 344. Thus, the controller 352 may increase the amount of air entering into the AC vent or cabin vent 346 as the rotation speed of the fan 344 is increased.

The controller 352 may further be configured to turn on or turn off access from the AC vent or cabin vent 346 to the enclosure 300 based on the temperature of the enclosure 300 measured by the temperature sensor 342 or the internal air pressure of the enclosure 300 measured by the pressure sensor 355. For example, an increase in the internal temperature of the enclosure 300 may result in changes in internal air pressure of a portion of the enclosure 300 because warmer air rises. To compensate for changes in the temperature and/or pressure inside the enclosure 300, the AC vent or cabin vent 346 may be turned on to allow AC air or cabin air to flow into the AC vent or cabin vent 346. Furthermore, the controller 352 may be configured to increase or decrease an amount of AC air or cabin air going into the enclosure 300, for example, by increasing or decreasing a size of the AC vent or cabin vent 346. In another embodiment, the controller 352 may be configured to increase or decrease an amount of AC air or cabin air, for example, based on a gradient of temperature inside the enclosure 300 or a gradient of pressure inside the enclosure 300. As an example, if a gradient of temperature inside the enclosure 300 exceeds a threshold (e.g., second threshold), the controller 352 may be configured to increase or decrease an amount of AC air or cabin air. As an example, if a gradient of pressure inside the enclosure 300 exceeds a threshold (e.g., third threshold), the controller 352 may be configured to increase or decrease an amount of AC air or cabin air.

The controller 352 may further adjust a rotation speed of the fan 344, and/or an amount of air entering the AC vent or cabin vent 346, based on one or any combination of predicted future conditions, such as anticipated speed, anticipated external temperature, or anticipated internal temperature of the enclosure 300. For example, if the controller 352 predicts, based on a navigation route selected, or weather forecast, that the temperature at a destination is high, the controller may preemptively precool the enclosure 300 by increasing the rotation speed of the fan 344 or increasing the amount of air entering the AC vent or cabin vent 346. As another example, if the controller 352 predicts that the LiDAR sensor 330 or the cameras 332 will be heavily used in a near future, the controller may preemptively precool the enclosure 300 by increasing the rotation speed of the fan 344 or increasing the amount of air entering the AC vent or cabin vent 346. As another example, if the controller 352 predicts that the vehicle speed will increase based on a type of road (e.g., highway), traffic conditions, road conditions, and/or amount of battery/gasoline remaining, the controller may preemptively precool the enclosure 300 by increasing the rotation speed of the fan 344 or increasing the amount of air entering the AC vent or cabin vent 346.

Optionally, the enclosure 300 also comprises a filter 360, or one or more filters 360, to filter debris. In one embodiment, the filter 360 is a HEPA filter. The one or more filters 360 may be disposed on an upper base plate of the frame 334, a lower base plate of the frame 334, or the frame 334. Additionally or alternatively, the one or more filters 360 may be disposed at an inlet of the first vent 354. The activity of the filter 360 may be controlled by the controller 352. For example, if a detected level of debris is high, the controller 352 may increase an activity level of the filter 360 (e.g. a heavy-duty mode). In contrast, if a detected level of debris is low, the controller 352 may decrease an activity level of the filter 360 (e.g. a light-duty mode). The filter 360 may further be adjusted to filter out particles of specific ranges of sizes (e.g., by the controller 352).

Figure 4:
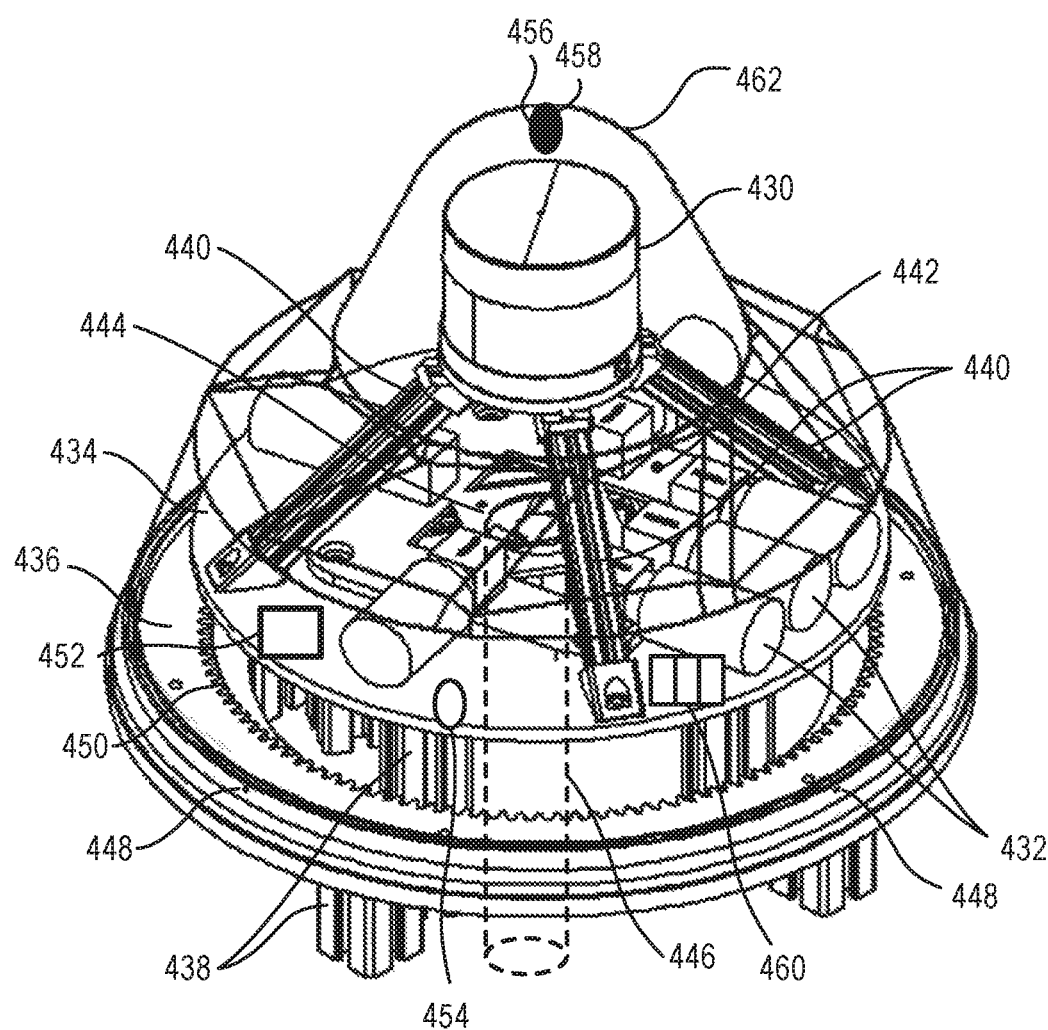
FIG. 4 illustrates an example of an enclosure for a sensor system according to some embodiments.

FIG. 4 illustrates an example of an enclosure 400 for a sensor system (e.g. sensor system 180), according to an embodiment of the present disclosure. In some embodiments, features of the sensor system 180 of FIG. 1P can be implemented as part of the enclosure 400 of FIG. 4. The sensor system may be configured to determine a parameter of the enclosure 400 or the vehicle (e.g., vehicle 100). For example, the controller 196 can be implemented as part of the enclosure 400 of FIG. 4. FIG. 4 may include a cover 462 to encase a sensor system, which may include LiDAR sensor 430 and cameras 432. For example, the cover 462 may be detachable or removable to allow easy access to the sensor system. In some embodiments, the cover 462 can rotate circularly, or in three hundred sixty degrees, relative to the sensor system about a central vertical axis of the cover 462. In some embodiments, the cover 462 may have a profile or shape that has a low wind resistance or coefficient of drag, and thereby reducing negative impacts to fuel economy of the autonomous vehicle. For example, the cover 462 may have a smooth surface so that a boundary layer formed between the air and the cover 462 would be laminar rather than turbulent. For example, the cover 462 may have a sleek angular profile. In some embodiments, the outer contour of the cover 462 can have multiple distinct sections (e.g., portions, regions, etc.) with different shapes. For example, a top portion of the cover 462 may have a circular dome shape with a first diameter measured at a base of the top portion and may encase the LiDAR sensor 430 of the autonomous vehicle. A middle portion of the cover 462 directly below the top portion may have a trapezoidal or truncated cone shape with a second diameter measured at a base on the middle portion, and the second diameter may be larger than the first diameter. A lower portion of the cover 462 directly below the middle portion may have a trapezoidal or truncated cone shape with a third diameter measured at a base on the lower portion. The third diameter may be larger than the second diameter. In other embodiments, the cover 462 may be entirely comprised of a single shape, such as a circular dome shape, a trapezoidal or truncated cone shape.

The cover 462 may be made from any suitable material that allows the one or more sensors of the enclosure 400 to properly function while shielding the one or more sensors from environmental elements (e.g., rain, snow, moisture, wind, dust, radiation, oxidation, etc.). Further, the suitable material must be transparent to wavelengths of light or electro-magnetic waves receptive to the LiDAR sensor 430 and the plurality of cameras 432. For example, for the LiDAR sensor 430 to properly operate, the cover 462 must allow laser pulses emitted from the LiDAR sensor 430 to pass through the cover 462 to reach a target and then reflect back through the cover 462 and back to the LiDAR sensor 430. Similarly, for the plurality of cameras 432 to properly operate, the cover 462 must allow visible light to enter. In addition to being transparent to wavelengths of light, the suitable material must also be able to withstand potential impacts from roadside debris without causing damages to the LiDAR sensor 430 or the plurality of cameras 432. In an implementation, the cover 462 can be made of acrylic glass (e.g., Cylux, Plexiglas, Acrylite, Lucite, Perspex, etc.). In another implementation, the cover 462 can be made of strengthen glass (e.g., Coring® Gorilla® glass). In yet another implementation, the cover 362 can be made of laminated safety glass held in place by layers of polyvinyl butyral (PVB), ethylene-vinyl acetate (EVA), or other similar chemical compounds. Many implementations are possible and contemplated.

In some embodiments, the cover 462 can be tinted with a thin-film neural filter to reduce transmittance of light entering the cover 462. For example, in an embodiment, a lower portion of the cover 462 can be selectively tinted with the thin-film neutral filter to reduce an intensity of visible light seen by the plurality of cameras 432. In this example, transmittance of laser pulses emitted from the LiDAR sensor 430 is not be affected by the tint because only the lower portion of the cover 442 is tinted. In another embodiment, the lower portion of the cover 462 can be tinted with a thin-film graduated neural filter in which the transmittance of visible light can vary along an axis. In yet another embodiment, the whole cover 462 can be treated or coated with a reflective coating such that the components of the enclosure 400 is not visible from an outside vantage point while still being transparent to wavelengths of light receptive to the LiDAR sensor 430 and the plurality of cameras 432. Many variations, such as adding a polarization layer or an anti-reflective layer, are possible and contemplated.

In some embodiments, the enclosure 400 may comprise a frame 434, a ring 436, and a plurality of anchoring posts 438. The frame 434 provides mechanical support for the LiDAR sensor 430 and the plurality of cameras 432. The ring 436 provides mounting points for the cover 462 such that the cover 462 encases and protects the sensor system from environmental elements. The plurality of anchoring posts 438 provides mechanical couplings to secure or mount the enclosure 400 to the autonomous vehicle.

In some embodiments, the frame 434 may have two base plates held in place by struts 440. An upper base plate of the frame 434 may provide a mounting surface for the LiDAR sensor 430 while a lower base plate of the frame 434 may provide a mounting surface for the plurality of cameras 432. In general, any number of LiDAR sensors 430 and cameras 432 may be mounted to the frame 434. The frame 434 is not limited to having one LiDAR sensor and six cameras as shown in FIG. 4. For example, in an embodiment, the frame 434 can have more than two base plates held in place by the struts 440. In this example, the frame 434 may have three base plates with upper two base plates reserved for two LiDAR sensors 430 and a lower base plate for six cameras 432. In another embodiment, the lower base plate can have more than six cameras 432. For instance, there can be three cameras pointed in a forward direction of an autonomous vehicle, two cameras pointed to in a right and a left direction of the autonomous vehicle, and two cameras pointed in a reverse direction of the autonomous vehicle. Many variations are possible.

The frame 434 may include a temperature sensor 442, a fan 444, an air conditioning (AC) vent or cabin vent 446, and a pressure sensor 455. The temperature sensor 442 can be configured to measure a temperature of the enclosure 400. In general, the temperature sensor 442 can be placed anywhere on the frame 434 that is representative of the enclosure temperature. In a typical implementation, the temperature sensor 442 is placed in a region in which heat generated by the LiDAR sensor 430 and the plurality of cameras 432 are most localized. In the example of FIG. 4, the temperature sensor 442 is placed on the lower base plate of the frame 434, right behind the three front cameras. The fan 444 can be configured to draw an inlet airflow from an external source. The fan 444, in various implementations, works in conjunction with the temperature sensor 442 to maintain a steady temperature condition inside the enclosure 400. The fan 444 can vary its rotation speed depending on the enclosure temperature. For example, when the enclosure temperature is high, as measured by the temperature sensor 442, the fan 444 may increase its rotation speed to draw additional volume of air to lower the temperature of the enclosure 400 and thus cooling the sensors. Similarly, when the temperature of the enclosure 400 is low, the fan 444 does not need to operate as fast. The fan 444 may be located centrally on the lower base plate of the frame 434. The AC vent or cabin vent 446 may be a duct, tube, or a conduit that conveys cooling air into the enclosure 400. In an embodiment, the AC vent or cabin vent 446 may be connected to a cabin of the autonomous vehicle. In another embodiment, the AC vent or cabin vent 446 may be connected to a separate air conditioner unit that provides cooling air separate from the cabin of the autonomous vehicle. The AC vent or cabin vent 446 may be directly connected to the enclosure 400 at a surface of the frame 434. The pressure sensor 455 may be configured to determine an internal air pressure of the enclosure 400.

In some embodiments, the frame 434 can also include a powertrain. The powertrain is an electric motor coupled to a drivetrain comprising one or more gears. The powertrain can rotate the ring 436 clockwise or counter-clockwise. In various embodiments, the electric motor can be a direct current brush or brushless motor, or an alternate current synchronous or asynchronous motor. Many variations are possible. In various embodiments, the one or more gears of the drivetrain can be configured to have various gear ratios designed to provide various amounts of torque delivery and rotational speed.

In general, the frame 434 can be made from any suitable materials that can withstand extreme temperature swings and weather various environmental conditions (e.g., rain, snow, corrosion, oxidation, etc.). The frame 434 can be fabricated using various metal alloys (e.g., aluminum alloys, steel alloys, etc.). The frame 434 can also be fabricated with three dimensional printers using thermoplastics (e.g., polylactic acid, acrylonitrile butadiene styrene, polyamide, high impact polystyrene, thermoplastic elastomer, etc.). Similarly, the air duct 446 can be made from rigid materials (e.g., hard plastics, polyurethane, metal alloys, etc.) or semi-rigid materials (e.g., rubber, silicone, etc.). Many variations are possible.

The ring 436 can provide mounting points for the cover 362 to encase the internal structure 304 of the enclosure 400. In the example of FIG. 4, the ring 436 has an outer portion that includes attaching points 448 through which the cover 362 can be attached and secured. The ring 436 also has an inner portion that comprises gear teeth 450 (or cogs) such that when the gear teeth 450 is driven by the powertrain of the frame 434, the whole ring 436 rotates as a result.

Similar to the frame 434, the ring 436 can be made from any suitable material that can withstand extreme temperature swings and weather various environmental conditions. However, in most implementations, the suitable material for the ring 436 must be somewhat more durable than the material used for the frame 434. This is because the gear teeth 450 of the ring 436 are subject to more wear and tear from being coupled to the powertrain of the frame 434. The ring 436 can be fabricated using various metal alloys (e.g., carbon steel, alloy steel, etc.). The ring 436 can also be fabricated with three dimensional printers using thermoplastics (e.g., polylactic acid, acrylonitrile butadiene styrene, polyamide, high impact polystyrene, thermoplastic elastomer, etc.).

The plurality of the anchoring posts 438 can provide mechanical couplings to secure or mount the enclosure 400 to an autonomous vehicle. In general, any number of anchoring posts 438 may be used. In the example of FIG. 4, the enclosure 400 is shown with eight anchoring posts: four anchoring posts to secure the frame 434 to the autonomous vehicle and four anchoring posts to secure the ring 436 to the autonomous vehicle. Similar to the frame 434 and the ring 436, the plurality of the anchoring posts 438 can be made from any suitable materials and fabricated using metal alloys (e.g., carbon steel, alloy steel, etc.) or three dimensional printed with thermoplastics (e.g., polylactic acid, acrylonitrile butadiene styrene, polyamide, high impact polystyrene, thermoplastic elastomer, etc.).

A first vent 454 and/or a second vent 456 may be disposed on the cover 462. For example, the first vent 454 may be disposed on near the frame 444 or between the upper base plate of the frame 434 and the lower base plate of the frame 434. For example, the second vent 456 may be disposed at or near the top of the cover 462. The first vent 454 allows air from outside to flow into the enclosure 400, and may be used to prevent humidification and/or overheating. The second vent 456 allows warm/hot air to be expelled from the enclosure 400. The first vent 454 and/or the second vent 456 may be conducive to laminar flow of air. For example, a boundary layer created by the air entering and the first vent 454 would be laminar so that the boundary layer does not create turbulent flow. The first vent 454 and/or the second vent 456 may comprise a smooth orifice, and may be shaped to have a circular or elliptical cross section. The first vent 454 and/or the second vent 456 may be shaped so that the Reynolds number of air flowing through the second vent 456 may be at most 2000, to create laminar flow. In some embodiments, the Reynolds number of air flowing through the first vent 454 and/or the second vent 456 may be at most 3000, or at most 1000.

The second vent 456 may further comprise a moisture absorbent material 458 at or near an outlet of the second vent 456. The moisture absorbent material 458 may be desiccant. The moisture absorbent material 458 may be impermeable to liquid and permeable to air. For example, in rainy conditions, the moisture absorbent material 458 may absorb rainwater and not permit the rainwater to seep into the enclosure 400. Optionally, the first vent 454 may also comprise a moisture absorbent material at or near an inlet of the first vent 454.

A controller 452 may be disposed on the frame 434, the upper base plate of the frame 434, or the lower base plate of the frame 434. The controller 452 may control the operations of one of more of the LiDAR sensor 430, the cameras 432, the temperature sensor 442, the fan 444, the AC vent or cabin vent 446, the first vent 454, and/or the second vent 456.

For example, the controller 452 may regulate a rotation speed of the fan 444 based on a speed of the vehicle, a temperature measured by the temperature sensor 442, an external temperature, or a difference between the temperature measured by the temperature sensor 442 and the external temperature, and operate the fan 444 at the regulated rotation speed. For example, the controller 452 may regulate a rotation speed of the fan 444 based on any combination of the aforementioned factors. For example, the controller 452 may regulate a rotation speed of the fan 444 based on whether the access from the enclosure 400 to the AC vent or cabin vent 446 is turned on. As an example, the controller 452 may regulate a rotation speed of the fan 444 based on whether the access from the enclosure 400 to the AC vent or cabin vent 446 is turned on. For example, the controller 452 may increase or decrease a rotation speed of the fan 444 if the access from the enclosure 400 to the AC vent or cabin vent 446 is turned off (e.g., no air flows from the AC vent or cabin vent 446 to the enclosure 400). For example, the controller 452 may increase or decrease a rotation speed of the fan 444 if the access from the enclosure 400 if the access from the enclosure 400 to the AC vent or cabin vent 446 is turned on. For example, the controller 452 may regulate a rotation speed of the fan 444 based on a level of wind external to the enclosure 400. For example, the level of wind may be determined by an amount of airflow entering through the first vent 454. For example, if enough air is entering through the first vent 454 to provide cooling and/or ventilation, the controller 452 may reduce the rotation speed of the fan 444 or shut off the fan 444. Furthermore, the controller 452 may, in addition to, or instead of, regulating the rotation speed of the fan 444, regulate an amount of air entering from the AC vent or cabin vent 446, for example, depending or based on how much cooling is required for one or more of the sensors of the enclosure 400. For example, the controller 452 may regulate the amount of air entering into the AC vent or cabin vent 446 based on one or more of, or any combination of, the speed of the autonomous vehicle, the temperature measured by the temperature sensor 442, the external temperature, the difference between the temperature measured by the temperature sensor 442 and the external temperature, or based on an internal temperature of the LiDAR sensor 430 or the cameras 432 (which may indicate how heavily the LiDAR sensor 430 or the cameras 432 are being used). For example, the controller 452 may regulate the amount of air entering into the AC vent or cabin vent 446 by adjusting a size of an opening of the AC vent or cabin vent 446 (e.g., a radius of the opening of the AC vent or cabin vent 446, or by regulating an amount of air extracted into the AC vent or cabin vent 446. In another embodiment, the controller 452 may regulate an amount of air entering from the AC vent or cabin vent 446 based on the rotation speed of the fan 444. For example, in one embodiment, if the rotation speed of the fan 444 is increased, the controller 452 may reduce the amount of air entering into the AC vent or cabin vent 446 because adequate cooling of the enclosure 400 may already be provided by the fan 444. In one embodiment, the controller 452 may select between using the fan 444 and the AC vent or cabin vent 446 to cool the enclosure 400. For example, the controller 452 may select between using the fan 444 and the AC vent or cabin vent 446 to cool the enclosure 400 based on which method is more energy efficient. In one embodiment, the controller 452 may select using the fan 444 when an amount of cooling to be provided (e.g. which may correspond to the temperature measured by temperature sensor 442) is lower than a threshold (e.g., first threshold) and using the AC vent or cabin vent 446 when the amount of cooling to be provided is greater than the threshold (e.g., first threshold). On the other hand, if the operation of the fan 444 at high rotation speed itself generates heat internally for the fan 444, the controller 452 may increase the amount of air entering into the AC vent or cabin vent 446 to provide cooling for the fan 444. Thus, the controller 452 may increase the amount of air entering into the AC vent or cabin vent 446 as the rotation speed of the fan 444 is increased.

The controller 452 may further be configured to turn on or turn off access from the AC vent or cabin vent 446 to the enclosure 400 based on the temperature of the enclosure 400 measured by the temperature sensor 442 or the internal air pressure of the enclosure 400 measured by the pressure sensor 455. For example, an increase in the internal temperature of the enclosure 400 may result in changes in internal air pressure of a portion of the enclosure 400 because warmer air rises. To compensate for changes in the temperature and/or pressure inside the enclosure 400, the AC vent or cabin vent 446 may be turned on to allow AC air or cabin air to flow into the AC vent or cabin vent 446. Furthermore, the controller 452 may be configured to increase or decrease an amount of AC air or cabin air going into the enclosure 400, for example, by increasing or decreasing a size of the AC vent or cabin vent 446. In another embodiment, the controller 452 may be configured to increase or decrease an amount of AC air or cabin air, for example, based on a gradient of temperature inside the enclosure 400 or a gradient of pressure inside the enclosure 400. As an example, if a gradient of temperature inside the enclosure 400 exceeds a threshold (e.g., second threshold), the controller 452 may be configured to increase or decrease an amount of AC air or cabin air. As an example, if a gradient of pressure inside the enclosure 400 exceeds a threshold (e.g., third threshold), the controller 452 may be configured to increase or decrease an amount of AC air or cabin air.

The controller 452 may further adjust a rotation speed of the fan 444, and/or an amount of air entering the AC vent or cabin vent 446, based on one or any combination of predicted future conditions, such as anticipated speed, anticipated external temperature, or anticipated internal temperature of the enclosure 400. For example, if the controller 452 predicts, based on a navigation route selected, or weather forecast, that the temperature at a destination is high, the controller may preemptively precool the enclosure 400 by increasing the rotation speed of the fan 444 or increasing the amount of air entering the AC vent or cabin vent 446. As another example, if the controller 452 predicts that the LiDAR sensor 430 or the cameras 432 will be heavily used in a near future, the controller may preemptively precool the enclosure 400 by increasing the rotation speed of the fan 444 or increasing the amount of air entering the AC vent or cabin vent 446. As another example, if the controller 452 predicts that the vehicle speed will increase based on a type of road (e.g., highway), traffic conditions, road conditions, and/or amount of battery/gasoline remaining, the controller may preemptively precool the enclosure 400 by increasing the rotation speed of the fan 444 or increasing the amount of air entering the AC vent or cabin vent 446.

The controller 452 may further monitor a dampness of the moisture absorbent material 458 to determine when it should be replaced.

Optionally, the enclosure 400 also comprises a filter 460, or one or more filters 460, to filter debris. In one embodiment, the filter 460 is a HEPA filter. The one or more filters 460 may be disposed on an upper base plate of the frame 334, a lower base plate of the frame 434, or the frame 434. Additionally or alternatively, the one or more filters 460 may be disposed at an inlet of the first vent 454. The activity of the filter 460 may be controlled by the controller 452. For example, if a detected level of debris is high, the controller 452 may increase an activity level of the filter 460 (e.g. a heavy-duty mode). In contrast, if a detected level of debris is low, the controller 452 may decrease an activity level of the filter 460 (e.g. a light-duty mode). The filter 460 may further be adjusted to filter out particles of specific ranges of sizes (e.g., by the controller 452). The controller 452 may further monitor a condition of the filter 460 to determine when it should be replaced.

Figure 5:
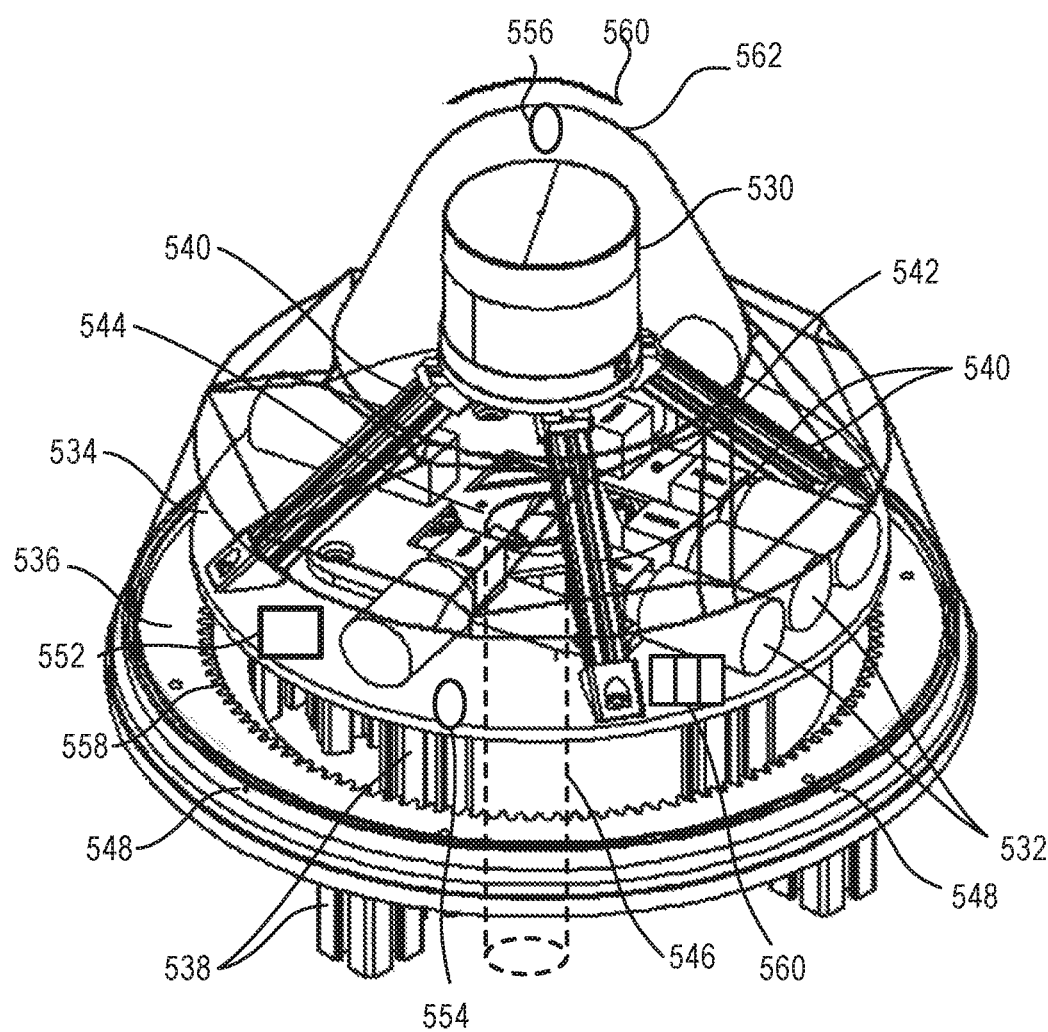
FIG. 5 illustrates an example of an enclosure for a sensor system according to some embodiments.

FIG. 5 illustrates an example of an enclosure 500 for a sensor system (e.g. sensor system 180), according to an embodiment of the present disclosure. In some embodiments, features of the sensor system 180 of FIG. 1P can be implemented as part of the enclosure 500 of FIG. 5. The sensor system may be configured to determine a parameter of the enclosure 500 or the vehicle (e.g., vehicle 100). For example, the controller 196 can be implemented as part of the enclosure 500 of FIG. 5. FIG. 5 may include a cover 562 to encase a sensor system, which may include LiDAR sensor 530 and cameras 532. For example, the cover 562 may be detachable or removable to allow easy access to the sensor system. In some embodiments, the cover 562 can rotate circularly, or in three hundred sixty degrees, relative to the sensor system about a central vertical axis of the cover 562. In some embodiments, the cover 562 may have a profile or shape that has a low wind resistance or coefficient of drag, and thereby reducing negative impacts to fuel economy of the autonomous vehicle. For example, the cover 562 may have a smooth surface so that a boundary layer formed between the air and the cover 562 would be laminar rather than turbulent. For example, the cover 562 may have a sleek angular profile. In some embodiments, the outer contour of the cover 562 can have multiple distinct sections (e.g., portions, regions, etc.) with different shapes. For example, a top portion of the cover 562 may have a circular dome shape with a first diameter measured at a base of the top portion and may encase the LiDAR sensor 530 of the autonomous vehicle. A middle portion of the cover 562 directly below the top portion may have a trapezoidal or truncated cone shape with a second diameter measured at a base on the middle portion, and the second diameter may be larger than the first diameter. A lower portion of the cover 562 directly below the middle portion may have a trapezoidal or truncated cone shape with a third diameter measured at a base on the lower portion. The third diameter may be larger than the second diameter. In other embodiments, the cover 562 may be entirely comprised of a single shape, such as a circular dome shape, a trapezoidal or truncated cone shape.

The cover 562 may be made from any suitable material that allows the one or more sensors of the enclosure 500 to properly function while shielding the one or more sensors from environmental elements (e.g., rain, snow, moisture, wind, dust, radiation, oxidation, etc.). Further, the suitable material must be transparent to wavelengths of light or electro-magnetic waves receptive to the LiDAR sensor 530 and the plurality of cameras 532. For example, for the LiDAR sensor 530 to properly operate, the cover 562 must allow laser pulses emitted from the LiDAR sensor 530 to pass through the cover 562 to reach a target and then reflect back through the cover 562 and back to the LiDAR sensor 530. Similarly, for the plurality of cameras 532 to properly operate, the cover 562 must allow visible light to enter. In addition to being transparent to wavelengths of light, the suitable material must also be able to withstand potential impacts from roadside debris without causing damages to the LiDAR sensor 530 or the plurality of cameras 532. In an implementation, the cover 562 can be made of acrylic glass (e.g., Cylux, Plexiglas, Acrylite, Lucite, Perspex, etc.). In another implementation, the cover 562 can be made of strengthen glass (e.g., Coring® Gorilla® glass). In yet another implementation, the cover 362 can be made of laminated safety glass held in place by layers of polyvinyl butyral (PVB), ethylene-vinyl acetate (EVA), or other similar chemical compounds. Many implementations are possible and contemplated.

In some embodiments, the cover 562 can be tinted with a thin-film neural filter to reduce transmittance of light entering the cover 562. For example, in an embodiment, a lower portion of the cover 562 can be selectively tinted with the thin-film neutral filter to reduce an intensity of visible light seen by the plurality of cameras 532. In this example, transmittance of laser pulses emitted from the LiDAR sensor 530 is not be affected by the tint because only the lower portion of the cover 542 is tinted. In another embodiment, the lower portion of the cover 562 can be tinted with a thin-film graduated neural filter in which the transmittance of visible light can vary along an axis. In yet another embodiment, the whole cover 562 can be treated or coated with a reflective coating such that the components of the enclosure 500 is not visible from an outside vantage point while still being transparent to wavelengths of light receptive to the LiDAR sensor 530 and the plurality of cameras 532. Many variations, such as adding a polarization layer or an anti-reflective layer, are possible and contemplated.

In some embodiments, the enclosure 500 may comprise a frame 534, a ring 536, and a plurality of anchoring posts 538. The frame 534 provides mechanical support for the LiDAR sensor 530 and the plurality of cameras 532. The ring 536 provides mounting points for the cover 562 such that the cover 562 encases and protects the sensor system from environmental elements. The plurality of anchoring posts 538 provides mechanical couplings to secure or mount the enclosure 500 to the autonomous vehicle.

In some embodiments, the frame 534 may have two base plates held in place by struts 540. An upper base plate of the frame 534 may provide a mounting surface for the LiDAR sensor 530 while a lower base plate of the frame 534 may provide a mounting surface for the plurality of cameras 532. In general, any number of LiDAR sensors 530 and cameras 532 may be mounted to the frame 534. The frame 534 is not limited to having one LiDAR sensor and six cameras as shown in FIG. 5. For example, in an embodiment, the frame 534 can have more than two base plates held in place by the struts 540. In this example, the frame 534 may have three base plates with upper two base plates reserved for two LiDAR sensors 530 and a lower base plate for six cameras 532. In another embodiment, the lower base plate can have more than six cameras 532. For instance, there can be three cameras pointed in a forward direction of an autonomous vehicle, two cameras pointed to in a right and a left direction of the autonomous vehicle, and two cameras pointed in a reverse direction of the autonomous vehicle. Many variations are possible.

The frame 534 may include a temperature sensor 542, a fan 544, an air conditioning (AC) vent or cabin vent 546, and a pressure sensor 555. The temperature sensor 542 can be configured to measure an interior temperature of the enclosure 500. In general, the temperature sensor 542 can be placed anywhere on the frame 534 that is representative of the enclosure temperature. In a typical implementation, the temperature sensor 542 is placed in a region in which heat generated by the LiDAR sensor 530 and the plurality of cameras 532 are most localized. In the example of FIG. 5, the temperature sensor 542 is placed on the lower base plate of the frame 534, right behind the three front cameras. The fan 544 can be configured to draw an inlet airflow from an external source. The fan 544, in various implementations, works in conjunction with the temperature sensor 542 to maintain a steady temperature condition inside the enclosure 500. The fan 544 can vary its rotation speed depending on the enclosure temperature. For example, when the enclosure temperature is high, as measured by the temperature sensor 542, the fan 544 may increase its rotation speed to draw additional volume of air to lower the temperature of the enclosure 500 and thus cooling the sensors. Similarly, when the temperature of the enclosure 500 is low, the fan 544 does not need to operate as fast. The fan 544 may be located centrally on the lower base plate of the frame 534. The AC vent or cabin vent 546 may be a duct, tube, or a conduit that conveys cooling air into the enclosure 500. In an embodiment, the AC vent or cabin vent 546 may be connected to a cabin of the autonomous vehicle. In another embodiment, the AC vent or cabin vent 546 may be connected to a separate air conditioner unit that provides cooling air separate from the cabin of the autonomous vehicle. The AC vent or cabin vent 546 may be directly connected to the enclosure 500 at a surface of the frame 534. The pressure sensor 555 may be configured to determine an internal air pressure of the enclosure 500.

In some embodiments, the frame 534 can also include a powertrain. The powertrain is an electric motor coupled to a drivetrain comprising one or more gears. The powertrain can rotate the ring 536 clockwise or counter-clockwise. In various embodiments, the electric motor can be a direct current brush or brushless motor, or an alternate current synchronous or asynchronous motor. Many variations are possible. In various embodiments, the one or more gears of the drivetrain can be configured to have various gear ratios designed to provide various amounts of torque delivery and rotational speed.

In general, the frame 534 can be made from any suitable materials that can withstand extreme temperature swings and weather various environmental conditions (e.g., rain, snow, corrosion, oxidation, etc.). The frame 534 can be fabricated using various metal alloys (e.g., aluminum alloys, steel alloys, etc.). The frame 534 can also be fabricated with three dimensional printers using thermoplastics (e.g., polylactic acid, acrylonitrile butadiene styrene, polyamide, high impact polystyrene, thermoplastic elastomer, etc.). Similarly, the air duct 546 can be made from rigid materials (e.g., hard plastics, polyurethane, metal alloys, etc.) or semi-rigid materials (e.g., rubber, silicone, etc.). Many variations are possible.

The ring 536 can provide mounting points for the cover 362 to encase the internal structure 304 of the enclosure 500. In the example of FIG. 5, the ring 536 has an outer portion that includes attaching points 548 through which the cover 362 can be attached and secured. The ring 536 also has an inner portion that comprises gear teeth 550 (or cogs) such that when the gear teeth 550 is driven by the powertrain of the frame 534, the whole ring 536 rotates as a result.

Similar to the frame 534, the ring 536 can be made from any suitable material that can withstand extreme temperature swings and weather various environmental conditions. However, in most implementations, the suitable material for the ring 536 must be somewhat more durable than the material used for the frame 534. This is because the gear teeth 550 of the ring 536 are subject to more wear and tear from being coupled to the powertrain of the frame 534. The ring 536 can be fabricated using various metal alloys (e.g., carbon steel, alloy steel, etc.). The ring 536 can also be fabricated with three dimensional printers using thermoplastics (e.g., polylactic acid, acrylonitrile butadiene styrene, polyamide, high impact polystyrene, thermoplastic elastomer, etc.).

The plurality of the anchoring posts 538 can provide mechanical couplings to secure or mount the enclosure 500 to an autonomous vehicle. In general, any number of anchoring posts 538 may be used. In the example of FIG. 5, the enclosure 500 is shown with eight anchoring posts: four anchoring posts to secure the frame 534 to the autonomous vehicle and four anchoring posts to secure the ring 536 to the autonomous vehicle. Similar to the frame 534 and the ring 536, the plurality of the anchoring posts 538 can be made from any suitable materials and fabricated using metal alloys (e.g., carbon steel, alloy steel, etc.) or three dimensional printed with thermoplastics (e.g., polylactic acid, acrylonitrile butadiene styrene, polyamide, high impact polystyrene, thermoplastic elastomer, etc.).

A first vent 554 and/or a second vent 556 may be disposed on the cover 562. For example, the first vent 554 may be disposed on near the frame 544 or between the upper base plate of the frame 534 and the lower base plate of the frame 534. For example, the second vent 556 may be disposed at or near the top of the cover 562. The first vent 554 allows air from outside to flow into the enclosure 500, and may be used to prevent humidification and/or overheating. The second vent 556 allows warm/hot air to be expelled from the enclosure 500. The first vent 554 and/or the second vent 556 may be conducive to laminar flow of air. For example, a boundary layer created by the air entering and the first vent 554 would be laminar so that the boundary layer does not create turbulent flow. The first vent 554 and/or the second vent 556 may comprise a smooth orifice, and may be shaped to have a circular or elliptical cross section. The first vent 554 and/or the second vent 556 may be shaped so that the Reynolds number of air flowing through the second vent 456 may be at most 2000, to create laminar flow. In some embodiments, the Reynolds number of air flowing through the first vent 554 and/or the second vent 556 may be at most 3000, or at most 1000.

The second vent 556 may further comprise a layer 560 at or near an outlet of the second vent 556. The layer 560 may slide over and cover the second vent 556 completely or partially (e.g., to prevent moisture from seeping in), or leave the second vent 556 completely open, to adjust or control a size of an opening of the second vent 556. The layer 560 may slide over the outlet of the second vent 556 to regulate a size (e.g. surface area) of the second vent 556 that is exposed to an outside. For example, the layer 560 may expose the second vent 556 more if the temperature of the enclosure 500 relative to an exterior temperature is high, a speed of the vehicle is high, and/or an air quality (e.g., measured by an air quality index (AQI)) is high. In contrast, the layer 560 may be positioned to cover the second vent 556 more fully if the temperature of the enclosure 500 relative to an exterior temperature is low, a speed of the vehicle is low, and/or an air quality is low. The layer 560 may be positioned exterior to the cover 562 or interior to the cover 562. The layer 560 may comprise a same material as the cover 562, or a different material. For example, the layer 560 may be thinner and more flexible than the material of the cover 562. The layer 560 may be impermeable to moisture and permeable to air. A position of the layer 560 with respect to the second vent 556 may be regulated by a controller 552. The layer 560 may be curved in a same or similar manner as the enclosure 500 to conform to a shape of the enclosure 500. A similar layer may also be positioned at or near an inlet of the first vent 554, to adjust or control a size of an opening of the first vent 554. A similar layer may also be positioned at or near an inlet of the AC vent or cabin vent 546, and such layer may be flat instead of curved, to adjust or control a size of an opening of the AC vent or cabin vent 546.

The controller 552 may be disposed on the frame 534, the upper base plate of the frame 534, or the lower base plate of the frame 534. The controller 552 may control the operations of one of more of the LiDAR sensor 530, the cameras 532, the temperature sensor 542, the fan 544, the AC vent or cabin vent 546, the first vent 554, and/or the second vent 556.

For example, the controller 552 may regulate a rotation speed of the fan 544 based on a speed of the vehicle, a temperature measured by the temperature sensor 542, an external temperature, or a difference between the temperature measured by the temperature sensor 542 and the external temperature, and operate the fan 544 at the regulated rotation speed. For example, the controller 552 may regulate a rotation speed of the fan 544 based on any combination of the aforementioned factors. As an example, the controller 552 may regulate a rotation speed of the fan 544 based on whether the access from the enclosure 500 to the AC vent or cabin vent 546 is turned on. As an example, the controller 552 may regulate a rotation speed of the fan 544 based on whether the access from the enclosure 500 to the AC vent or cabin vent 546 is turned on. For example, the controller 552 may increase or decrease a rotation speed of the fan 544 if the access from the enclosure 500 to the AC vent or cabin vent 546 is turned off (e.g., no air flows from the AC vent or cabin vent 546 to the enclosure 500). For example, the controller 552 may increase or decrease a rotation speed of the fan 544 if the access from the enclosure 500 if the access from the enclosure 500 to the AC vent or cabin vent 546 is turned on. For example, the controller 552 may regulate a rotation speed of the fan 544 based on a level of wind external to the enclosure 500. For example, the level of wind may be determined by an amount of airflow entering through the first vent 554. For example, if enough air is entering through the first vent 554 to provide cooling and/or ventilation, the controller 552 may reduce the rotation speed of the fan 544 or shut off the fan 544. Furthermore, the controller 552 may, in addition to, or instead of, regulating the rotation speed of the fan 544, regulate an amount of air entering from the AC vent or cabin vent 546, for example, depending or based on how much cooling is required for one or more of the sensors of the enclosure 500. For example, the controller 552 may regulate the amount of air entering into the AC vent or cabin vent 546 based on one or more of, or any combination of, the speed of the autonomous vehicle, the temperature measured by the temperature sensor 542, the external temperature, the difference between the temperature measured by the temperature sensor 542 and the external temperature, or based on an internal temperature of the LiDAR sensor 530 or the cameras 532 (which may indicate how heavily the LiDAR sensor 530 or the cameras 532 are being used). For example, the controller 552 may regulate the amount of air entering into the AC vent or cabin vent 546 by adjusting a size of an opening of the AC vent or cabin vent 546 (e.g., a radius of the opening of the AC vent or cabin vent 546, or by regulating an amount of air extracted into the AC vent or cabin vent 546. In another embodiment, the controller 552 may regulate an amount of air entering from the AC vent or cabin vent 546 based on the rotation speed of the fan 544. For example, in one embodiment, if the rotation speed of the fan 544 is increased, the controller 552 may reduce the amount of air entering into the AC vent or cabin vent 546 because adequate cooling of the enclosure 500 may already be provided by the fan 544. In one embodiment, the controller 552 may select between using the fan 544 and the AC vent or cabin vent 546 to cool the enclosure 500. For example, the controller 552 may select between using the fan 544 and the AC vent or cabin vent 546 to cool the enclosure 500 based on which method is more energy efficient. In one embodiment, the controller 552 may select using the fan 544 when an amount of cooling to be provided (e.g. which may correspond to the temperature measured by temperature sensor 542) is lower than a threshold (e.g., first threshold) and using the AC vent or cabin vent 546 when the amount of cooling to be provided is greater than the threshold (e.g., first threshold). On the other hand, if the operation of the fan 544 at high rotation speed itself generates heat internally for the fan 544, the controller 552 may increase the amount of air entering into the AC vent or cabin vent 546 to provide cooling for the fan 544. Thus, the controller 552 may increase the amount of air entering into the AC vent or cabin vent 546 as the rotation speed of the fan 544 is increased.

The controller 552 may further be configured to turn on or turn off access from the AC vent or cabin vent 546 to the enclosure 500 based on the temperature of the enclosure 500 measured by the temperature sensor 542 or the internal air pressure of the enclosure 500 measured by the pressure sensor 555. For example, an increase in the internal temperature of the enclosure 500 may result in changes in internal air pressure of a portion of the enclosure 500 because warmer air rises. To compensate for changes in the temperature and/or pressure inside the enclosure 500, the AC vent or cabin vent 546 may be turned on to allow AC air or cabin air to flow into the AC vent or cabin vent 546. Furthermore, the controller 552 may be configured to increase or decrease an amount of AC air or cabin air going into the enclosure 500, for example, by increasing or decreasing a size of the AC vent or cabin vent 546. In another embodiment, the controller 552 may be configured to increase or decrease an amount of AC air or cabin air, for example, based on a gradient of temperature inside the enclosure 500 or a gradient of pressure inside the enclosure 500. As an example, if a gradient of temperature inside the enclosure 500 exceeds a threshold (e.g., second threshold), the controller 552 may be configured to increase or decrease an amount of AC air or cabin air. As an example, if a gradient of pressure inside the enclosure 500 exceeds a threshold (e.g., third threshold), the controller 552 may be configured to increase or decrease an amount of AC air or cabin air.

The controller 552 may further adjust a rotation speed of the fan 544, and/or an amount of air entering the AC vent or cabin vent 546, based on one or any combination of predicted future conditions, such as anticipated speed, anticipated external temperature, or anticipated internal temperature of the enclosure 500. For example, if the controller 552 predicts, based on a navigation route selected, or weather forecast, that the temperature at a destination is high, the controller may preemptively precool the enclosure 500 by increasing the rotation speed of the fan 544 or increasing the amount of air entering the AC vent or cabin vent 546. As another example, if the controller 552 predicts that the LiDAR sensor 530 or the cameras 532 will be heavily used in a near future, the controller may preemptively precool the enclosure 500 by increasing the rotation speed of the fan 544 or increasing the amount of air entering the AC vent or cabin vent 546. As another example, if the controller 552 predicts that the vehicle speed will increase based on a type of road (e.g., highway), traffic conditions, road conditions, and/or amount of battery/gasoline remaining, the controller may preemptively precool the enclosure 500 by increasing the rotation speed of the fan 544 or increasing the amount of air entering the AC vent or cabin vent 546.

The controller 552 may further adjust a size of an inlet of the first vent 554, and/or an outlet of the second vent 556. For example, the controller 552 may be programmed or configured to slide the layer 560 over the outlet of the second vent 556 to adjust how much surface area of the second vent 556 is exposed to outside. For example, the controller 552 may slide the layer 560 completely over the outlet of the second vent 556 when it is raining or snowing. In such conditions, the controller 552 may operate the AC vent or cabin vent 546 to provide cooling and/or ventilation instead. As another example, the controller 552 may regulate the size of the outlet of the second vent based on one or more of, or any combination of, the speed of the vehicle, the temperature measured by the temperature sensor 542, the external temperature, the difference between the temperature measured by the temperature sensor 542 and the external temperature, an internal temperature of the LiDAR sensor 530 or the cameras 532, the internal air pressure of the enclosure 550, a difference between the internal air pressure of the enclosure 550 and an air pressure of a cabin (e.g., connected to the AC vent or cabin vent 546), and an air quality of the airflow entering the enclosure 550 through the first vent 554. For example, the controller 552 may expose the first vent 554 and/or second vent 556 more without covering it with the layer 560 if the temperature of the enclosure 500 relative to an exterior temperature is high, a speed of the vehicle is high, and/or an air quality (e.g., measured by an air quality index (AQI)) determined by an air quality sensor (e.g., air quality sensor 115, 125) is high. In contrast, the controller 552 may slide the layer 560 to cover the first vent 554 and/or the second vent 556 more fully if the temperature of the enclosure 500 relative to an exterior temperature is low, a speed of the vehicle is low, and/or an air quality is low. Therefore, the controller 552 may adjust an amount of airflow through the first vent 554 and/or the second vent 556 based on the air quality. The controller 552 may perform same or similar operations with a layer at the first vent 554 and/or a layer at the AC vent or cabin vent 546.

The controller 552 may further monitor a dampness of the moisture absorbent material 558 to determine when it should be replaced.

Optionally, the enclosure 500 also comprises a filter 560 to filter debris. In one embodiment, the filter 560 is a HEPA filter. Optionally, the enclosure 500 also comprises a filter 560, or one or more filters 560, to filter debris. In one embodiment, the filter 560 is a HEPA filter. The one or more filters 560 may be disposed on an upper base plate of the frame 534, a lower base plate of the frame 534, or the frame 534. Additionally or alternatively, the one or more filters 560 may be disposed at an inlet of the first vent 554. For example, if a detected level of debris is high, the controller 552 may increase an activity level of the filter 560 (e.g. a heavy-duty mode). In contrast, if a detected level of debris is low, the controller 552 may decrease an activity level of the filter 560 (e.g. a light-duty mode). The filter 560 may further be adjusted to filter out particles of specific ranges of sizes (e.g., by the controller 552). The controller 552 may further monitor a condition of the filter 560 (e.g., concentration of particulates) to determine when it should be replaced.

FIG. 6A illustrates an example vehicle 600 (e.g., autonomous vehicle), comprising a heat exchange system (e.g., including an deflector), in a top view, according to an embodiment of the present disclosure. The example vehicle 600 may be implemented with any of the embodiments described previously, for example, FIGS. 1P and 2-5. The example vehicle 600 is shown with an enclosure 602 (e.g., to house one or more sensors), four radar systems 604, and one or more deflector(s) 606. The deflector(s) 606 may be controlled (e.g., by a controller 196, 252, 352, 452, 552 in the enclosure 602, as described in FIG. 1P, 2-5). In FIG. 6B, the deflector(s) 606 is/are shown to be retracted, or shortened in length, compared to the deflector(s) 606 in FIG. 6A. As an example, the deflector(s) 606 may be retractable. As an example, the deflector(s) 606 may be extended and/or retracted, for example, by a controller. The deflector(s) 606 may be adjusted or actuated in length, for example, based on a speed of the vehicle 600, an internal temperature of the enclosure 602, an external temperature, a difference between the internal temperature of the enclosure 602 and the external temperature, and/or a wind speed. For example, the controller may control the deflector(s) 606 to be shorter if the internal temperature decreases, and/or if the difference between the internal temperature and the external temperature decreases, and vice versa. For example, the controller may control the deflector(s) 606 to be shorter if the wind speed decreases and vice versa. The controller may control an amount of change in the length of the deflector(s) 606 to be constant for a given incremental change in difference between the internal temperature of the enclosure 602 and the external temperature. The controller may control an amount of change in the length of the deflector(s) 606 to be constant for a given incremental change in the internal temperature of the enclosure 602. The controller may control an amount of change in the length of the deflector(s) 606 to be constant for a given incremental change in the change in the wind speed. As an example, for every change of y degrees in temperature difference (Celsius) between the internal temperature of the enclosure 602 and the external temperature, the controller may change the length of the deflector(s) 606 by x meters. In some alternate embodiments, the controller may control an amount of change in the length of the deflector(s) 606 to be nonconstant or variable for a given incremental change in difference between the internal temperature of the enclosure 602 and the external temperature. For example, as the incremental change in difference between the internal temperature of the enclosure 602 and the external temperature increases, for more extreme temperature differences, the controller may increase a rate of the change of length of the deflector(s) 606 for every change of temperature difference. For example, if the difference between the internal temperature of the enclosure 602 and the external temperature is ten degrees, the controller may control the rate of the change of length of the deflector(s) 606 to be x meters per degree difference. If the difference between the internal temperature of the enclosure 602 and the external temperature is fifty degrees, the controller may control the rate of the change of length of the deflector(s) 606 to be 2x meters per degree difference, or z meters per degree difference, wherein z is greater than x. Similarly, the controller may control the rate of change of the length of the deflector(s) 606 for a given incremental change in the internal temperature of the enclosure 602, and/or for a given change in wind speed, to be nonconstant and/or variable, based on the internal temperature of the enclosure 602 and/or the wind speed, respectively. The deflector(s) 606 may be adjusted or actuated in length, for example, based on a detected air quality (e.g., measured by an air quality index (AQI)). For example, the deflector(s) 606 may be increased in length if the detected air quality is high, for example, if the AQI is low, and vice versa. The controller may be configured to change the length of one of the deflector(s) 606 independent of the other deflector(s), and/or change the length(s) all of the deflector(s) 606 in a coordinated fashion, such as, shortening or lengthening all of the deflector(s) 606 by a same amount, or by a proportional amount. As another example, the controller may adjust the length of one or more of the deflector(s) 606 based on a predicted future speed of the vehicle, a predicted external temperature at a destination, a predicted future internal temperature of the enclosure, and/or a predicted future AQI. For example the controller may increase the length of one or more of the deflector(s) 606 if the predicted future speed of the vehicle 600 is higher than a current speed of the vehicle 600, if the predicted external temperature at a destination is higher than a current temperature at the destination, and if the predicted future internal temperature of the enclosure 602 is higher than a current internal temperature of the enclosure 602. As another example, the controller may adjust both the length and a height of the deflector(s) 606 (as described in the previous FIGS). As an example, the controller may increase the length while decreasing the height of the deflector(s) 606, and vice versa. As another example, the controller may increase the length while increasing the height of the deflector(s) 606, and vice versa. The controller may adjust the length of the deflector(s) 606 depending on whether access from an AC vent (e.g., AC vent 246, 346, 446, 546) is opened to the enclosure 602. For example, the controller may increase the length of the deflector(s) 606 if access from the AC vent is turned off to the enclosure 602, and vice versa.

FIG. 6C illustrates an example vehicle 610 (e.g., autonomous vehicle), comprising a heat exchange system (e.g., including an deflector), in a top view, according to an embodiment of the present disclosure. The example vehicle 610 may be implemented with any of the embodiments described previously, for example, FIGS. 1P and 2-5. The example vehicle 610 is shown with an enclosure 612 (e.g., to house one or more sensors), four radar systems 614, and one or more deflector(s) 616. The deflector(s) 616 may be controlled (e.g., by a controller 196, 252, 352, 452, 552 in the enclosure 612, as described in FIG. 1P, 2-5). In FIG. 6D, the deflector(s) 616 is shown to be rotated, or pivoted, about a point, relative to the deflector(s) 616 of FIG. 6C. The deflector(s) 616 may rotationally actuate, for example, be rotated or pivoted about a point based on a wind direction and a direction of the vehicle 610. For example, the controller may rotated or pivot at least one of the deflector(s) 616 about a point to align at the deflector(s) 616 with the direction of the wind, relative to the direction of the vehicle 610. Thus, at least one of the deflector(s) 616 may be facing the direction of the wind. At least one of the deflector(s) 616 may be rotated dynamically to continuously face the direction of the wind as the direction of the vehicle 610 changes and/or as the direction of the wind changes. As an example, if a cross wind is present, at least one of the deflector(s) 616 may be rotated dynamically to face a direction of the cross wind. Another one of the deflector(s) may face the direction of the wind, if the cross wind has a different direction from the direction of the wind. The controller may be configured to rotationally pivot one of the deflector(s) 616 independent of the other deflector(s), and/or rotationally pivot all of the deflector(s) 616 in a coordinated fashion, such as, pivoting all of the deflector(s) 616 in a same direction or in an opposite direction. In some embodiments, the controller may rotate the at least one of the deflector(s) 616 about a point and adjust a length of the at least one of the deflector(s) 616 (as described above with reference to FIGS. 6A and 6B), simultaneously. In some embodiments, the controller may also simultaneously adjust a height of the at least one of the deflector(s) 616 as described in the previous FIGS. As another example, the controller may rotationally actuate one or more of the deflector(s) 616 based on a predicted future speed of the vehicle, a predicted external temperature at a destination, a predicted future internal temperature of the enclosure, a predicted future wind speed or a predicted future wind direction. For example the controller may rotationally actuate one or more of the deflector(s) 616 if the predicted future wind direction changes.

FIG. 6E illustrates an example vehicle 620 (e.g., autonomous vehicle), comprising a heat exchange system (e.g., including an deflector), in a top view, according to an embodiment of the present disclosure. The example vehicle 620 may be implemented with any of the embodiments described previously, for example, FIGS. 1P and 2-5. The example vehicle 620 is shown with an enclosure 622 (e.g., to house one or more sensors), four radar systems 624, and one or more deflector(s) 626. The deflector(s) 626 may be controlled (e.g., by a controller 196, 252, 352, 452, 552 in the enclosure 622, as described in FIG. 1P, 2-5). In FIG. 6F, the deflector(s) 626 is/are shown to changed in shape, relative to the deflector(s) 626 of FIG. 6E. For example, the deflector(s) 626 may be changed from a curved shape to a straight shape, and vice versa. As another example, the deflector(s) 626 may be changed from a bent shape to a straight shape or a curved shape, and vice versa. The deflector(s) 626 may be changed in shape, for example, based on a speed of the vehicle 620, an internal temperature of the enclosure 622, an external temperature, a difference between the internal temperature of the enclosure 622 and the external temperature, a wind speed, and/or a wind direction. For example, the deflector(s) 626 may be changed from a straight shape to a curved shape if the wind is swirling, and/or if a cross wind is detected. As another example, the deflector(s) 626 may be changed from a straight shape to a curved shape if a route traveled is especially curvy. As another example, the controller may change the shape of one or more of the deflector(s) 626 based on a predicted future speed of the vehicle 620, a predicted future internal temperature of the enclosure 622, an predicted future external temperature at a destination, a predicted future difference between the internal temperature of the enclosure 622 and the external temperature, a predicted future wind speed, and/or a predicted future wind direction. For example the controller may change the shape of one or more of the deflector(s) 616 from a straight to a curved shape if the predicted future wind direction changes, and/or if the wind is predicted to change from steady to swirling.

FIG. 6G illustrates an example vehicle 630 (e.g., autonomous vehicle), comprising a heat exchange system (e.g., including an deflector), in a top view, according to an embodiment of the present disclosure. The example vehicle 630 may be implemented with any of the embodiments described previously, for example, FIGS. 1P and 2-5. The example vehicle 630 is shown with an enclosure 632 (e.g., to house one or more sensors), four radar systems 634, and one or more deflector(s) 636. The deflector(s) 636 may be controlled (e.g., by a controller 196, 252, 352, 452, 552 in the enclosure 622, as described in FIG. 1P, 2-5). In FIG. 6H, the deflector(s) 636 is/are shown to be changed in slope, relative to the deflector(s) 636 of FIG. 6G. For example, the deflector(s) 636 may be changed to be steeper (be increased in slope), based on an amount of moisture detected, and/or based on a terrain of a road on which the vehicle 630 is travelling. For example, the deflector(s) 636 may be changed to be steeper or less steep if the road on which the vehicle 630 is travelling becomes steeper. As another example, the deflector(s) 636 may be changed to be steeper if an amount of moisture detected (e.g., at moisture absorbent material 558) increases, so that any moisture will not accumulate on the deflector(s) 636 and will fall off the deflector(s) 636 due to gravity. For example, the controller may determine an amount of change in the slope of the deflector(s) 636 based on the amount of moisture detected. For example, the greater the amount of moisture detected, the larger the change in slope may be for the deflector(s) 636. The amount of change in slope may be linearly proportional to the amount of increase in the moisture detected. As another example, the deflector(s) 636 may be changed to be steeper or less steep if a predicted future route on which the vehicle 630 is travelling is steeper than a current route on which the vehicle 630 is travelling. As another example, the deflector(s) 636 may be changed in slope, based on a current or predicted future speed of the vehicle 630, a current or predicted future internal temperature of the enclosure 632, a current or predicted future external temperature at a destination, a current or predicted future difference between the internal temperature of the enclosure 632 and the external temperature, a current or predicted future wind speed, and/or a current or predicted future wind direction. The controller may adjust the slope of the deflector(s) 636 in conjunction, or simultaneously with, any or all of the other features described in FIGS. 6A-6F. For example, the controller may adjust the slope of the deflector(s) 636 and linearly actuate the deflector(s) 636 simultaneously. For example, as the controller increases the slope of the deflector(s) 636, the controller may decrease a length of the deflector(s) 636). As an example, the controller may increase the slope and decrease the length of the deflector(s) 636 to maintain a constant surface area of the deflector(s) 636.

In the aforementioned examples described in FIGS. 6A-6H, at least some of the deflector(s) (e.g., 606, 616, 626, 636) may be in an inactive mode. For example, the controller may determine which one(s) of the deflector(s) are in an active mode, and which one(s) of the deflector(s) are in an inactive mode, for example, based on a wind speed and/or a wind direction at a location of the deflector(s). For example, the controller may select an deflector that is most aligned with the wind, and/or at which the wind speed is highest, to be in an active mode while keeping an other deflector in an inactive mode. If an deflector is in an inactive mode, it may be kept stationary, or it may be left unexposed (e.g., it may be hidden in a groove such as groove 178 so that it is not above a plane of a rooftop of a vehicle). As another example, the controller may increase the length and/or the height of one of the deflector(s), while controlling an other of the deflector(s) to be in the inactive mode, for example, by hiding the other of the deflector(s) in the groove so it is not exposed to the air. For example, the controller may increase the length and/or the height of one of the deflector(s) so that its surface area exposed to the air is doubled, while hiding an other of the deflector(s) in the groove, such that a total exposed surface area of all of the deflectors is maintained constant.

Figure 6I:
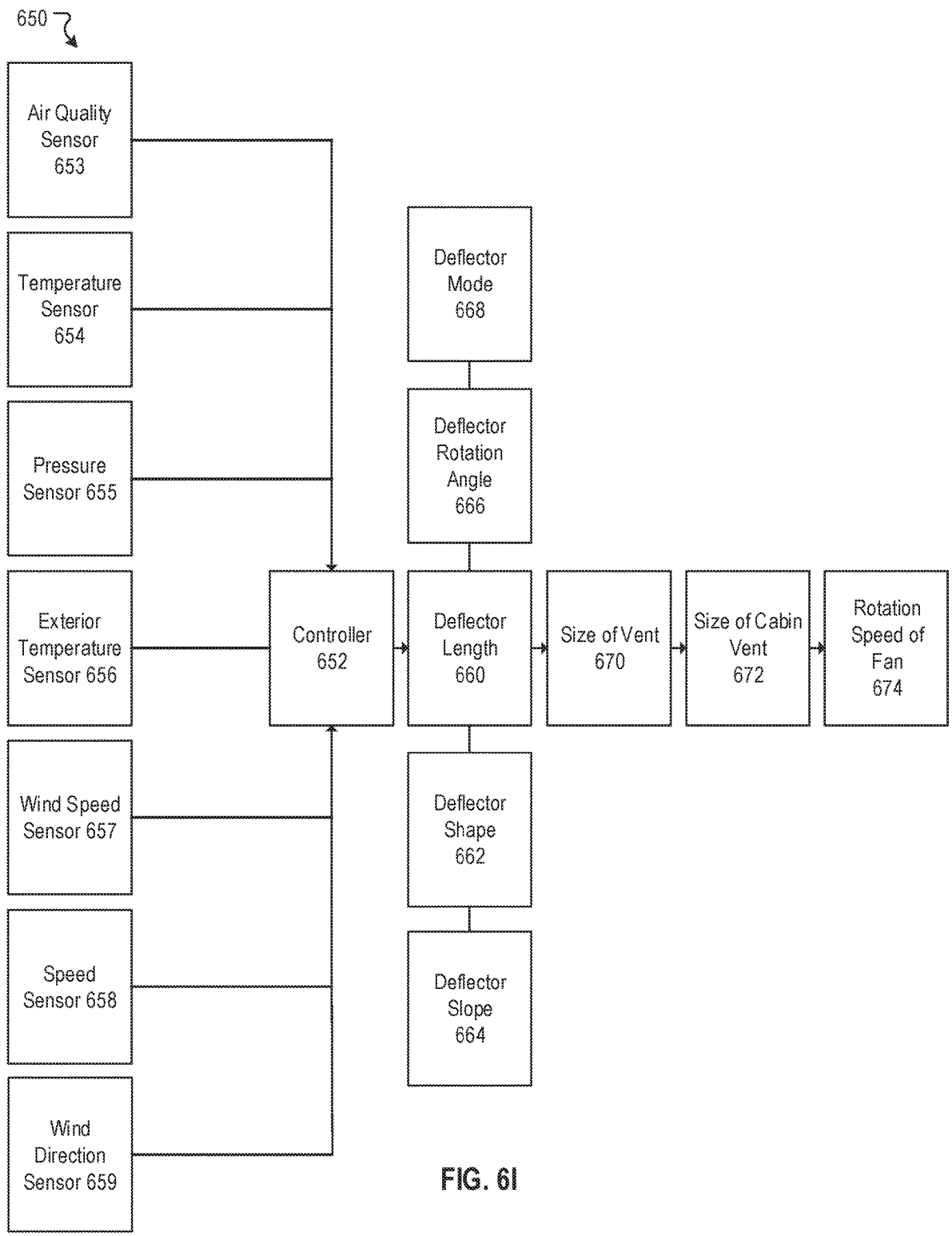
FIG. 6I illustrates an exemplary diagram of inputs and outputs to a controller of an enclosure according to some embodiments.

FIG. 6I illustrates an exemplary diagram of inputs and outputs to a controller of an enclosure according to some embodiments. For example, inputs from an air quality sensor 653 (e.g., air quality sensor 115, 125), a temperature sensor 654 (e.g., temperature sensor 242, 342, 442, or 542), a pressure sensor 655 (e.g., pressure sensor 195, 255, 355, 455, 555), an exterior temperature sensor 656, a wind speed sensor 657, a speed sensor 658 that senses a vehicle speed, and/or a wind direction sensor 659, which may be a same or different sensor from the wind speed sensor 657, may be provided to a controller 652 (e.g., which may be implemented as controller 196, 252, 352, 452, 552, 576). The controller 652 may, based on the inputs, regulate a length of a deflector 660 (e.g., which may be implemented as deflector 116, 126, 136, 146, 156, 166, 176, 606), a shape of the deflector 662 (e.g., which may be implemented as deflector 116, 126, 136, 146, 156, 166, 176, 626), a slope of the deflector 664 (e.g., which may be implemented as deflector 116, 126, 136, 146, 156, 166, 176, 636), a rotation angle of the deflector 666 (e.g., which may be implemented as deflector 116, 126, 136, 146, 156, 166, 176, 616), and/or a mode of the deflector 668 (e.g., which may be implemented as deflector 116, 126, 136, 146, 156, 166, 176, 606, 616, 626, 636). The controller 652 may, based on the inputs, regulate a size of a vent 670 (e.g., first vent 354, 454, 554, second vent 356, 456, 556), and based on the size of the vent 670, regulate a size of a cabin vent 672 (e.g., cabin vent 194, 246, 346, 446, 546). The controller 652 may, based on the size of the cabin vent 672, regulate a rotation speed of a fan 674 (e.g., fan 244, 344, 444, or 544).

Figure 7A:
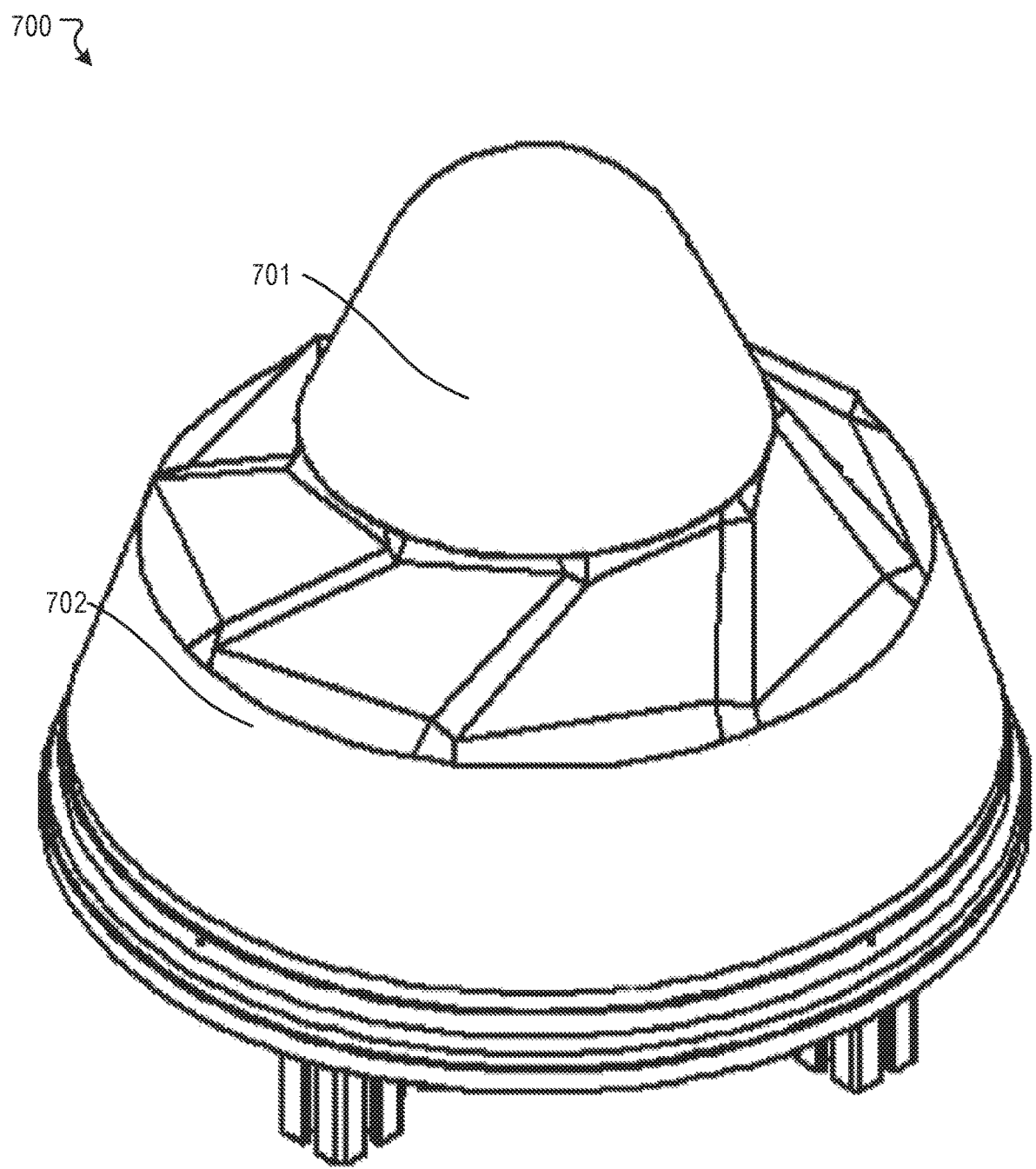
FIG. 7A illustrates an example of an enclosure cover for a sensor system according to some embodiments.

FIG. 7A illustrates an example of an enclosure cover 700 for a sensor system according to some embodiments. The enclosure cover 700 may be implemented as cover 262, 362, 462, or 562, and may be implemented with enclosure 112, 122, 132, 142, 152, 162, 172, 200, 300, 400, or 500, according to some embodiments. The enclosure cover 700 may comprise an upper section 701 and a lower section 702.

Figure 7B:
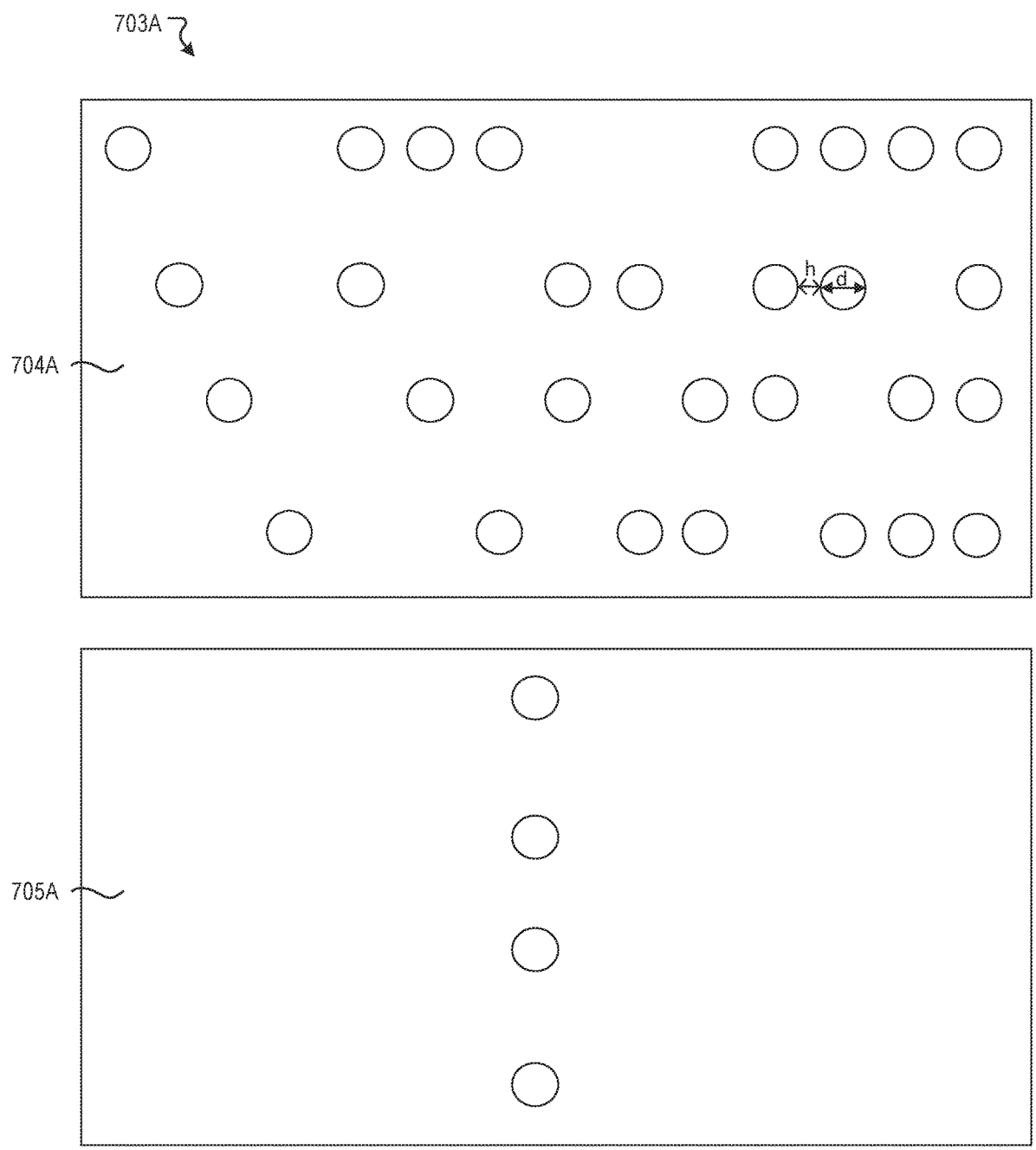
FIGS. 7B-7Q illustrate examples of hole patterns of an enclosure cover for a sensor system according to some embodiments.

FIG. 7B illustrates an example of a hole pattern 703A of an enclosure cover for a sensor system according to some embodiments. The hole pattern 703A shown in FIG. 7B is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 703A may be implemented on a cylindrical surface, a partially conical surface, or a frustoconical surface.

The hole pattern 703A may comprise a first layer 704A and a second layer 705A. As an example, the first layer 704A may be an outer layer and the second layer 705A may be an inner layer. As another example, the first layer 704A may be an inner layer and the second layer 705A may be an outer layer. In some embodiments, the second layer 705A may be rotated about the first layer 704A. By adjusting, manipulating, or rotating a relative position of the first layer 704A and the second layer 705A, a pattern of holes may be adjusted to control an amount of airflow entering the enclosure cover, and where the airflow enters the enclosure cover, for example, using a controller (e.g., controller 196, 252, 352, 452, 552). The controller may determine a desired or required amount of airflow that enters one or more holes of the hole pattern 703A. Based on the wind speed and a vehicle speed, the controller may determine a required or desired size of the one or more holes to attain the desired or required amount of airflow. Based on the required or desired size of the one or more holes, the controller may determine an amount of rotation of the second layer 705A necessary to attain the required or desired size of the one or more holes. The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. For example, if the internal temperature of the enclosure increases relative to the temperature of the external air, the controller may rotate the second layer 705A about the first layer 704A to increase a size and/or number of holes exposed to the airflow. As another example, if a wind direction or a temperature gradient inside the enclosure changes, the controller may rotate the second layer 705A about the first layer 704A to change a location of holes that are exposed to the airflow. For example, the controller may rotate the second layer 705A so that holes that most directly oppose the wind direction (e.g., so that a maximum amount of wind enters the holes compared to other holes) may be opened or increased in size. For example, the controller may rotate the second layer 705A so that holes at locations of the enclosure in a direction of one or more temperature gradients (indicative of locations of large increases in temperature) are opened and/or increased in size. As another example, the controller may rotate the second layer 705A in anticipation of future changes in temperature gradient inside the enclosure, future temperature of the external air, and/or future internal temperature of the enclosure. As another example, the controller may rotate the second layer 705A based on a size of an AC vent or cabin vent (e.g., cabin vent 194, 246, 346, 446, 546), or whether the AC vent or the cabin vent permits access to air from the AC vent or the cabin vent to the enclosure. As another example, the controller may rotate the second layer 705A based on a speed of a fan (e.g., fan 244, 344, 444, or 544). For example, the controller may rotate the second layer 705A to decrease the size and/or number of holes exposed to the airflow, the larger the size of the AC vent or cabin vent, and/or the higher the speed of the fan, and vice versa.

The hole pattern 703A provides a wide range of options regarding a number of holes that may be either left exposed to permit airflow into the enclosure, and a location or position of the holes that are left exposed. The hole pattern 703A may also be easy and quick to adjust through rotation of the second layer 705A about the first layer 704A to obtain a desired configuration of holes.

As an example, the first layer 704A may comprise columns of holes. Each column of holes may have a distinct pattern of between one and four holes, inclusive. In the nonlimiting example shown in 704A, four columns each contain one hole in a different position, six columns each contain two holes in different positions, three columns each contain three holes in different positions, and one column contains four holes. A horizontal distance between two holes directly adjacent in a horizontal direction is shown as h, and each hole has a horizontal distance from another hole of an integer multiple of h. For example, h may be greater than or equal to a diameter d of each of the holes. If h is greater than or equal to d, the hole pattern of the second layer 705A may be rotated and positioned over the first layer 704A such that it is not aligned with the hole pattern of the first layer 704A. In such an arrangement, holes of the second layer 705A are positioned between holes of the first layer 704A, and none of the holes are exposed to the air. This allows the controller to completely shut off airflow to the enclosure. As another example, h may be less than or equal to the diameter d of each of the holes. A vertical distance between two holes directly adjacent in a vertical direction may be constant, and each hole has a vertical distance from another hole of an integer multiple of the vertical distance between two holes that are directly adjacent in a vertical direction. Each of the holes may have a same diameter, in some embodiments. In some examples, the holes may be replaced by square or rectangular shaped slits. In some embodiments, the second layer 705A comprises one column of four holes. A size and spacing of the holes in the second layer 705A may be the same as a size and spacing of the holes in the first layer 704A. In some embodiments, the holes of the second layer 705A may have a same diameter and vertical spacing between two holes directly adjacent in a vertical direction. When the second layer 705A is rotated about the first layer 704A, at most one column of the 14 total columns of the first layer 704A may be exposed, in some embodiments. Specifically, a position of holes of the second layer 705A that aligns with holes of the first layer 704A is where openings of the enclosure cover are exposed. In some examples, the second layer 705A may be rotated such that holes of the second layer 705A do not correspond or align with any holes of the first layer 704A. In such a situation, no holes would be exposed and no airflow would pass through the enclosure via the combined first layer 704A and the second layer 705A. In some examples, the second layer 705A may be rotated such that the holes of the second layer 705A only partially align with holes of the first layer 704A. In such a situation, the holes in a column are only partially exposed, and a smaller amount of airflow would pass through the enclosure via the combined first layer 704A and the second layer 705A.

Figure 7C:
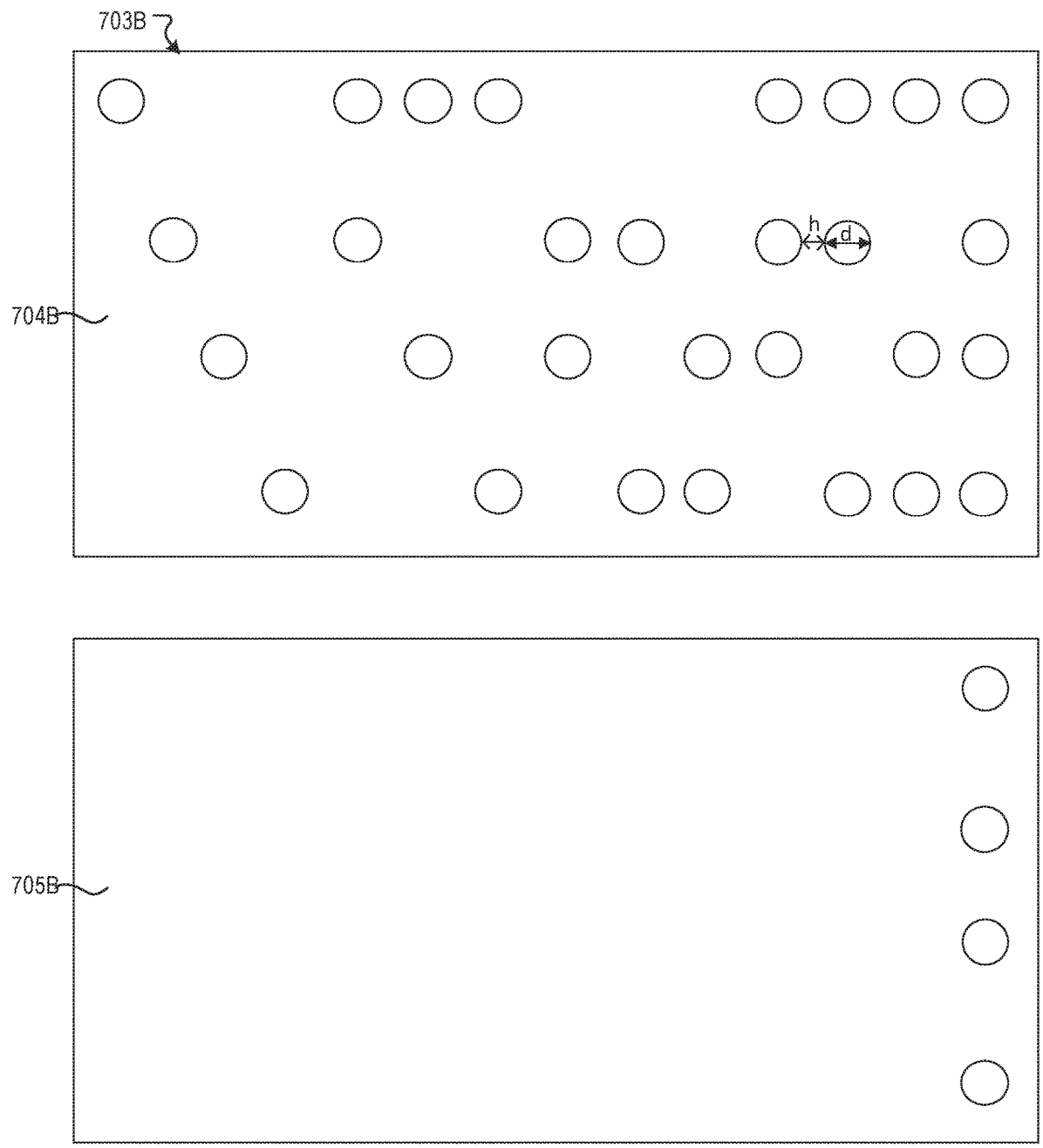
Figure 7C:
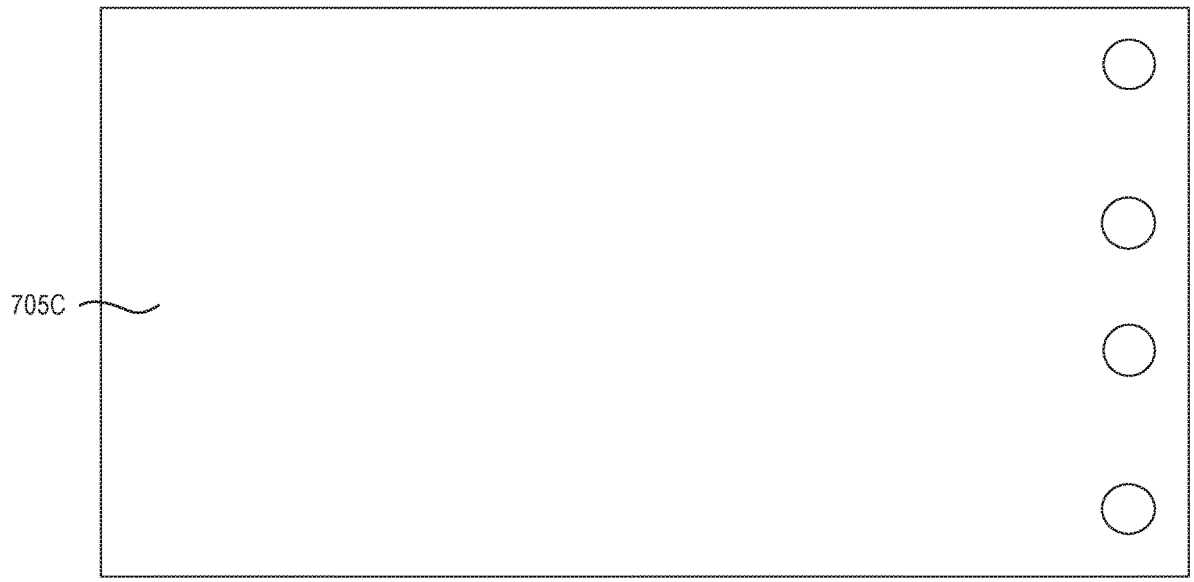

FIG. 7C illustrates an example of a hole pattern 703B of an enclosure cover for a sensor system according to some embodiments. The hole pattern 703B shown in FIG. 7C is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 703B may be implemented on a cylindrical surface, a partially conical surface, or a frustoconical surface.

The hole pattern 703B may comprise a first layer 704B and a second layer 705B. As an example, the first layer 704B may be an outer layer and the second layer 705B may be an inner layer. As another example, the first layer 704B may be an inner layer and the second layer 705B may be an outer layer. In some embodiments, the second layer 705B may be rotated about the first layer 704B. By adjusting, manipulating, or rotating a relative position of the first layer 704B and the second layer 705B, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure.

As an example, the first layer 704B may comprise columns of holes. Each column of holes may have a distinct pattern of between one and four holes, inclusive. In the nonlimiting example shown in 704B, four columns each contain one hole in a different position, six columns each contain two holes in different positions, three columns each contain three holes in different positions, and one column contains four holes. A horizontal distance between two holes directly adjacent in a horizontal direction is shown as h, and each hole has a horizontal distance from another hole of an integer multiple of h. For example, h may be greater than a diameter d of each of the holes. As another example, h may be less than or equal to the diameter d of each of the holes. A vertical distance between two holes directly adjacent in a vertical direction may be constant, and each hole has a vertical distance from another hole of an integer multiple of the vertical distance between two holes that are directly adjacent in a vertical direction. Each of the holes may have a same diameter, in some embodiments. In some examples, the holes may be replaced by square or rectangular shaped slits. In some embodiments, the second layer 705B comprises one column of four holes. A size and spacing of the holes in the second layer 705B may be the same as a size and spacing of the holes in the first layer 704B. In some embodiments, the holes of the second layer 705B may have a same diameter and vertical spacing between two holes directly adjacent in a vertical direction. When the second layer 705B is rotated about the first layer 704B, at most one column of the 14 total columns of the first layer 704A may be exposed, in some embodiments. Specifically, a position of holes of the second layer 705B that aligns with holes of the first layer 704B is where openings of the enclosure cover are exposed.

In the example of FIG. 7C, the second layer 705B is rotated about the first layer 704B such that the holes in the second layer 705B directly coincide or align with a last column of four holes in the first layer 704B. As a result, in combined first layer and second layer 705C, which results when the second layer 705B is placed over the first layer 705A, the last column of four holes is exposed to let airflow enter into the enclosure.

Figure 7D:
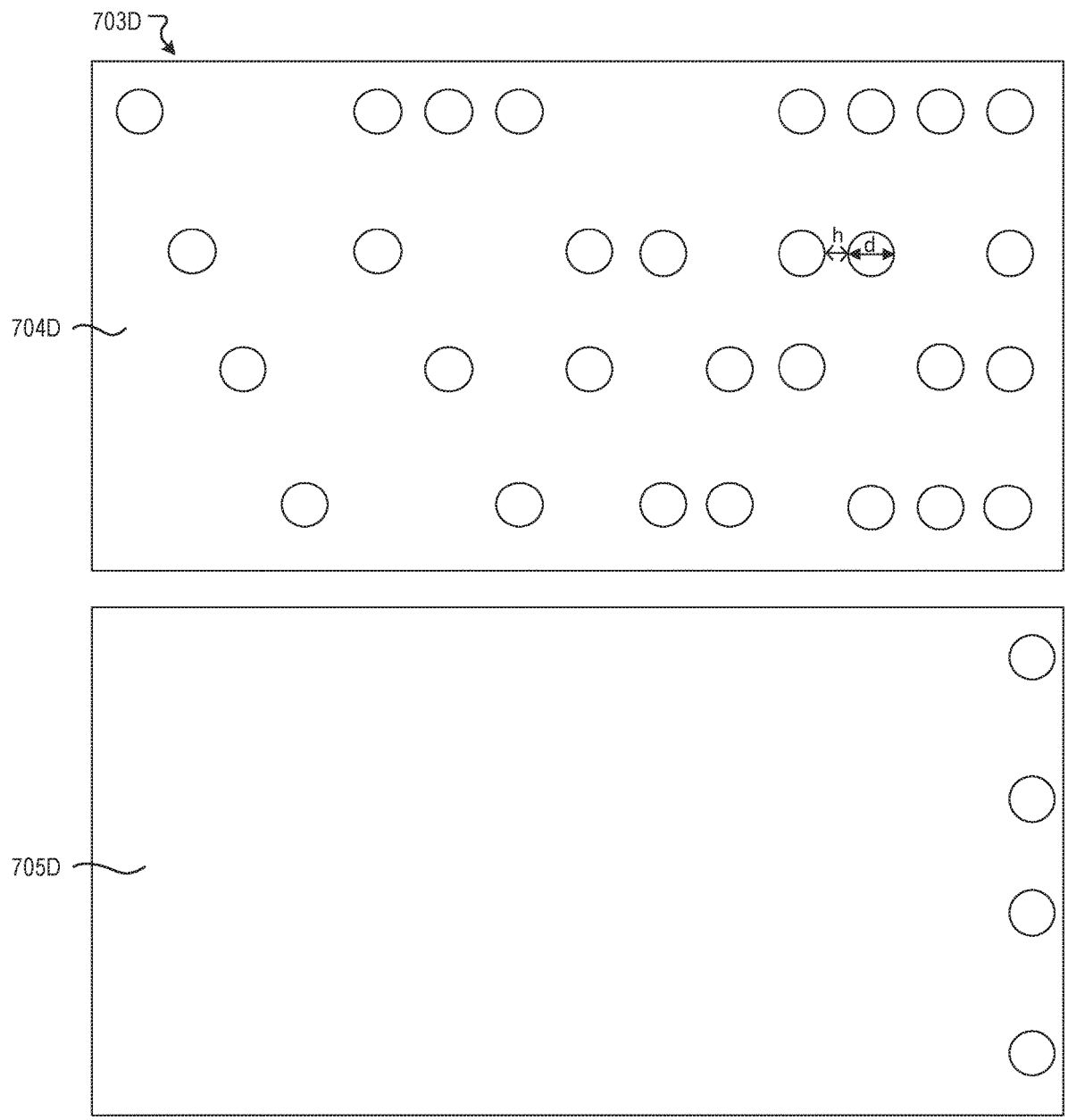
Figure 7D:
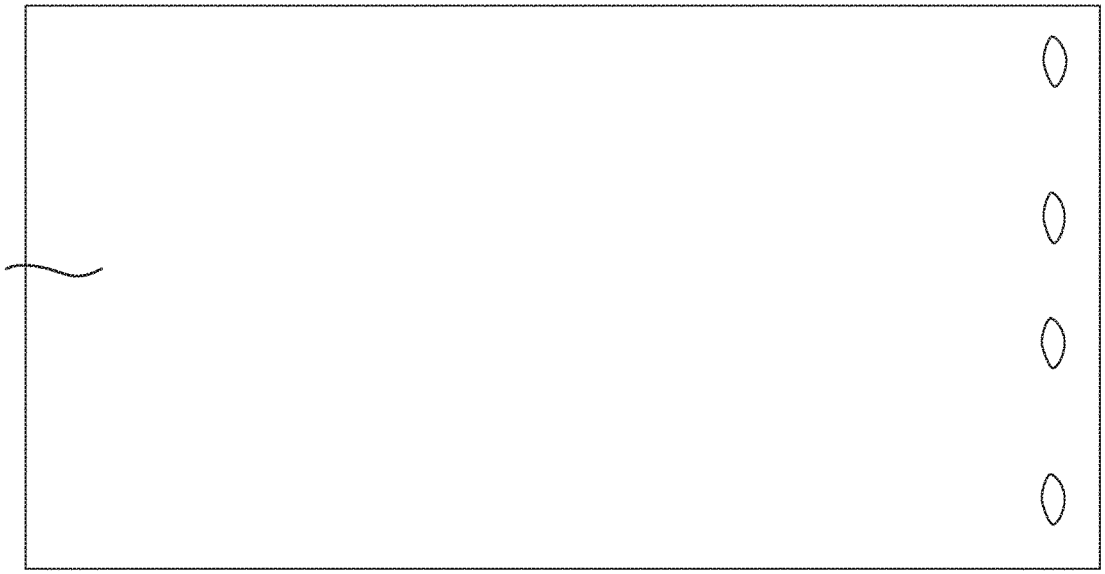

FIG. 7D shows an example of a hole pattern 703D of an enclosure cover for a sensor system according to some embodiments. The hole pattern 703D shown in FIG. 7D is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 703D may be implemented on a cylindrical surface, a partially conical surface, or a frustoconical surface.

The hole pattern 703D may comprise a first layer 704D and a second layer 705D. As an example, the first layer 704D may be an outer layer and the second layer 705D may be an inner layer. As another example, the first layer 704D may be an inner layer and the second layer 705D may be an outer layer. In some embodiments, the second layer 705D may be rotated about the first layer 704D. By adjusting, manipulating, or rotating a relative position of the first layer 704D and the second layer 705D, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure.

As an example, the first layer 704D may comprise columns of holes. Each column of holes may have a distinct pattern of between one and four holes, inclusive. In the nonlimiting example shown in 704D, four columns each contain one hole in a different position, six columns each contain two holes in different positions, three columns each contain three holes in different positions, and one column contains four holes. A horizontal distance between two holes directly adjacent in a horizontal direction is shown as h, and each hole has a horizontal distance from another hole of an integer multiple of h. For example, h may be greater than a diameter d of each of the holes. As another example, h may be less than or equal to the diameter d of each of the holes. A vertical distance between two holes directly adjacent in a vertical direction may be constant, and each hole has a vertical distance from another hole of an integer multiple of the vertical distance between two holes that are directly adjacent in a vertical direction. Each of the holes may have a same diameter, in some embodiments. In some examples, the holes may be replaced by square or rectangular shaped slits. In some embodiments, the second layer 705D comprises one column of four holes. A size and spacing of the holes in the second layer 705D may be the same as a size and spacing of the holes in the first layer 704D. In some embodiments, the holes of the second layer 705D may have a same diameter and vertical spacing between two holes directly adjacent in a vertical direction. When the second layer 705D is rotated about the first layer 704D, at most one column of the 14 total columns of the first layer 704D may be exposed, in some embodiments. Specifically, a position of holes of the second layer 705D that aligns with holes of the first layer 704D is where openings of the enclosure cover are exposed.

In the example of FIG. 7D, the second layer 705D is rotated about the first layer 704D such that the holes in the second layer 705D are offset by a distance of a radius of the holes (one-half of d) from the holes of the first layer 704D. Thus, the holes of the second layer 705D do not directly coincide or align with a last column of four holes in the first layer 704D. As a result, in combined first layer and second layer 705E, which results when the second layer 705D is placed over the first layer 704D, only a part of the last column of four holes is exposed to let airflow enter into the enclosure. Thus, the combined first and second layer 705E has a smaller hole size and permits a smaller amount of airflow into the enclosure compared to the combined first and second layer 705C.

Figure 7E:
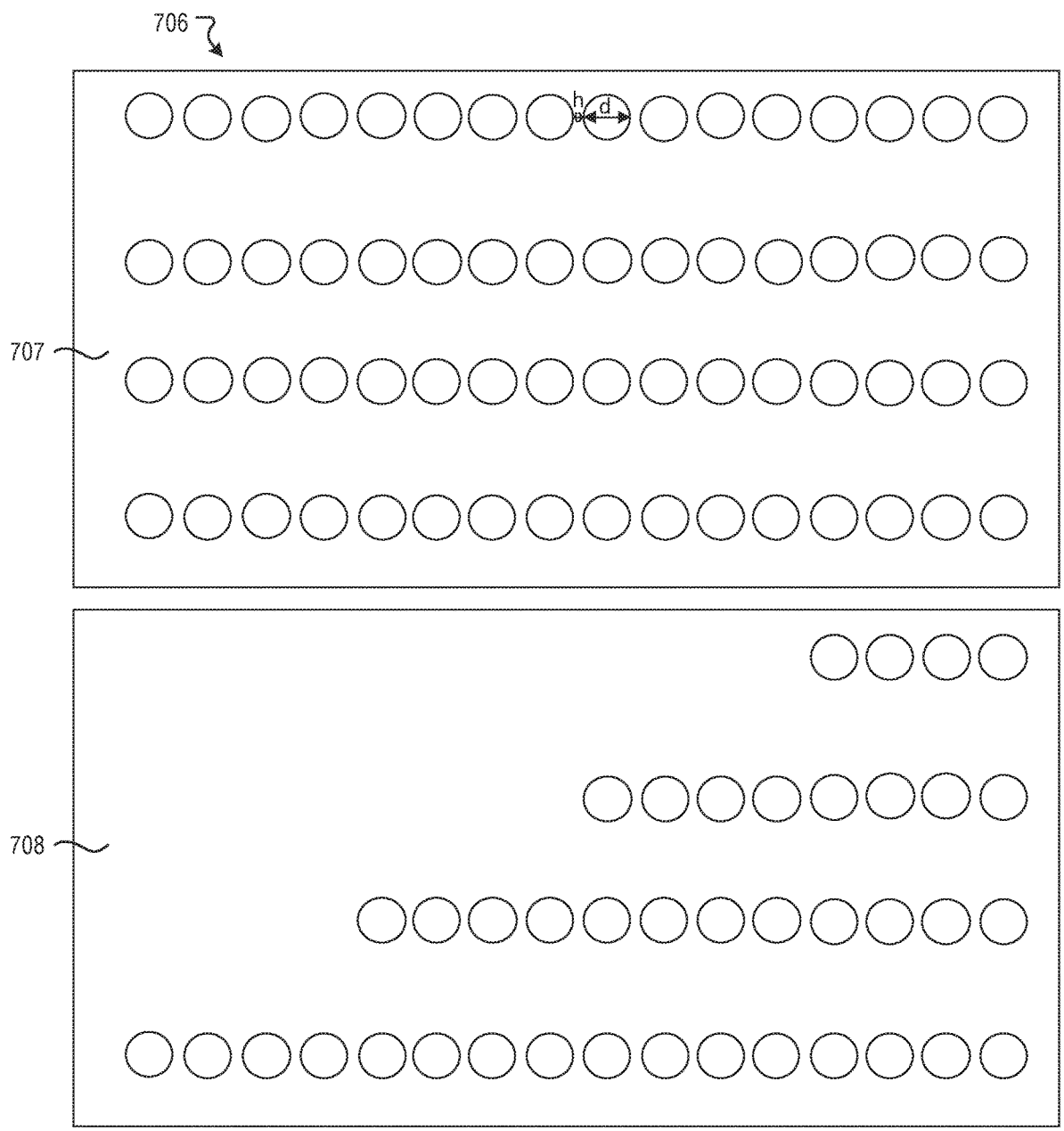

FIG. 7E illustrates an example of a hole pattern 706 of an enclosure cover for a sensor system according to some embodiments. The hole pattern 706 shown in FIG. 7E is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 706 may be implemented on a cylindrical surface, a partially conical surface, or a frustoconical surface.

The hole pattern 706 may comprise a first layer 707 and a second layer 708. As an example, the first layer 707 may be an outer layer and the second layer 708 may be an inner layer. As another example, the first layer 707 may be an inner layer and the second layer 708 may be an outer layer. In some embodiments, the second layer 708 may be rotated about the first layer 707. By adjusting, manipulating, or rotating a relative position of the first layer 707 and the second layer 708, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 706 in a same or similar manner as in hole pattern 703A.

As an example, the first layer 707 may comprise columns of holes and/or rows of holes. Each column of holes may have a distinct pattern of between one and four holes, inclusive. In the nonlimiting example shown in 707, the first layer 707 comprises sixteen columns each having four holes. The first layer 707 may comprise four rows each having sixteen holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 708 comprises four rows. A first row comprises four holes, a second row comprises eight holes, a third row comprises twelve holes, and a fourth row comprises sixteen holes. A size and spacing of the holes in the second layer 708 may be the same as a size and spacing of the holes in the first layer 707. In some embodiments, the holes of the second layer 708 may have a same diameter and vertical spacing between two holes directly adjacent in a vertical direction. When the second layer 708 is rotated about the first layer 707, the holes of the first layer 707 that align completely or partially with the holes of the second layer 708 may be exposed to allow airflow into the enclosure. In FIG. 7E, four holes of a top row of the first layer 707 may be exposed either entirely or partially, eight holes of a second row may be either entirely or partially exposed, twelve holes of a third row may be either entirely or partially exposed, and sixteen holes of a fourth row may be either entirely or partially exposed.

Figure 7F:
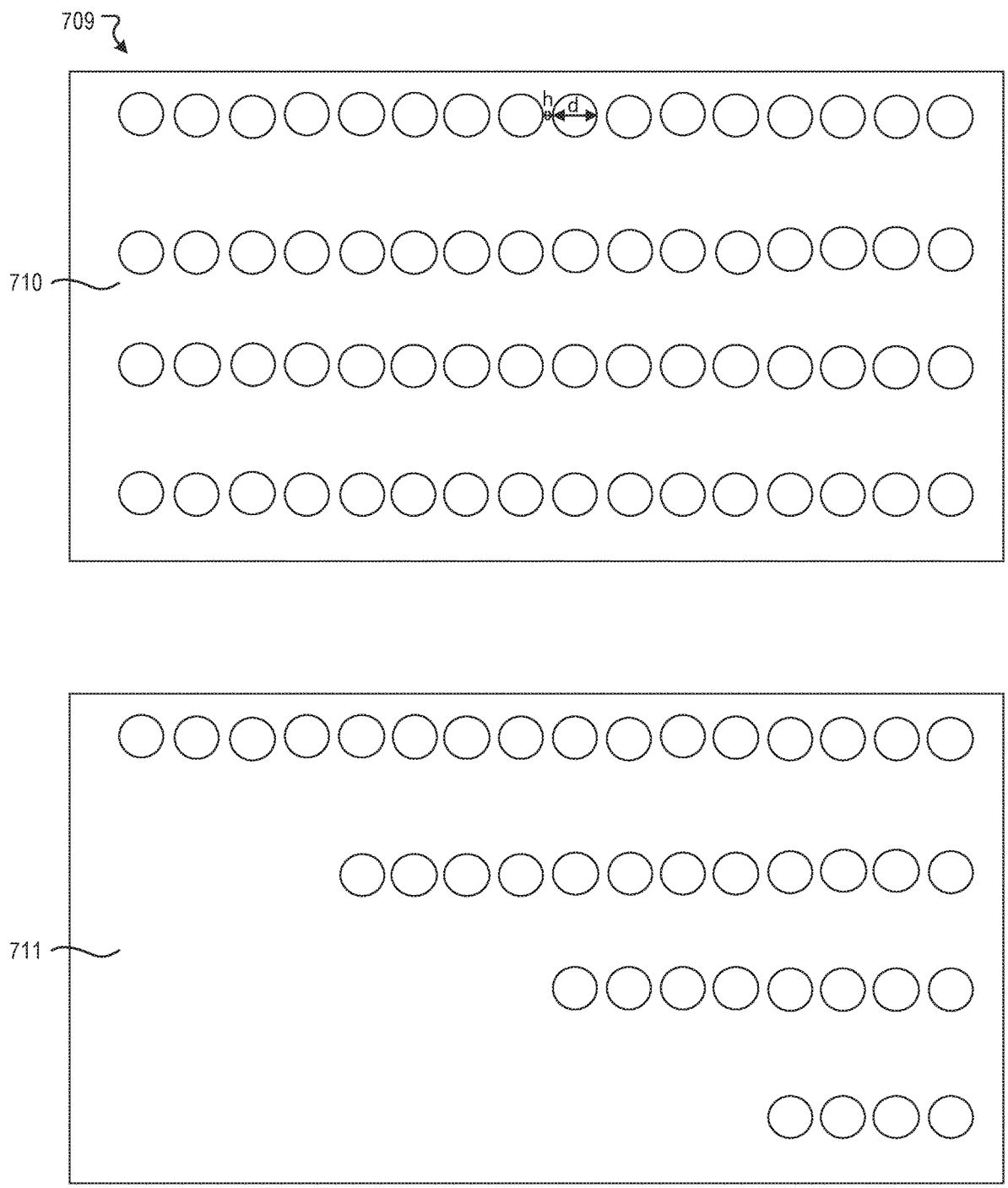

FIG. 7F illustrates an example of a hole pattern 709 of an enclosure cover for a sensor system according to some embodiments. The hole pattern 709 shown in FIG. 7F is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 709 may be implemented on a cylindrical surface, a partially conical surface, or a frustoconical surface.

The hole pattern 709 may comprise a first layer 710 and a second layer 711. As an example, the first layer 710 may be an outer layer and the second layer 711 may be an inner layer. As another example, the first layer 710 may be an inner layer and the second layer 711 may be an outer layer. In some embodiments, the second layer 711 may be rotated about the first layer 710. By adjusting, manipulating, or rotating a relative position of the first layer 710 and the second layer 711, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 709 in a same or similar manner as in hole pattern 703A.

As an example, the first layer 710 may comprise columns of holes. Each column of holes may have a distinct pattern of between one and four holes, inclusive. In the nonlimiting example shown in 710, the first layer 710 comprises 16 columns each having four holes, just as in first layer 707 of FIG. 7E. The first layer 710 may comprise four rows each having sixteen holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 711 comprises four rows. A first row comprises sixteen holes, a second row comprises twelve holes, a third row comprises eight holes, and a fourth row comprises four holes. A size and spacing of the holes in the second layer 711 may be the same as a size and spacing of the holes in the first layer 710. In some embodiments, the holes of the second layer 711 may have a same diameter and vertical spacing between two holes directly adjacent in a vertical direction. When the second layer 711 is rotated about the first layer 710, the holes of the first layer 710 that align completely or partially with the holes of the second layer 711 may be exposed to allow airflow into the enclosure. In FIG. 7F, four holes of a bottom row of the first layer 710 may be exposed either entirely or partially, eight holes of a second row from the bottom may be either entirely or partially exposed, twelve holes of a third row from the bottom may be either entirely or partially exposed, and sixteen holes of a fourth row from the bottom may be either entirely or partially exposed.

Figure 7G:
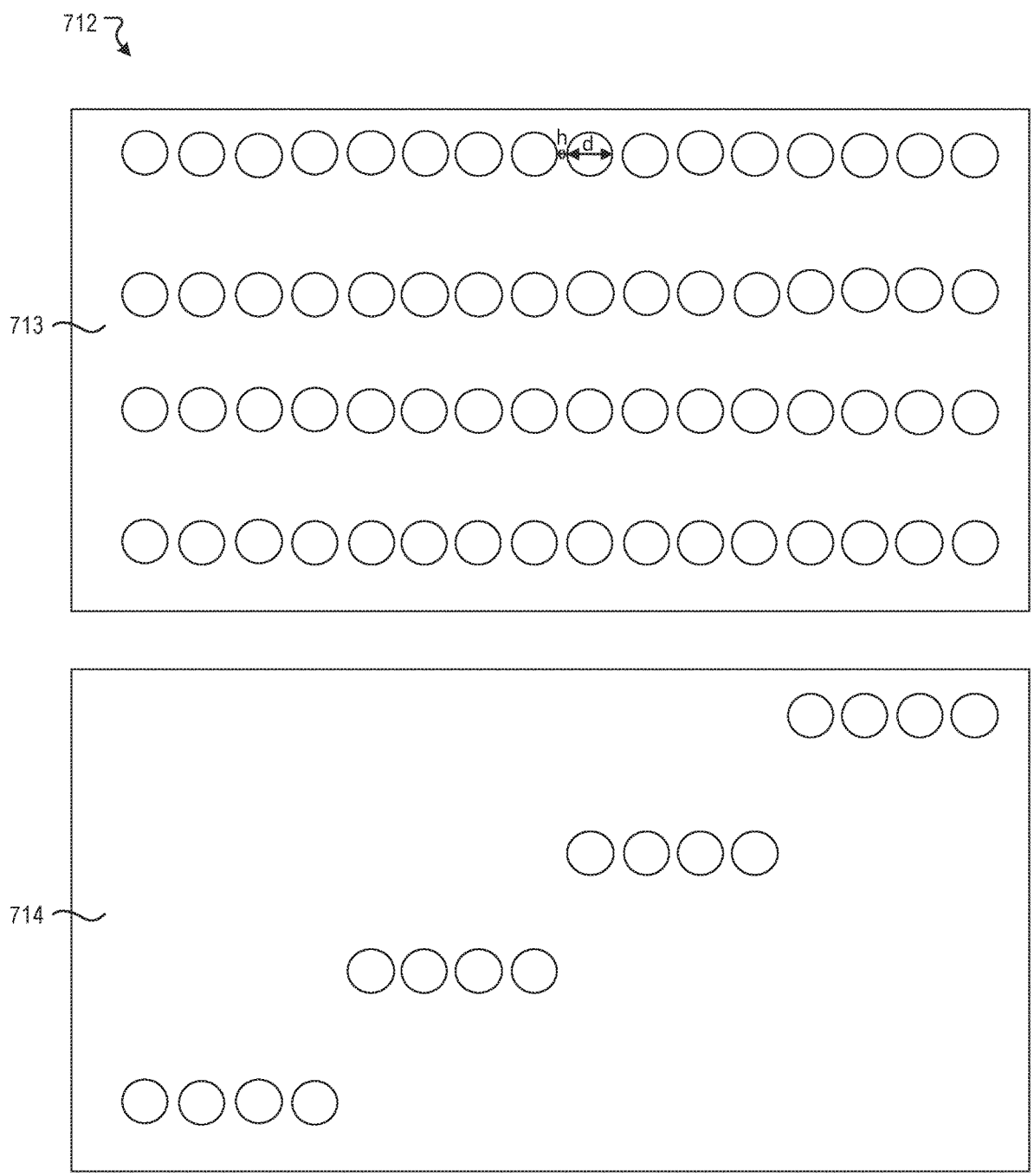

FIG. 7G illustrates an example of a hole pattern 712 of an enclosure cover for a sensor system according to some embodiments. The hole pattern 712 shown in FIG. 7G is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 712 may be implemented on a cylindrical surface, a partially conical surface, or a frustoconical surface.

The hole pattern 712 may comprise a first layer 713 and a second layer 714. As an example, the first layer 713 may be an outer layer and the second layer 714 may be an inner layer. As another example, the first layer 713 may be an inner layer and the second layer 714 may be an outer layer. In some embodiments, the second layer 714 may be rotated about the first layer 713. By adjusting, manipulating, or rotating a relative position of the first layer 713 and the second layer 714, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 712 in a same or similar manner as in hole pattern 703A.

As an example, the first layer 713 may comprise columns of holes. Each column of holes may have a distinct pattern of between one and four holes, inclusive. In the nonlimiting example shown in 713, the first layer 713 comprises sixteen columns each having four holes, just as in first layer 707 of FIG. 7E. The first layer 713 may comprise four rows each having sixteen holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 714 comprises four rows, each row comprising four holes. A size and vertical and horizontal spacing of the holes in the second layer 714 may be the same as a size and spacing of the holes in the first layer 713. In some embodiments, the holes of the second layer 714 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 714 is rotated about the first layer 713, the holes of the first layer 713 that align completely or partially with the holes of the second layer 714 may be exposed to allow airflow into the enclosure. In FIG. 7G, four holes of each row of the first layer 713 may be exposed.

Figure 7H:
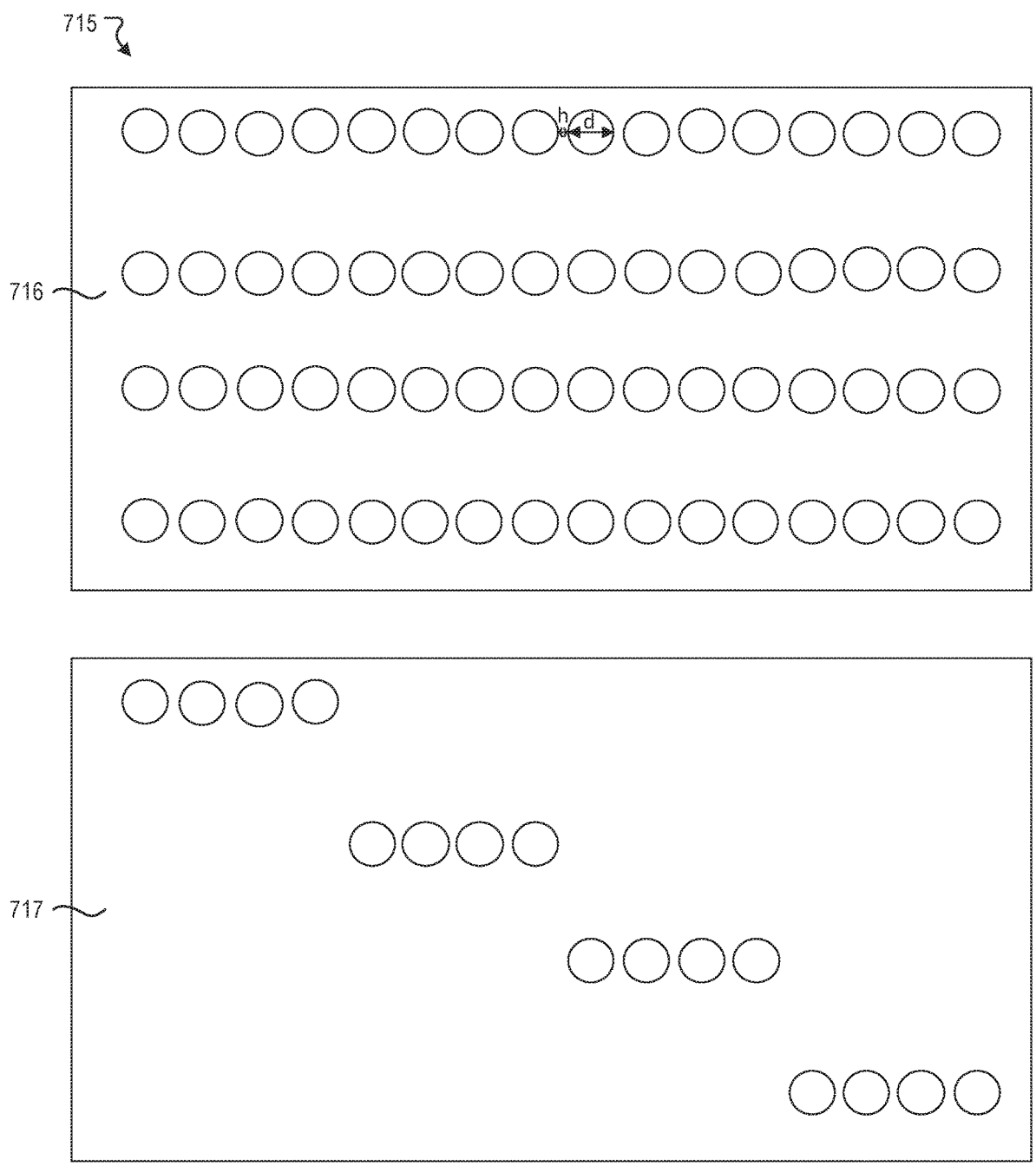

FIG. 7H illustrates an example of a hole pattern 715 of an enclosure cover for a sensor system according to some embodiments. The hole pattern 715 shown in FIG. 7H is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 712 may be implemented on a cylindrical surface, a partially conical surface, or a frustoconical surface.

The hole pattern 715 may comprise a first layer 716 and a second layer 717. As an example, the first layer 716 may be an outer layer and the second layer 717 may be an inner layer. As another example, the first layer 716 may be an inner layer and the second layer 717 may be an outer layer. In some embodiments, the second layer 717 may be rotated about the first layer 716. By adjusting, manipulating, or rotating a relative position of the first layer 716 and the second layer 717, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 715 in a same or similar manner as in hole pattern 703A.

As an example, the first layer 716 may comprise columns of holes. Each column of holes may have a distinct pattern of between one and four holes, inclusive. In the nonlimiting example shown in 716, the first layer 716 comprises sixteen columns each having four holes, just as in first layer 707 of FIG. 7E. The first layer 716 may comprise four rows each having sixteen holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 717 comprises four rows, each row comprising four holes. A hole pattern of the second layer 717 may be a mirror image compared to a hole pattern of second layer 714. For example, four holes are disposed on a top left and four holes are disposed on a bottom right in the second layer 717, compared to four holes being disposed on a bottom left and four holes being disposed on a top right in the second layer 714. A size and vertical and horizontal spacing of the holes in the second layer 717 may be the same as a size and spacing of the holes in the first layer 716. In some embodiments, the holes of the second layer 717 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 717 is rotated about the first layer 716, the holes of the first layer 716 that align completely or partially with the holes of the second layer 717 may be exposed to allow airflow into the enclosure. In FIG. 7H, four holes of each row of the first layer 716 may be either partially or completely exposed.

FIG. 7I illustrates an example of a hole pattern 718 of an enclosure cover for a sensor system according to some embodiments. The hole pattern 718 shown in FIG. 7I is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 718 may be implemented on a cylindrical surface, a partially conical surface, or a frustoconical surface.

The hole pattern 718 may comprise a first layer 719 and a second layer 720. As an example, the first layer 719 may be an outer layer and the second layer 720 may be an inner layer. As another example, the first layer 719 may be an inner layer and the second layer 720 may be an outer layer.

In some embodiments, the second layer 720 may be rotated about the first layer 719. By adjusting, manipulating, or rotating a relative position of the first layer 719 and the second layer 720, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 718 in a same or similar manner as in hole pattern 703A.

As an example, the first layer 719 may comprise columns of holes. Each column of holes may have a distinct pattern of between one and four holes, inclusive. In the nonlimiting example shown in 719, the first layer 719 comprises eight columns each having four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 720 comprises four rows, each row comprising four holes. The second layer 720 may be implemented as second layer 714. A size and vertical and horizontal spacing of the holes in the second layer 720 may be the same as a size and spacing of the holes in the first layer 719. In some embodiments, the holes of the second layer 720 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 720 is rotated about the first layer 719, the holes of the first layer 719 that align completely or partially with the holes of the second layer 720 may be exposed to allow airflow into the enclosure. In FIG. 7I, four holes from two rows of the first layer 719 may be either partially or completely exposed, while holes in the other two rows from the first layer 719 may not be exposed or open, and not permit airflow to enter into the enclosure. In the example shown in FIG. 7I, holes in the second and third rows of the first layer 719 may be exposed, while holes in the first and fourth rows will not be exposed. A maximum of four holes in each row will be exposed. If the second layer 720 is rotated relative to the first layer 719, some or all of the holes in the second and third rows of the first layer 719 will not be exposed, while some or all of the holes in the first and fourth rows may be exposed, or an area of the holes exposed may be changed.

FIG. 7J illustrates an example of a hole pattern 721 of an enclosure cover for a sensor system according to some embodiments. The hole pattern 721 shown in FIG. 7J is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 721 may be implemented on a cylindrical surface, a partially conical surface, or a frustoconical surface.

The hole pattern 721 may comprise a first layer 722 and a second layer 723. As an example, the first layer 722 may be an outer layer and the second layer 723 may be an inner layer. As another example, the first layer 722 may be an inner layer and the second layer 723 may be an outer layer. In some embodiments, the second layer 723 may be rotated about the first layer 722. By adjusting, manipulating, or rotating a relative position of the first layer 722 and the second layer 723, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 721 in a same or similar manner as in hole pattern 703A.

As an example, the first layer 722 may comprise columns of holes. Each column of holes may have a distinct pattern of between one and four holes, inclusive. In the nonlimiting example shown in 722, the first layer 722 comprises eight columns each having four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 723 comprises four rows, each row comprising four holes. The second layer 723 may be implemented as second layer 717. A size and vertical and horizontal spacing of the holes in the second layer 723 may be the same as a size and spacing of the holes in the first layer 722. In some embodiments, the holes of the second layer 723 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 723 is rotated about the first layer 722, the holes of the first layer 722 that align completely or partially with the holes of the second layer 723 may be exposed to allow airflow into the enclosure. In FIG. 7J, four holes from two rows of the first layer 722 may be either partially or completely exposed, while holes in the other two rows from the first layer 722 may not be exposed or open, and not permit airflow to enter into the enclosure. In the example shown in FIG. 7J, holes in the second and third rows of the first layer 722 may be exposed, while holes in the first and fourth rows will not be exposed. A maximum of four holes in each row will be exposed. If the second layer 723 is rotated relative to the first layer 722, some or all of the holes in the second and third rows of the first layer 722 will not be exposed, while some or all of the holes in the first and fourth rows may be exposed, or an area of the holes exposed may be changed.

FIG. 7K illustrates an example of a hole pattern 724 of an enclosure cover for a sensor system according to some embodiments. The hole pattern 724 shown in FIG. 7K is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 724 may be implemented on a cylindrical surface, a partially conical surface, or a frustoconical surface.

The hole pattern 724 may comprise a first layer 725 and a second layer 726. As an example, the first layer 725 may be an outer layer and the second layer 726 may be an inner layer. As another example, the first layer 725 may be an inner layer and the second layer 726 may be an outer layer. In some embodiments, the second layer 726 may be rotated about the first layer 725. By adjusting, manipulating, or rotating a relative position of the first layer 725 and the second layer 726, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 724 in a same or similar manner as in hole pattern 703A.

As an example, the first layer 725 may comprise columns of holes. Each column of holes may have a distinct pattern of between one and four holes, inclusive. In the nonlimiting example shown in 725, the first layer 725 comprises sixteen columns each having between one and four holes, inclusive. Four columns of the first layer 725 each comprise one hole, the next four columns each comprise two holes, the next four columns each comprise three holes, and the last four columns each comprise four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 726 comprises four rows, each row comprising four holes. The second layer 726 may be implemented as second layer 720. A size and vertical and horizontal spacing of the holes in the second layer 726 may be the same as a size and spacing of the holes in the first layer 725. In some embodiments, the holes of the second layer 726 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 726 is rotated about the first layer 725, the holes of the first layer 725 that align completely or partially with the holes of the second layer 726 may be exposed to allow airflow into the enclosure. In FIG. 7K, four holes from each of the four rows of the first layer 725 may be either partially or completely exposed. A maximum of four holes in each row will be exposed. If the second layer 726 is rotated relative to the first layer 725, some or all of the holes in the top three rows may not be exposed, or an area of the holes exposed may be decreased.

FIG. 7L illustrates an example of a hole pattern 727 of an enclosure cover for a sensor system according to some embodiments. The hole pattern 727 shown in FIG. 7L is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 727 may be implemented on a cylindrical surface, a partially conical surface, or a frustoconical surface.

The hole pattern 727 may comprise a first layer 728 and a second layer 729. As an example, the first layer 728 may be an outer layer and the second layer 729 may be an inner layer. As another example, the first layer 728 may be an inner layer and the second layer 726 may be an outer layer. In some embodiments, the second layer 729 may be rotated about the first layer 728. By adjusting, manipulating, or rotating a relative position of the first layer 728 and the second layer 729, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 727 in a same or similar manner as in hole pattern 703A.

As an example, the first layer 728 may comprise columns of holes. Each column of holes may have a distinct pattern of between one and four holes, inclusive. In the nonlimiting example shown in 728, the first layer 728 comprises sixteen columns each having between one and four holes, inclusive. Four columns of the first layer 728 each comprise one hole, the next four columns each comprise two holes, the next four columns each comprise three holes, and the last four columns each comprise four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 729 comprises four rows, each row comprising four holes. The second layer 729 may be implemented as second layer 723. A size and vertical and horizontal spacing of the holes in the second layer 729 may be the same as a size and spacing of the holes in the first layer 728. In some embodiments, the holes of the second layer 729 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 729 is rotated about the first layer 728, the holes of the first layer 728 that align completely or partially with the holes of the second layer 729 may be exposed to allow airflow into the enclosure. In FIG. 7L, four holes from up to three of the four rows of the first layer 728 may be either partially or completely exposed. A maximum of four holes in each row will be exposed, and at least one row of holes will not be exposed. If the second layer 729 is rotated relative to the first layer 728, some or all of the holes may not be exposed, or an area of the holes exposed may be decreased.

Figure 7M:
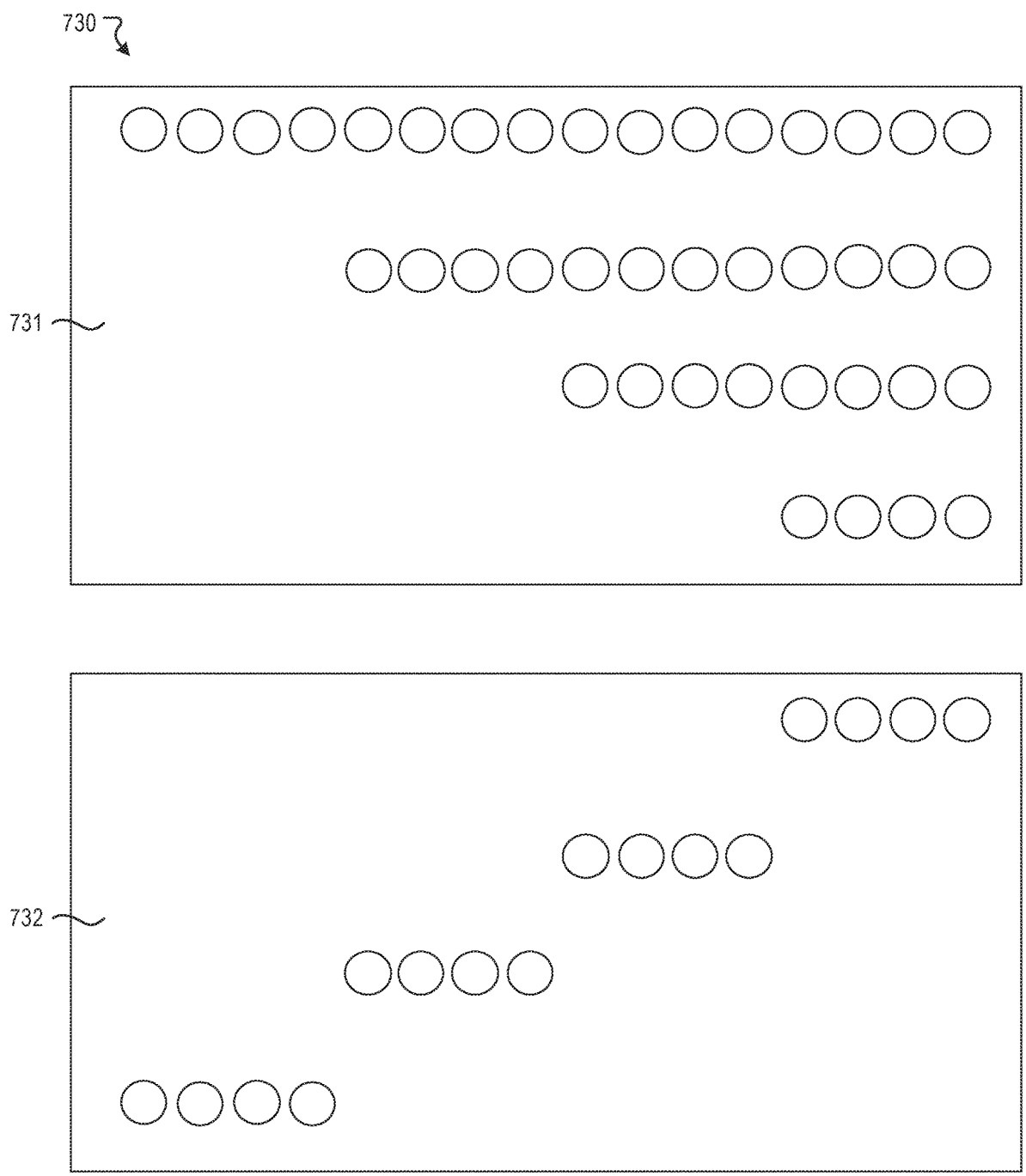

FIG. 7M illustrates an example of a hole pattern 730 of an enclosure cover for a sensor system according to some embodiments. The hole pattern 730 shown in FIG. 7M is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 730 may be implemented on a cylindrical surface, a partially conical surface, or a frustoconical surface.

The hole pattern 730 may comprise a first layer 731 and a second layer 732. As an example, the first layer 731 may be an outer layer and the second layer 732 may be an inner layer. As another example, the first layer 731 may be an inner layer and the second layer 732 may be an outer layer. In some embodiments, the second layer 732 may be rotated about the first layer 731. By adjusting, manipulating, or rotating a relative position of the first layer 731 and the second layer 732, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 730 in a same or similar manner as in hole pattern 703A.

As an example, the first layer 731 may comprise columns of holes. Each column of holes may have a distinct pattern of between one and four holes, inclusive. In the nonlimiting example shown in 731, the first layer 731 comprises sixteen columns each having between one and four holes, inclusive. Four columns of the first layer 731 each comprise one hole, the next four columns each comprise two holes, the next four columns each comprise three holes, and the last four columns each comprise four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 732 comprises four rows, each row comprising four holes. The second layer 732 may be implemented as second layer 726. A size and vertical and horizontal spacing of the holes in the second layer 732 may be the same as a size and spacing of the holes in the first layer 731. In some embodiments, the holes of the second layer 732 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 732 is rotated about the first layer 731, the holes of the first layer 731 that align completely or partially with the holes of the second layer 732 may be exposed to allow airflow into the enclosure. In FIG. 7M, four holes from up to three of the four rows of the first layer 731 may be either partially or completely exposed. A maximum of four holes in each row will be exposed, and at least one row of holes will not be exposed. If the second layer 732 is rotated relative to the first layer 731, some or all of the holes may not be exposed, or an area of the holes exposed may be decreased.

Figure 7N:
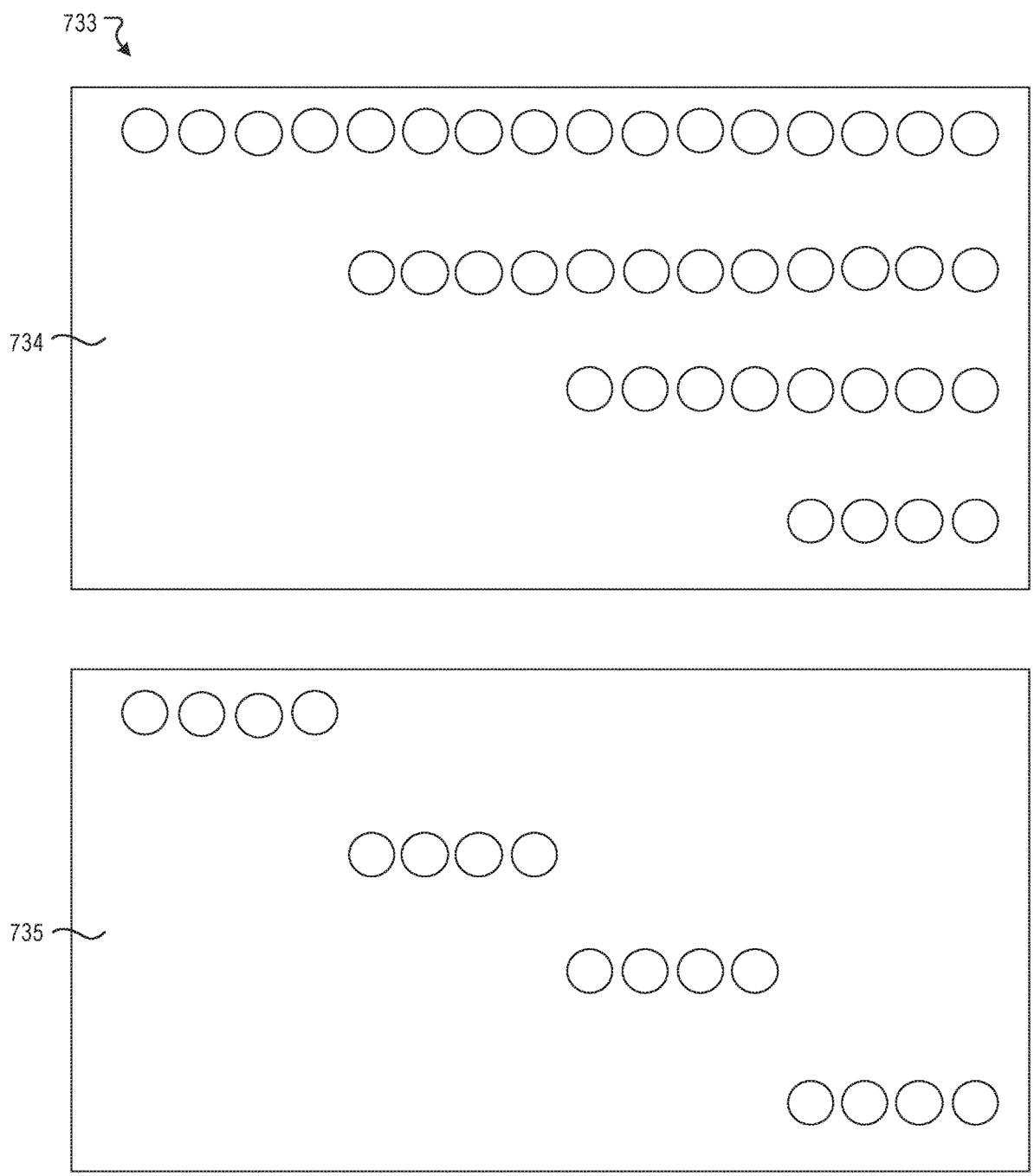

FIG. 7N illustrates an example of a hole pattern 733 of an enclosure cover for a sensor system according to some embodiments. The hole pattern 733 shown in FIG. 7N is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 733 may be implemented on a cylindrical surface, a partially conical surface, or a frustoconical surface.

The hole pattern 733 may comprise a first layer 734 and a second layer 735. As an example, the first layer 734 may be an outer layer and the second layer 735 may be an inner layer. As another example, the first layer 734 may be an inner layer and the second layer 735 may be an outer layer. In some embodiments, the second layer 735 may be rotated about the first layer 734. By adjusting, manipulating, or rotating a relative position of the first layer 734 and the second layer 735, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 733 in a same or similar manner as in hole pattern 703A.

As an example, the first layer 734 may comprise columns of holes. Each column of holes may have a distinct pattern of between one and four holes, inclusive. In the nonlimiting example shown in 734, the first layer 734 comprises sixteen columns each having between one and four holes, inclusive. Four columns of the first layer 734 each comprise one hole, the next four columns each comprise two holes, the next four columns each comprise three holes, and the last four columns each comprise four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 735 comprises four rows, each row comprising four holes. The second layer 735 may be implemented as second layer 729. A size and vertical and horizontal spacing of the holes in the second layer 735 may be the same as a size and spacing of the holes in the first layer 734. In some embodiments, the holes of the second layer 735 may have a same diameter and vertical spacing between two holes directly adjacent in a vertical direction.

A horizontal distance between two holes from different rows that are directly adjacent may be the same as a horizontal distance between two holes in the same row that are directly adjacent. When the second layer 735 is rotated about the first layer 734, the holes of the first layer 734 that align completely or partially with the holes of the second layer 735 may be exposed to allow airflow into the enclosure. In FIG. 7N, four holes from each row of the first layer 734 may be either partially or completely exposed. If the second layer 735 is rotated relative to the first layer 734, some or all of the holes may not be exposed, or an area of the holes exposed may be decreased. For example, if the second layer 735 is rotated clockwise so that each of the holes of the second layer 735 are shifted by a spacing equal to 4*(d+h), only a top row of holes may be exposed, while the bottom three rows of holes of the first layer 734 would not be exposed. d is a diameter of the holes and h is a distance between directly adjacent holes.

FIG. 7O illustrates an example of a hole pattern 736 of an enclosure cover for a sensor system according to some embodiments. The hole pattern 736 shown in FIG. 7O is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 736 may be implemented on a cylindrical surface, a partially conical surface, or a frustoconical surface.

The hole pattern 736 may comprise a first layer 737 and a second layer 738. As an example, the first layer 737 may be an outer layer and the second layer 738 may be an inner layer. As another example, the first layer 737 may be an inner layer and the second layer 738 may be an outer layer. In some embodiments, the second layer 738 may be rotated about the first layer 737. By adjusting, manipulating, or rotating a relative position of the first layer 737 and the second layer 738, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 736 in a same or similar manner as in hole pattern 703A.

As an example, the first layer 737 may comprise columns of holes. Each column of holes may have a distinct pattern of between one and four holes, inclusive. In the nonlimiting example shown in 737, the first layer 737 comprises sixteen columns each having between one and four holes, inclusive. Four columns of the first layer 737 each comprise one hole, the next four columns each comprise three holes, the next four columns each comprise two holes, and the last four columns each comprise four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 738 comprises four rows, each row comprising four holes. The second layer 738 may be implemented as second layer 732. A size and vertical and horizontal spacing of the holes in the second layer 738 may be the same as a size and spacing of the holes in the first layer 737. In some embodiments, the holes of the second layer 738 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 738 is rotated about the first layer 737, the holes of the first layer 737 that align completely or partially with the holes of the second layer 738 may be exposed to allow airflow into the enclosure. In FIG. 7O, a maximum of four holes in each row will be exposed, and at least one row of holes will not be exposed. If the second layer 738 is rotated relative to the first layer 737, some or all of the holes may not be exposed, or an area of the holes exposed may be decreased. A maximum of four holes in each row will be exposed, and at least one row of holes will not be exposed. If the second layer 738 is rotated relative to the first layer 737, some or all of the holes may not be exposed, or an area of the holes exposed may be decreased.

FIG. 7P illustrates an example of a hole pattern 739 of an enclosure cover for a sensor system according to some embodiments. The hole pattern 739 shown in FIG. 7P is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 739 may be implemented on a cylindrical surface, a partially conical surface, or a frustoconical surface.

The hole pattern 739 may comprise a first layer 740 and a second layer 741. As an example, the first layer 740 may be an outer layer and the second layer 741 may be an inner layer. As another example, the first layer 740 may be an inner layer and the second layer 741 may be an outer layer. In some embodiments, the second layer 741 may be rotated about the first layer 740. By adjusting, manipulating, or rotating a relative position of the first layer 740 and the second layer 741, a pattern of holes may be adjusted to control an amount of airflow entering the enclosure cover, and where the airflow enters the enclosure cover, for example, using a controller (e.g., controller 196, 252, 352, 452, 552). The pattern of holes may be adjusted based on current or predicted future measurements of an air quality of external air, a wind direction, a wind speed, a vehicle speed, a temperature of the external air, a pressure (barometric) of the external air, an internal pressure of the enclosure, an internal temperature of the enclosure, a temperature gradient inside the enclosure, and/or a pressure gradient inside the enclosure. The controller may adjust the hole pattern 739 in a same or similar manner as in hole pattern 703A.

As an example, the first layer 740 may comprise columns of holes. Each column of holes may have a distinct pattern of between one and four holes, inclusive. In the nonlimiting example shown in 740, the first layer 740 comprises sixteen columns each having between one and four holes, inclusive. Four columns of the first layer 740 each comprise one hole, the next four columns each comprise three holes, the next four columns each comprise two holes, and the last four columns each comprise four holes. A horizontal distance h between two holes directly adjacent in a horizontal direction may be constant. A diameter d of each hole may be constant. A vertical distance between two holes directly adjacent in a vertical direction may be constant. For example, h may be greater than a diameter d of each of the holes. As another example, h may be less than or equal to the diameter d of each of the holes. In some examples, the holes may be replaced by square or rectangular shaped slits. In some embodiments, the second layer 741 comprises four rows, each row comprising four holes. The second layer 741 may be implemented as second layer 735. A size and vertical and horizontal spacing of the holes in the second layer 741 may be the same as a size and spacing of the holes in the first layer 740. In some embodiments, the holes of the second layer 741 may have a same diameter and vertical spacing between two holes directly adjacent in a vertical direction. A horizontal distance between two holes from different rows that are directly adjacent may be the same as a horizontal distance between two holes in the same row that are directly adjacent. When the second layer 741 is rotated about the first layer 740, the holes of the first layer 740 that align completely or partially with the holes of the second layer 741 may be exposed to allow airflow into the enclosure. In FIG. 7P, a maximum of four holes in each row will be exposed, and at least one row of holes will not be exposed. If the second layer 741 is rotated relative to the first layer 740, some or all of the holes may not be exposed, or an area of the holes exposed may be decreased. A maximum of four holes in each row will be exposed, and at least one row of holes will not be exposed. If the second layer 741 is rotated relative to the first layer 740, some or all of the holes may not be exposed, or an area of the holes exposed may be decreased.

Figure 7Q:
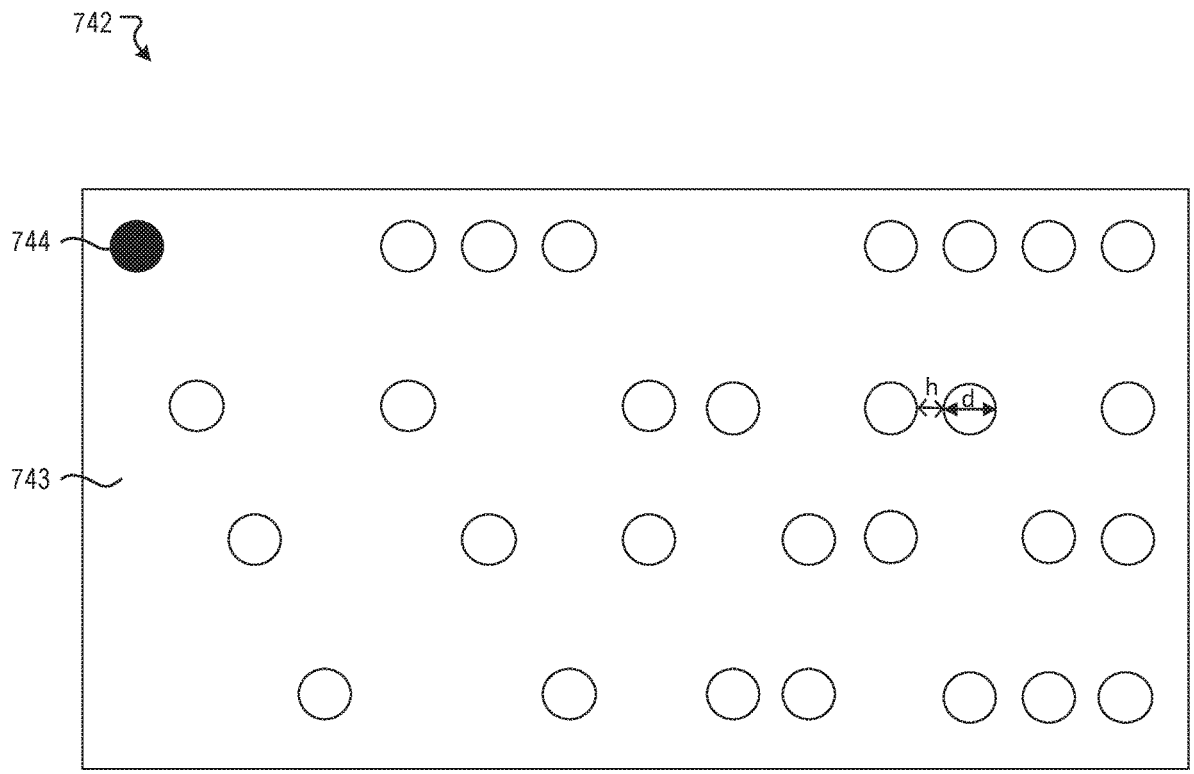

FIG. 7Q illustrates an example of a hole pattern 742 of an enclosure cover for a sensor system according to some embodiments. The hole pattern 742 shown in FIG. 7Q is a flattened representation of a lower section (e.g., lower section 702) of an enclosure cover (e.g., enclosure cover 700), shown for the sake of illustration. As an example, the lower section of the enclosure cover may be a cylindrical surface, a partially conical surface, or a frustoconical surface. Thus, the hole pattern 742 may be implemented on a cylindrical surface, a partially conical surface, or a frustoconical surface.

The hole pattern 742 may comprise a layer 743. The layer 743 may be implemented as 703A, 703B, or 703D, but instead of or in addition to having a second layer rotating about the layer 743, the layer 743 may include a flap or overhang 744 for each hole that either maintains the hole in a closed or open state. In the example of FIG. 7Q, the flap or overhang 744 is shown to close one of the holes. In some embodiments, a controller may adjust an open or closed state using binary programming, where 0 indicates a closed state of a hole and 1 indicates an open state of the hole. For example, the controller may be configured to indicate the open and closed state of the sixteen holes using "0111111111111111" to indicate that only a first hole is closed. A first hole starts at a top left corner, and then subsequent holes proceed through any different rows of a same column, and then through different columns. For example, a sixth element of the binary sequence above may correspond to the hole in the fifth column and second row. In some embodiments, the controller may, in addition to determining an open or closed state, determine whether each hole is partially open, and an area of the opening of each hole.

FIG. 8 illustrates a flowchart of a heat exchange method according to some embodiments. In this and other flow-charts, the flowchart 800 illustrates by way of example a sequence of steps. It should be understood the steps may be reorganized for parallel execution, or reordered, as applicable. Moreover, some steps that could have been included may have been removed to avoid providing too much information for the sake of clarity and some steps that were included could be removed, but may have been included for the sake of illustrative clarity. The description from other FIGS. may also be applicable to FIG. 8.

In step 802, an airflow (e.g., wind, while a vehicle is driving) may be directed through a deflector (e.g., deflector 116, 126, 136, 146, 156, 166, 176, 606, 616, 626, 636) into a cover (e.g., cover 700) on an exterior of an enclosure (e.g., enclosure 200, 300, 400, 500, 602, 612, 622, 632). The deflector may be disposed on a vehicle outside the enclosure and connected to the enclosure. The cover may comprise a hole pattern (e.g., hole pattern 703A, 703B, 703D, 706, 709, 712, 715, 718, 721, 724, 727, 730, 733, 736, 739). In step 804, the directed airflow may be selectively permitted to enter through the hole pattern into the enclosure.

Hardware Implementation

The techniques described herein are implemented by one or more special-purpose computing devices. The special-purpose computing devices may be hard-wired to perform the techniques, or may include circuitry or digital electronic devices such as one or more application-specific integrated circuits (ASICs) or field programmable gate arrays (FPGAs) that are persistently programmed to perform the techniques, or may include one or more hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, server computer systems, portable computer systems, handheld devices, networking devices or any other device or combination of devices that incorporate hard-wired and/or program logic to implement the techniques.

Computing device(s) are generally controlled and coordinated by operating system software, such as iOS, Android, Chrome OS, Windows XP, Windows Vista, Windows 7, Windows 8, Windows Server, Windows CE, Unix, Linux, SunOS, Solaris, iOS, Blackberry OS, VxWorks, or other compatible operating systems. In other embodiments, the computing device may be controlled by a proprietary operating system. Conventional operating systems control and schedule computer processes for execution, perform memory management, provide file system, networking, I/O services, and provide a user interface functionality, such as a graphical user interface ("GUI"), among other things.

Figure 9:
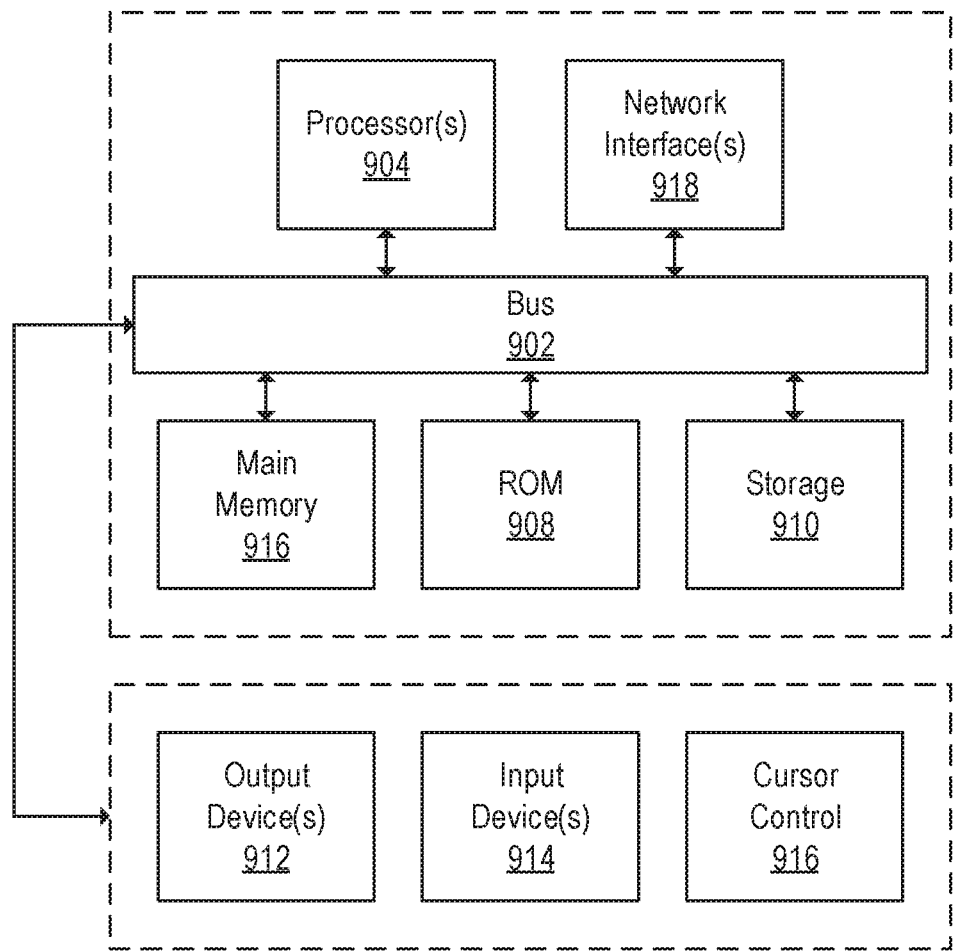
FIG. 9 is a diagram of an example computer system for implementing the features disclosed herein.

FIG. 9 is a block diagram that illustrates a computer system 900 upon which any of the embodiments described herein may be implemented. The computer system 900 includes a bus 902 or other communication mechanism for communicating information, one or more hardware processors 904 coupled with bus 902 for processing information. Hardware processor(s) 904 may be, for example, one or more general purpose microprocessors.

The computer system 900 also includes a main memory 906, such as a random access memory (RAM), cache and/or other dynamic storage devices, coupled to bus 902 for storing information and instructions to be executed by processor 904. Main memory 906 also may be used for storing temporary variables or other intermediate information during execution of instructions to be executed by processor 904. Such instructions, when stored in storage media accessible to processor 904, render computer system 900 into a special-purpose machine that is customized to perform the operations specified in the instructions.

The computer system 900 further includes a read only memory (ROM) 908 or other static storage device coupled to bus 902 for storing static information and instructions for processor 904. A storage device 910, such as a magnetic disk, optical disk, or USB thumb drive (Flash drive), etc., is provided and coupled to bus 902 for storing information and instructions.

The computer system 900 may be coupled via bus 902 to output device(s) 912, such as a cathode ray tube (CRT) or LCD display (or touch screen), for displaying information to a computer user. Input device(s) 914, including alphanumeric and other keys, are coupled to bus 902 for communicating information and command selections to processor 904. Another type of user input device is cursor control 916, such as a mouse, a trackball, or cursor direction keys for communicating direction information and command selections to processor 904 and for controlling cursor movement on display 912. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

The computing system 900 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules or computing device functionality described herein are preferably implemented as software modules, but may be represented in hardware or firmware. Generally, the modules described herein refer to logical modules that may be combined with other modules or divided into sub-modules despite their physical organization or storage.

The computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor(s) 904 executing one or more sequences of one or more instructions contained in main memory 906. Such instructions may be read into main memory 906 from another storage medium, such as storage device 910. Execution of the sequences of instructions contained in main memory 906 causes processor(s) 904 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 910. Volatile media includes dynamic memory, such as main memory 606. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 902. Transmission media can also take the form of acoustic or light waves, such as those generated during radio-wave and infra-red data communications.

Various forms of media may be involved in carrying one or more sequences of one or more instructions to processor 904 for execution. For example, the instructions may initially be carried on a magnetic disk or solid-state drive of a remote computer. The remote computer can load the instructions into its dynamic memory and send the instructions over a telephone line using a modem. A modem local to computer system 900 can receive the data on the telephone line and use an infra-red transmitter to convert the data to an infra-red signal. An infra-red detector can receive the data carried in the infra-red signal and appropriate circuitry can place the data on bus 902. Bus 902 carries the data to main memory 906, from which processor 904 retrieves and executes the instructions. The instructions received by main memory 906 may retrieves and executes the instructions. The instructions received by main memory 906 may optionally be stored on storage device 910 either before or after execution by processor 904.

The computer system 900 also includes a communication interface 918 coupled to bus 902. Communication interface 918 provides a two-way data communication coupling to one or more network links that are connected to one or more local networks. For example, communication interface 918 may be an integrated services digital network (ISDN) card, cable modem, satellite modem, or a modem to provide a data communication connection to a corresponding type of telephone line. As another example, communication interface 918 may be a local area network (LAN) card to provide a data communication connection to a compatible LAN (or WAN component to communicated with a WAN). Wireless links may also be implemented. In any such implementation, communication interface 918 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet". Local network and Internet both use electrical, electromagnetic or optical signals that carry digital data streams. The signals through the various networks and the signals on network link and through communication interface 918, which carry the digital data to and from computer system 900, are example forms of transmission media.

The computer system 900 can send messages and receive data, including program code, through the network(s), network link and communication interface 918. In the Internet example, a server might transmit a requested code for an application program through the Internet, the ISP, the local network and the communication interface 918.

The received code may be executed by processor 904 as it is received, and/or stored in storage device 910, or other non-volatile storage for later execution.

Each of the processes, methods, and algorithms described in the preceding sections may be embodied in, and fully or partially automated by, code modules executed by one or more computer systems or computer processors comprising computer hardware. The processes and algorithms may be implemented partially or wholly in application-specific circuitry.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

Engines, Components, and Logic

Certain embodiments are described herein as including logic or a number of components, engines, or mechanisms. Engines may constitute either software engines (e.g., code embodied on a machine-readable medium) or hardware engines. A "hardware engine" is a tangible unit capable of performing certain operations and may be configured or arranged in a certain physical manner. In various example embodiments, one or more computer systems (e.g., a standalone computer system, a client computer system, or a server computer system) or one or more hardware engines of a computer system (e.g., a processor or a group of processors) may be configured by software (e.g., an application or application portion) as a hardware engine that operates to perform certain operations as described herein.

In some embodiments, a hardware engine may be implemented mechanically, electronically, or any suitable combination thereof. For example, a hardware engine may include dedicated circuitry or logic that is permanently configured to perform certain operations. For example, a hardware engine may be a special-purpose processor, such as a Field-Programmable Gate Array (FPGA) or an Application Specific Integrated Circuit (ASIC). A hardware engine may also include programmable logic or circuitry that is temporarily configured by software to perform certain operations. For example, a hardware engine may include software executed by a general-purpose processor or other programmable processor. Once configured by such software, hardware engines become specific machines (or specific components of a machine) uniquely tailored to perform the configured functions and are no longer general-purpose processors. It will be appreciated that the decision to implement a hardware engine mechanically, in dedicated and permanently configured circuitry, or in temporarily configured circuitry (e.g., configured by software) may be driven by cost and time considerations.

Accordingly, the phrase "hardware engine" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented engine" refers to a hardware engine. Considering embodiments in which hardware engines are temporarily configured (e.g., programmed), each of the hardware engines need not be configured or instantiated at any one instance in time. For example, where a hardware engine comprises a general-purpose processor configured by software to become a special-purpose processor, the general-purpose processor may be configured as respectively different special-purpose processors (e.g., comprising different hardware engines) at different times. Software accordingly configures a particular processor or processors, for example, to constitute a particular hardware engine at one instance of time and to constitute a different hardware engine at a different instance of time.

Hardware engines can provide information to, and receive information from, other hardware engines. Accordingly, the described hardware engines may be regarded as being communicatively coupled. Where multiple hardware engines exist contemporaneously, communications may be achieved through signal transmission (e.g., over appropriate circuits and buses) between or among two or more of the hardware engines. In embodiments in which multiple hardware engines are configured or instantiated at different times, communications between such hardware engines may be achieved, for example, through the storage and retrieval of information in memory structures to which the multiple hardware engines have access. For example, one hardware engine may perform an operation and store the output of that operation in a memory device to which it is communicatively coupled. A further hardware engine may then, at a later time, access the memory device to retrieve and process the stored output. Hardware engines may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented engines that operate to perform one or more operations or functions described herein. As used herein, "processor-implemented engine" refers to a hardware engine implemented using one or more processors.

Similarly, the methods described herein may be at least partially processor-implemented, with a particular processor or processors being an example of hardware. For example, at least some of the operations of a method may be performed by one or more processors or processor-implemented engines. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an Application Program Interface (API)).

The performance of certain of the operations may be distributed among the processors, not only residing within a single machine, but deployed across a number of machines. In some example embodiments, the processors or processor-implemented engines may be located in a single geographic location (e.g., within a home environment, an office environment, or a server farm). In other example embodiments, the processors or processor-implemented engines may be distributed across a number of geographic locations.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the subject matter has been described with reference to specific example embodiments, various modifications and changes may be made to these embodiments without departing from the broader scope of embodiments of the present disclosure. Such embodiments of the subject matter may be referred to herein, individually or collectively, by the term "invention" merely for convenience and without intending to voluntarily limit the scope of this application to any single disclosure or concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will be appreciated that an "engine," "system," "data store," and/or "database" may comprise software, hardware, firmware, and/or circuitry. In one example, one or more software programs comprising instructions capable of being executable by a processor may perform one or more of the functions of the engines, data stores, databases, or systems described herein. In another example, circuitry may perform the same or similar functions. Alternative embodiments may comprise more, less, or functionally equivalent engines, systems, data stores, or databases, and still be within the scope of present embodiments. For example, the functionality of the various systems, engines, data stores, and/or databases may be combined or divided differently.

"Open source" software is defined herein to be source code that allows distribution as source code as well as compiled form, with a well-publicized and indexed means of obtaining the source, optionally with a license that allows modifications and derived works.

The data stores described herein may be any suitable structure (e.g., an active database, a relational database, a self-referential database, a table, a matrix, an array, a flat file, a documented-oriented storage system, a non-relational NoSQL system, and the like), and may be cloud-based or otherwise.

As used herein, the term "or" may be construed in either an inclusive or exclusive sense. Moreover, plural instances may be provided for resources, operations, or structures described herein as a single instance. Additionally, boundaries between various resources, operations, engines, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

For example, "is to be" could mean, "should be," "needs to be," "is required to be," or "is desired to be," in some embodiments.

Although the invention(s) have been described in detail for the purpose of illustration based on what is currently considered to be the most practical and preferred implementations, it is to be understood that such detail is solely for that purpose and that the invention is not limited to the disclosed implementations, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

The foregoing description of the present invention(s) have been provided for the purposes of illustration and description. It is not intended to be exhaustive or to limit the invention to the precise forms disclosed. The breadth and scope of the present invention should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A heat exchange system of a vehicle, comprising:
an enclosure disposed on the vehicle, the enclosure comprising:
   a fan disposed at a base of the enclosure;
   one or more sensors within the enclosure; and
   a cover on an exterior of the enclosure, the cover comprising a first layer having a first hole pattern and a second layer disposed over the first layer and having a second hole pattern, and the second layer being configured to rotate about the first layer to adjust an alignment between the first hole pattern and the second hole pattern, the alignment indicating an amount of airflow that enters the enclosure; and
a controller configured to regulate an amount of the airflow that enters the enclosure by:
   determining an amount of rotation of the second layer about the first layer to adjust the alignment between the first hole pattern and the second hole pattern, based on a speed of the vehicle, an internal temperature of the enclosure, an external temperature, a difference between the internal temperature and the external temperature, a predicted future speed of the vehicle, a predicted future internal temperature of the enclosure, a predicted future external temperature, a predicted difference between the predicted future internal temperature of the enclosure and the predicted future external temperature, one or more temperature gradients or pressure gradients, a rotation speed of the fan, or a size of an opening of a cabin vent that connects the enclosure to a cabin; and
   rotating the second layer about the first layer by the determined amount.

2. The heat exchange system of claim 1, wherein:
the first layer comprises columns of holes, each of the columns of holes having a distinct pattern with a distinct number or location of holes from other columns of holes; and
the second layer comprises a column of holes and is configured to align with one of the columns of holes of the first layer to permit the airflow to enter into the enclosure through the column of holes.

3. The heat exchange system of claim 2, wherein:
the column of holes of the second layer is further configured to align partially with one of the columns of holes of the first layer while being partially offset from one of the columns of holes of the first layer by a distance of less than a diameter of the holes to permit a smaller amount of airflow to enter into the enclosure.

4. The heat exchange system of claim 1, wherein:
a space between directly adjacent holes of the first hole pattern exceeds a diameter of holes of the first hole pattern;
a space between directly adjacent holes of the second hole pattern exceeds a diameter of holes of the second hole pattern; and
the controller is configured to block the airflow from entering into the holes of the first hole pattern and the holes of the second hole pattern by rotating the second hole pattern so that each of the holes of the second hole pattern are aligned with the space between directly adjacent holes of the first hole pattern.

5. A heat exchange method for an enclosure disposed on a vehicle, the enclosure comprising a fan disposed at a base of the enclosure, one or more sensors within the enclosure, and a cover on an exterior of the enclosure, the cover comprising a first hole pattern and a second hole pattern, the method comprising:

rotating a second layer of the cover about a first layer of the cover to adjust an alignment between a first hole pattern of the first layer and a second hole pattern of the second layer, the alignment indicating an amount of airflow entering the enclosure; and selectively permitting, by a controller, an amount of the airflow through the first hole pattern and the second hole pattern into the enclosure, the selectively permitting comprising:

determining an amount of rotation of the second layer about the first layer to adjust the alignment between the first hole pattern and the second hole pattern, based on a speed of the vehicle, an internal temperature of the enclosure, an external temperature, a difference between the internal temperature and the external temperature, a predicted future speed of the vehicle, a predicted future internal temperature of the enclosure, a predicted future external temperature, a predicted difference between the predicted future internal temperature of the enclosure and the predicted future external temperature, one or more temperature gradients or pressure gradients, a rotation speed of the fan, or a size of an opening of a cabin vent that connects the enclosure to a cabin; and rotating the second layer about the first layer by the determined amount.

6. The heat exchange method of claim 5, wherein:

the first layer comprises columns of holes, each of the columns of holes having a distinct pattern with a distinct number or location of holes from other columns of holes; and the second layer comprises a column of holes; and the method further comprises:

aligning the column of holes of the second layer with one of the columns of holes of the first layer to permit the airflow to enter into the enclosure through the column of holes.

7. The heat exchange method of claim 6, further comprising:

partially aligning the column of holes of the second layer with one of the columns of holes of the first layer by partially offsetting the column of holes of the second layer from one of the columns of holes of the first layer by a distance of less than a diameter of the holes to permit a smaller amount of airflow to enter into the enclosure.

8. The heat exchange system of claim 1, wherein the controller is configured to regulate the amount of the airflow that enters the enclosure using binary programming to indicate an open or closed state of each hole in the hole pattern.

* * * * *